US010686012B2

(12) United States Patent
Murooka

(10) Patent No.: US 10,686,012 B2
(45) Date of Patent: Jun. 16, 2020

(54) RESISTANCE CHANGE TYPE MEMORY

(71) Applicant: TOSHIBA MEMORY CORPORATION, Minato-ku, Tokyo (JP)

(72) Inventor: Kenichi Murooka, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/351,308

(22) Filed: Mar. 12, 2019

(65) Prior Publication Data

US 2020/0098827 A1 Mar. 26, 2020

(30) Foreign Application Priority Data

Sep. 20, 2018 (JP) ................................ 2018-175879

(51) Int. Cl.
*H01L 27/24* (2006.01)
*H01L 45/00* (2006.01)
*G11C 13/00* (2006.01)

(52) U.S. Cl.
CPC ...... *H01L 27/2454* (2013.01); *G11C 13/0004* (2013.01); *H01L 27/2481* (2013.01); *H01L 45/06* (2013.01); *H01L 45/1233* (2013.01); *G11C 13/003* (2013.01); *G11C 13/004* (2013.01); *G11C 13/0026* (2013.01); *G11C 13/0028* (2013.01); *G11C 13/0038* (2013.01); *G11C 2213/31* (2013.01); *G11C 2213/32* (2013.01); *G11C 2213/79* (2013.01); *H01L 45/144* (2013.01); *H01L 45/146* (2013.01); *H01L 45/147* (2013.01)

(58) Field of Classification Search
CPC ............. H01L 27/2454; H01L 27/2472; H01L 27/2481; H01L 27/249
See application file for complete search history.

(56) References Cited

U.S. PATENT DOCUMENTS 8,406,034 B2 3/2013 Murooka
8,963,115 B2 2/2015 Murooka
8,971,093 B2 3/2015 Murooka
9,123,411 B2 9/2015 Murooka
(Continued)

FOREIGN PATENT DOCUMENTS

JP 2013-120618 A 6/2013
JP 2013-153127 A 8/2013

*Primary Examiner* — Allison Bernstein
(74) *Attorney, Agent, or Firm* — Foley & Lardner LLP

(57) ABSTRACT

According to one embodiment, a resistance change type memory includes: a semiconductor substrate having a first impurity concentration; a first interconnect extending in a first direction perpendicular to a surface of the semiconductor substrate; a second interconnect including a first semiconductor layer, the first semiconductor layer extending in a second direction parallel to the surface of the semiconductor substrate and having a second impurity concentration lower than the first impurity concentration; a memory layer between the first interconnect and the first semiconductor layer; a transistor including a second semiconductor layer between the first interconnect and the semiconductor substrate; and a third interconnect between the semiconductor substrate and the second semiconductor layer, and extending in the third direction.

19 Claims, 42 Drawing Sheets

(56) References Cited

U.S. PATENT DOCUMENTS

| | | | |
|---|---|---|---|
| 9,129,677 | B2 | 9/2015 | Murooka |
| 9,224,459 | B1 | 12/2015 | Murooka |
| 9,231,029 | B2 | 1/2016 | Murooka |
| 9,349,446 | B2 | 5/2016 | Murooka |
| 9,362,338 | B2 * | 6/2016 | Takeguchi .......... H01L 27/2454 |
| 9,455,257 | B2 | 9/2016 | Murooka |
| 9,508,430 | B2 | 11/2016 | Murooka |
| 9,698,202 | B2 | 7/2017 | Takaki |
| 9,825,096 | B2 * | 11/2017 | Ota ..................... H01L 27/2454 |
| 10,026,781 | B2 | 7/2018 | Murooka |
| 2012/0147644 | A1 | 6/2012 | Scheuerlein |
| 2012/0147645 | A1 | 6/2012 | Scheuerlein |
| 2012/0147646 | A1 | 6/2012 | Scheuerlein |
| 2012/0147647 | A1 | 6/2012 | Scheuerlein |
| 2012/0147648 | A1 | 6/2012 | Scheuerlein |
| 2012/0147649 | A1 | 6/2012 | Samachisa et al. |
| 2012/0147650 | A1 | 6/2012 | Samachisa et al. |
| 2012/0147651 | A1 | 6/2012 | Scheuerlein et al. |
| 2012/0147652 | A1 | 6/2012 | Scheuerlein |
| 2012/0147689 | A1 | 6/2012 | Scheuerlein et al. |
| 2012/0327714 | A1 | 12/2012 | Lue |
| 2013/0148400 | A1 | 6/2013 | Murooka |

* cited by examiner

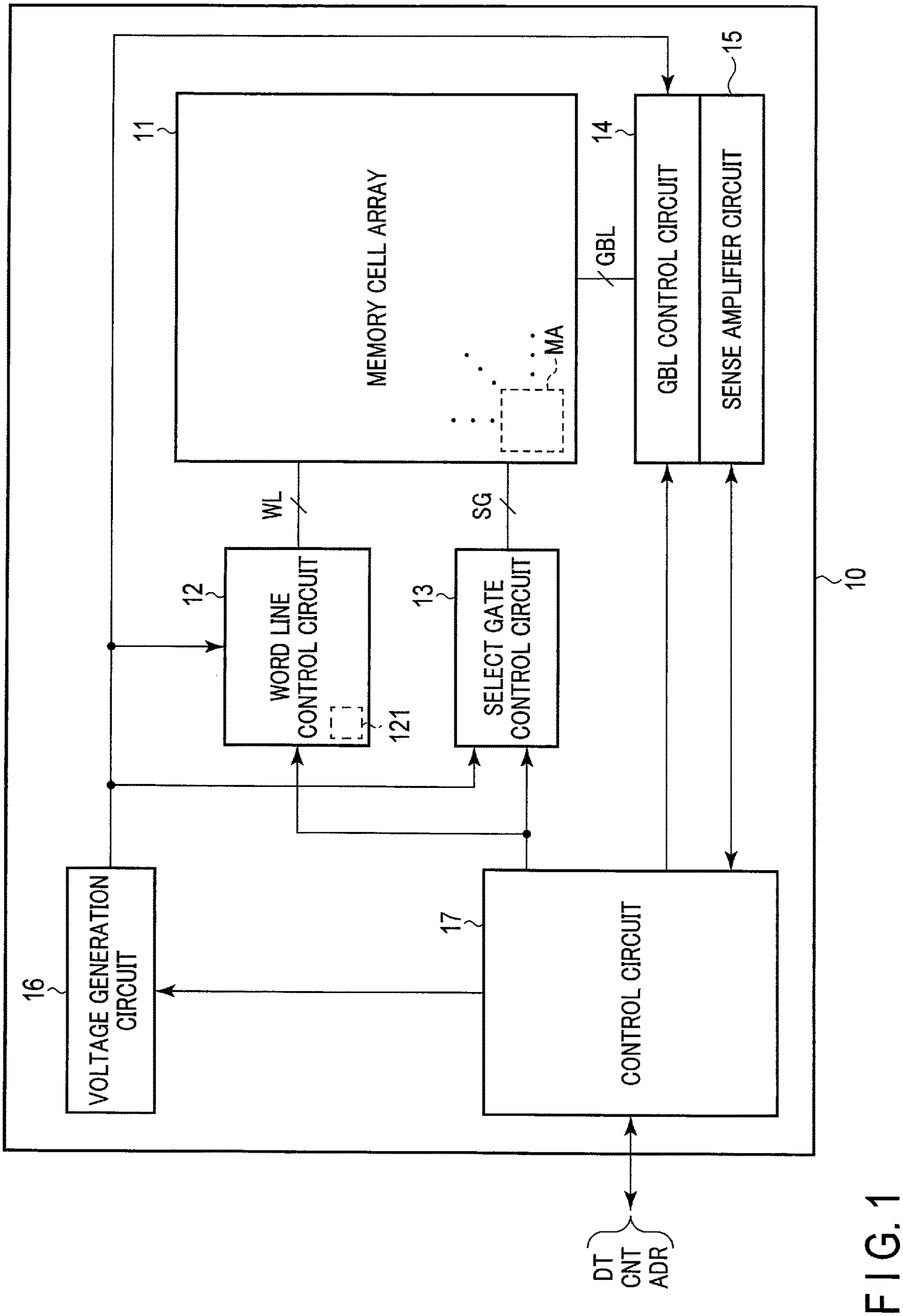
F I G. 1

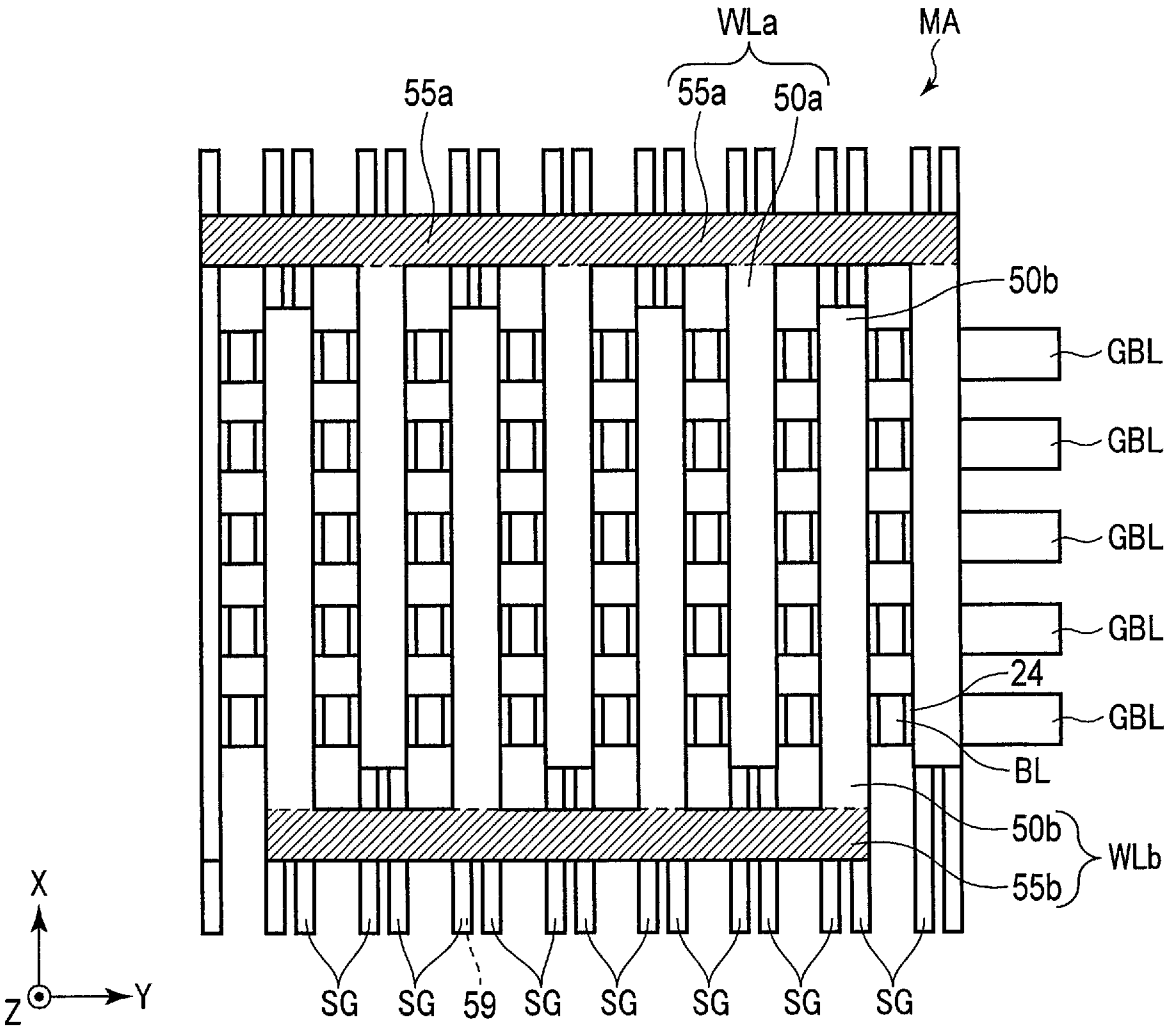
F I G. 4

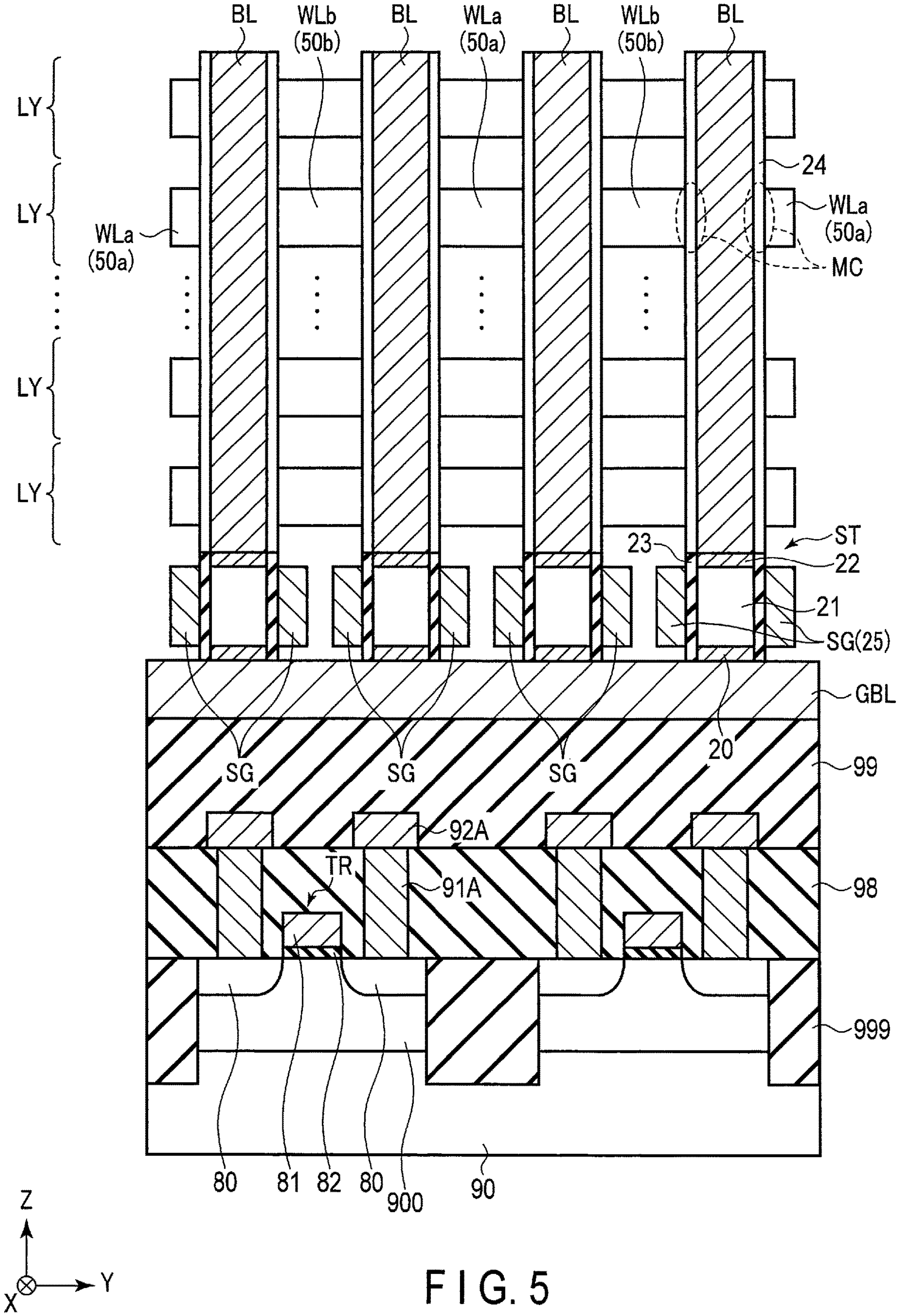
F I G. 5

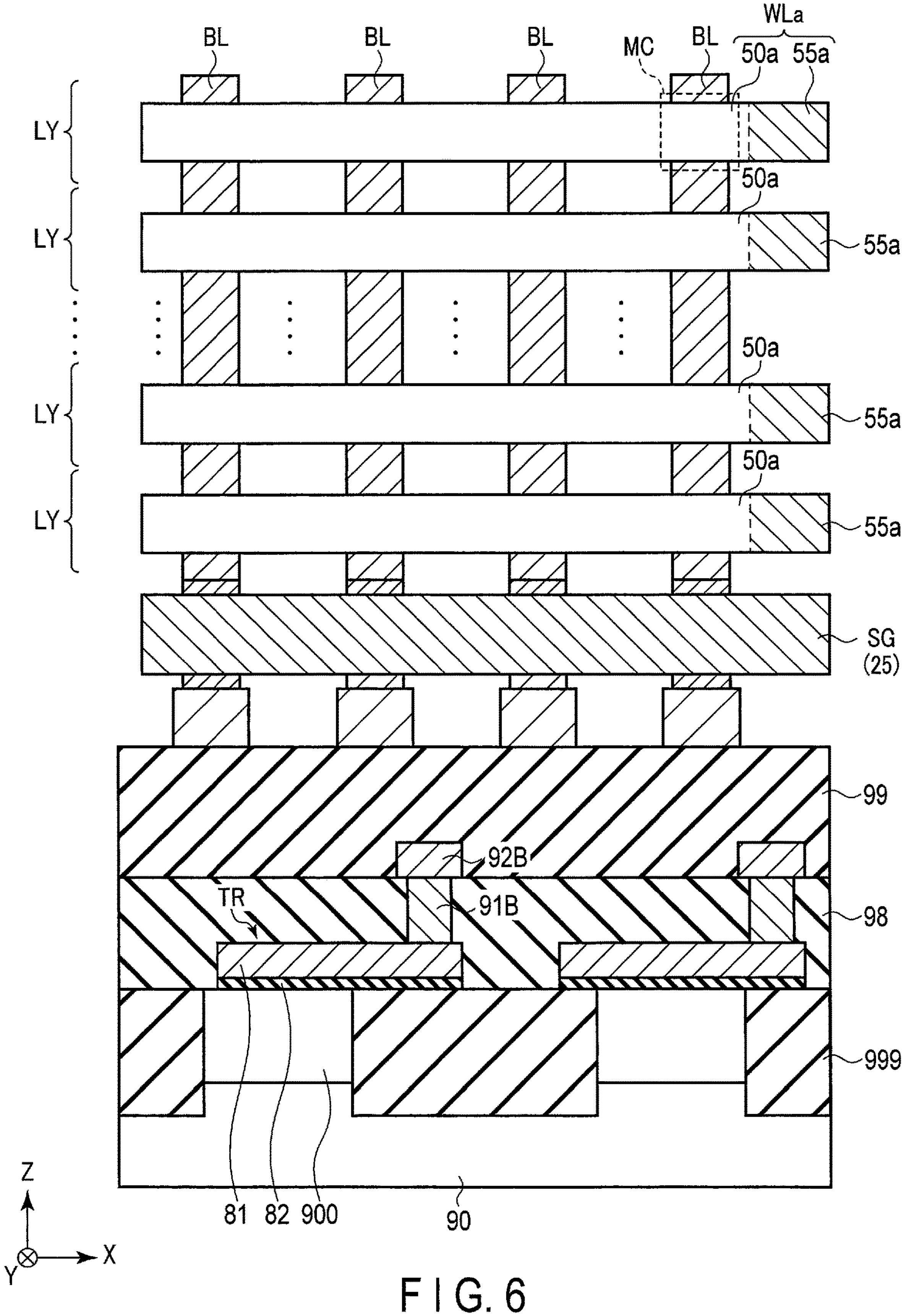
F I G. 6

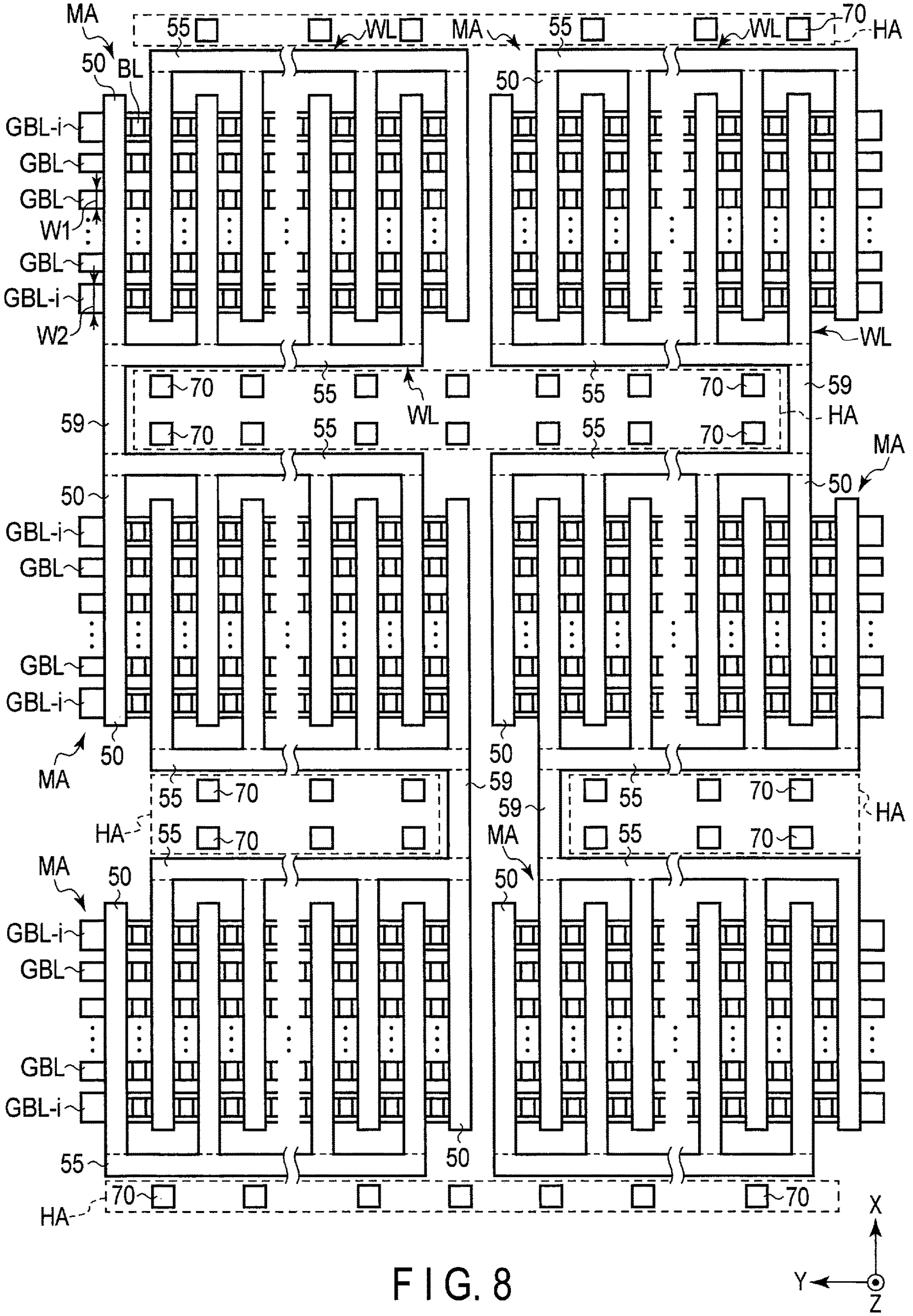
F I G. 8

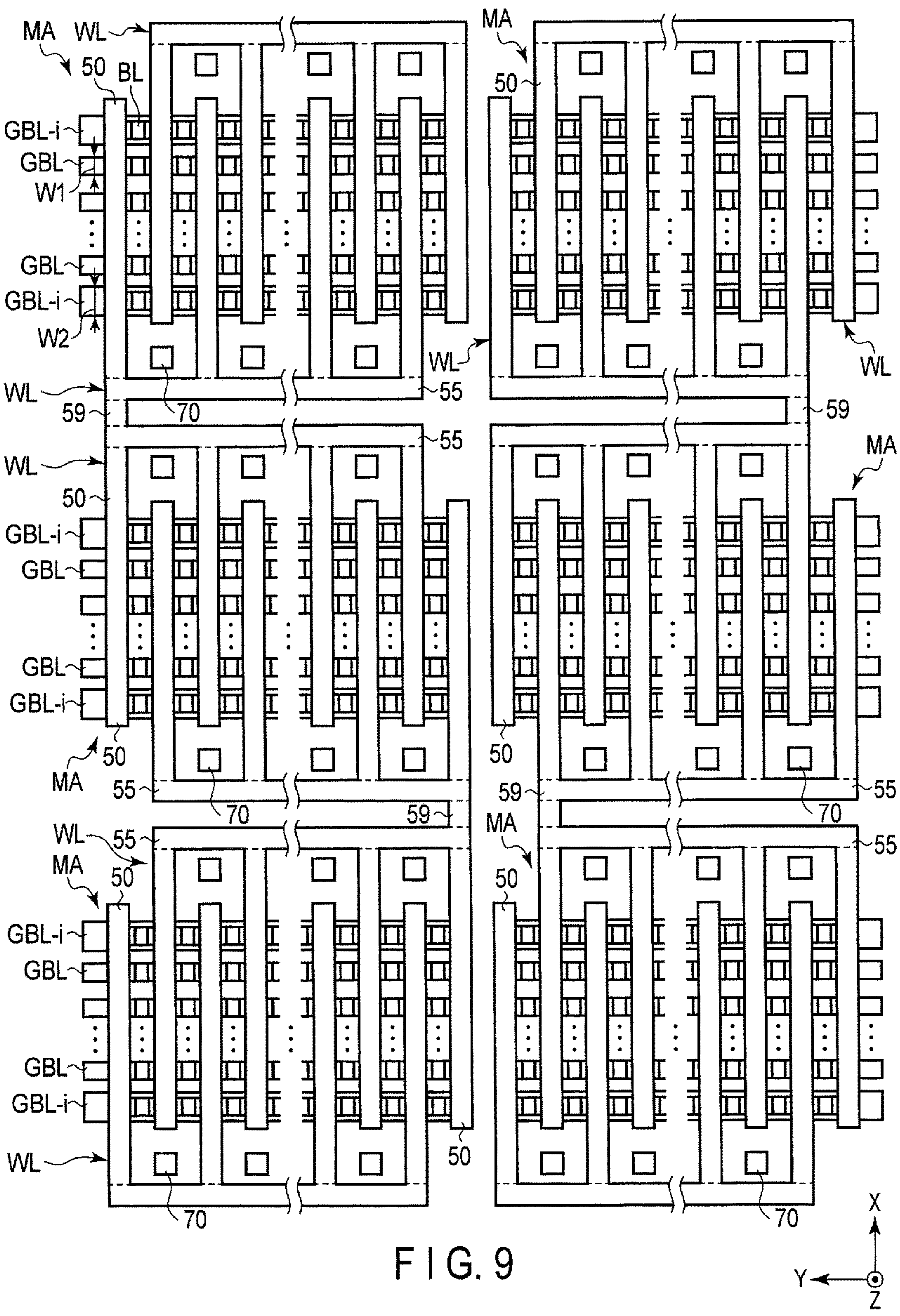
F I G. 9

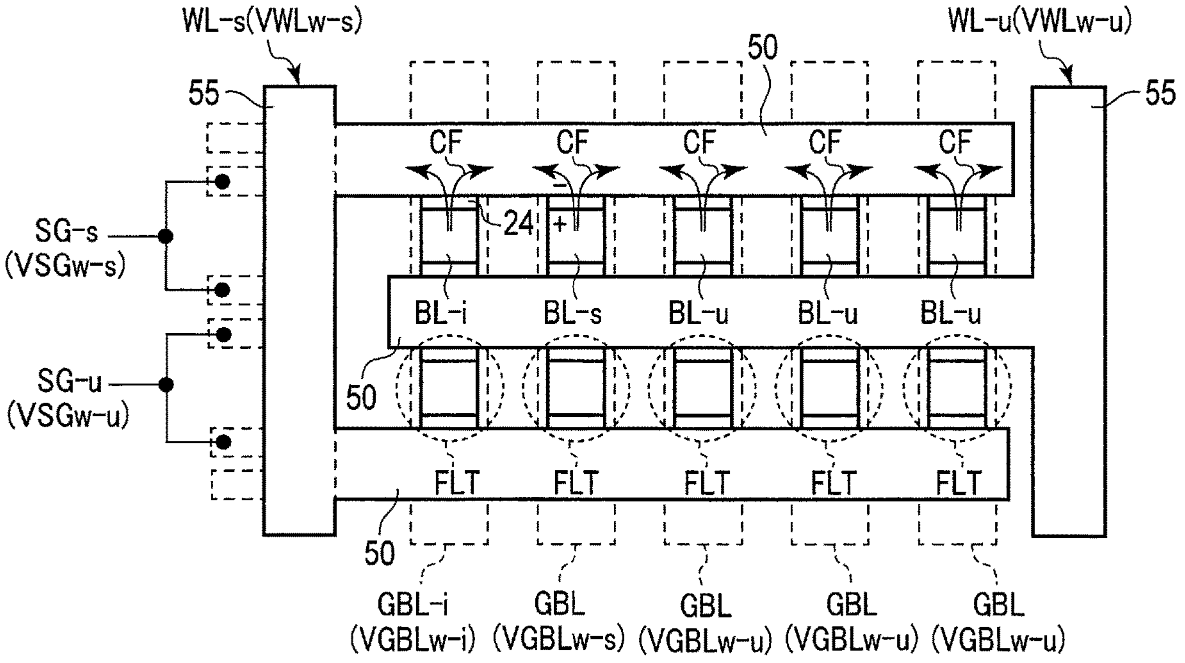
F I G. 11
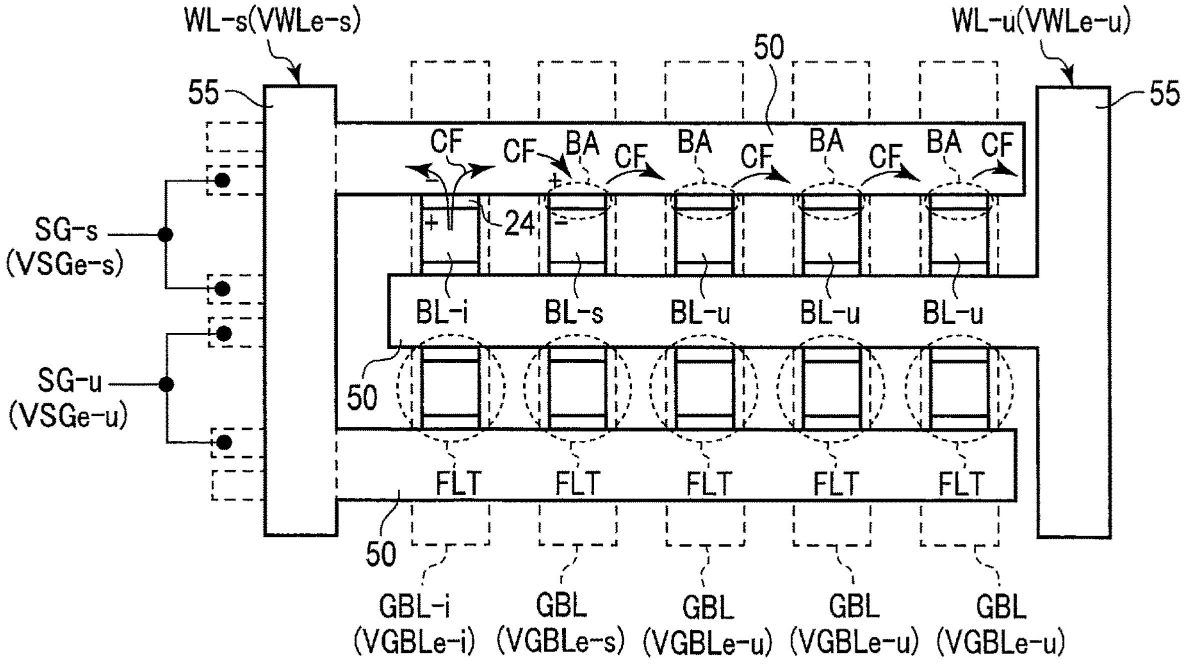
F I G. 12

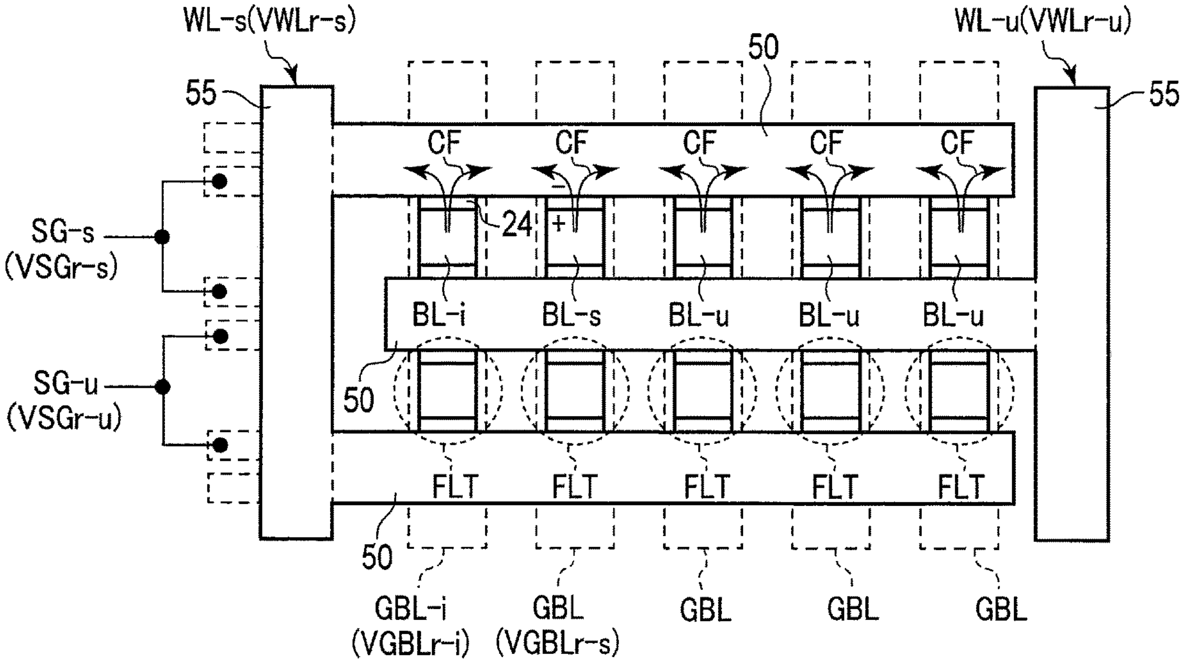
F I G. 13

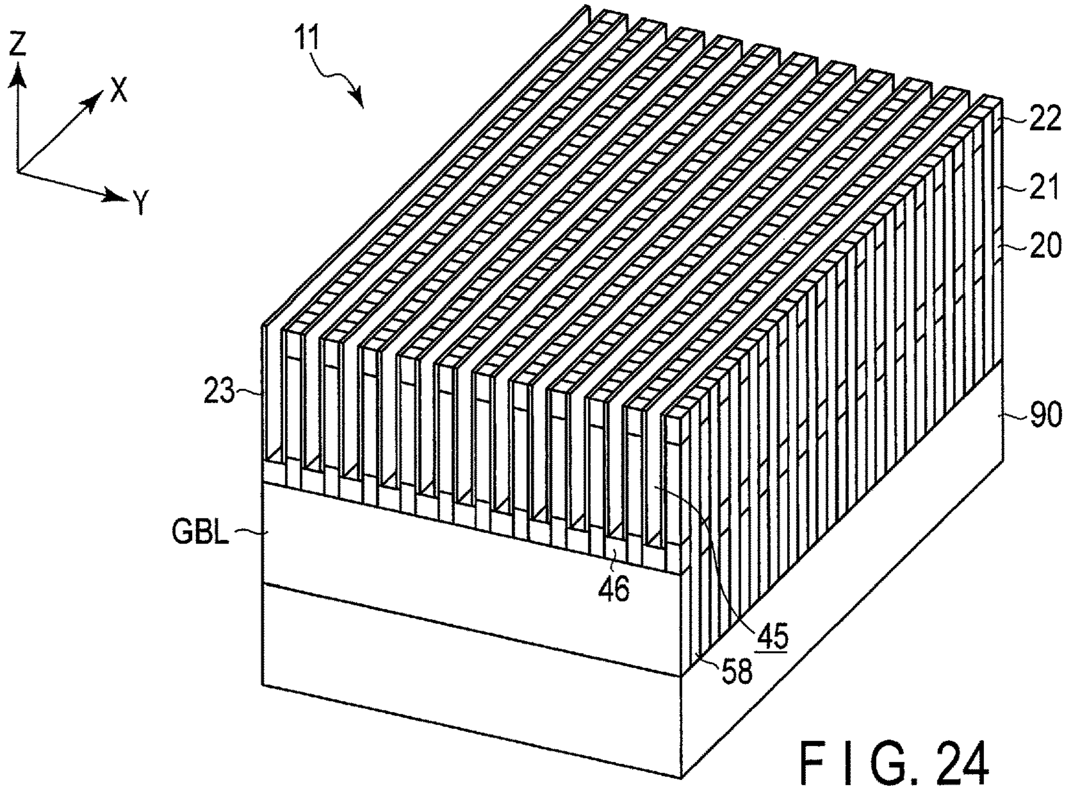
F I G. 24
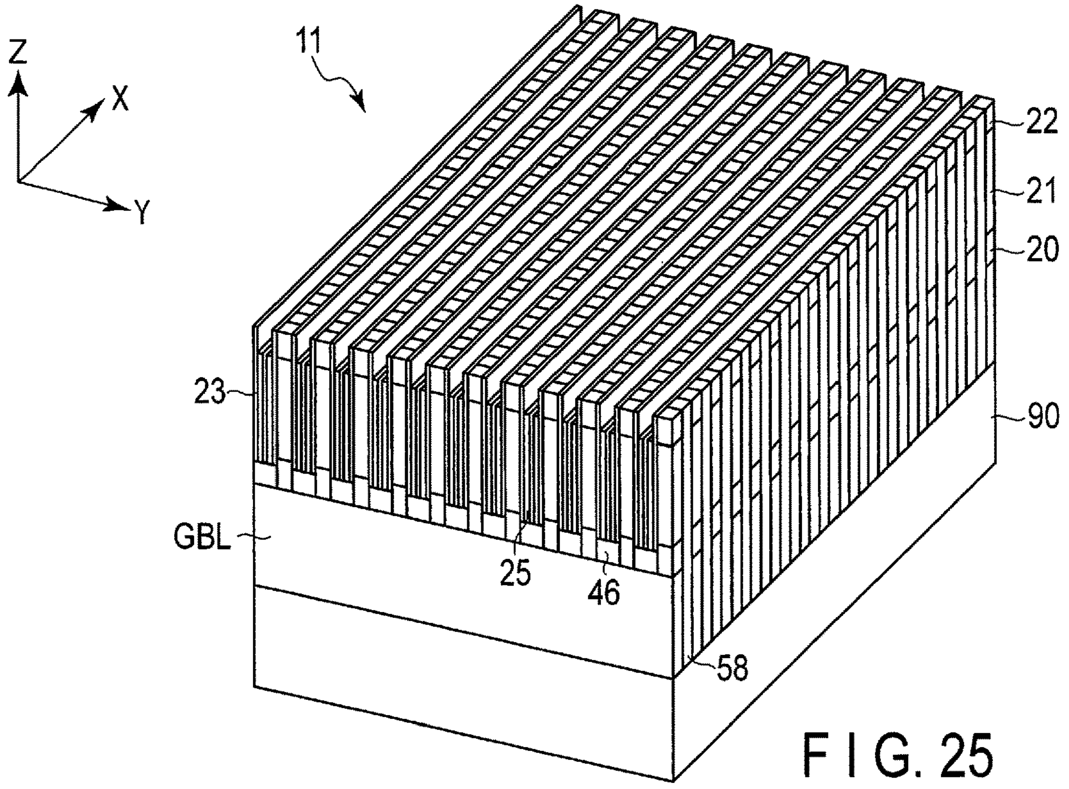
F I G. 25

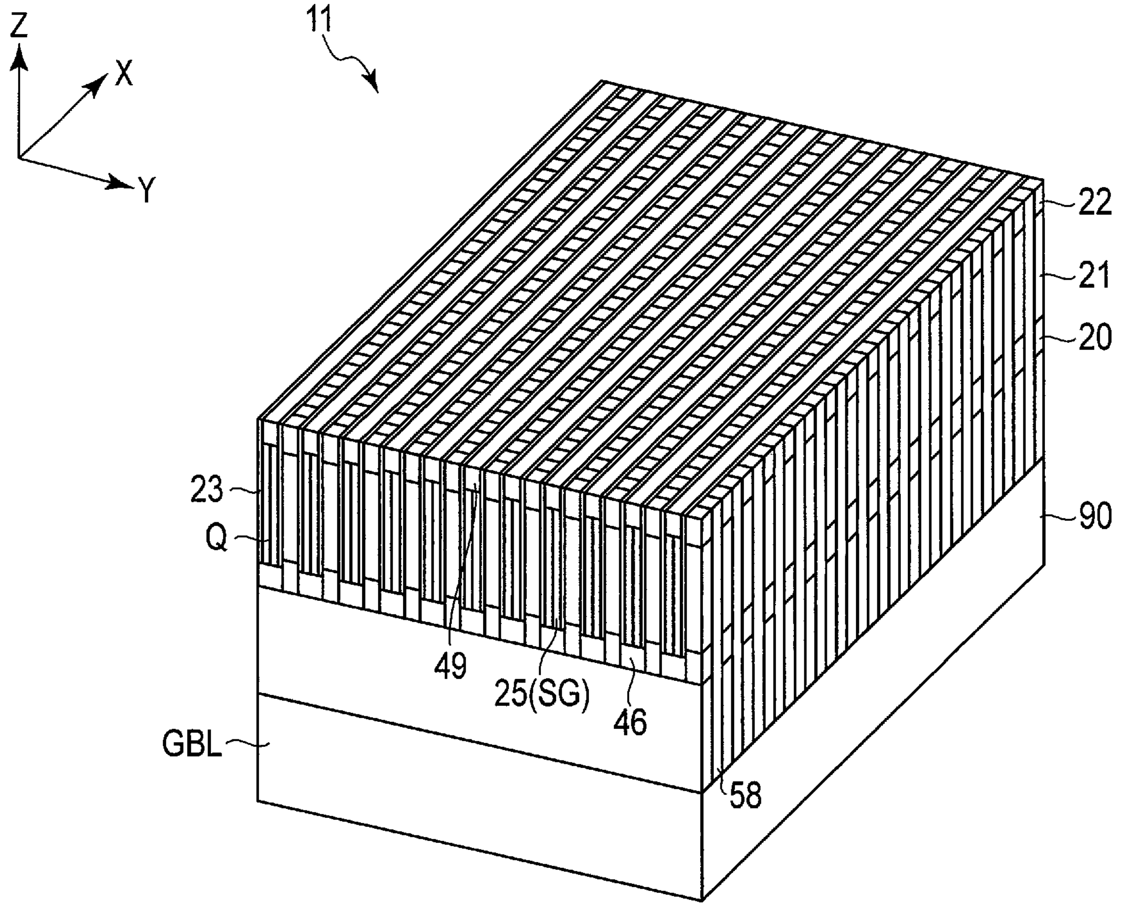
F I G. 26

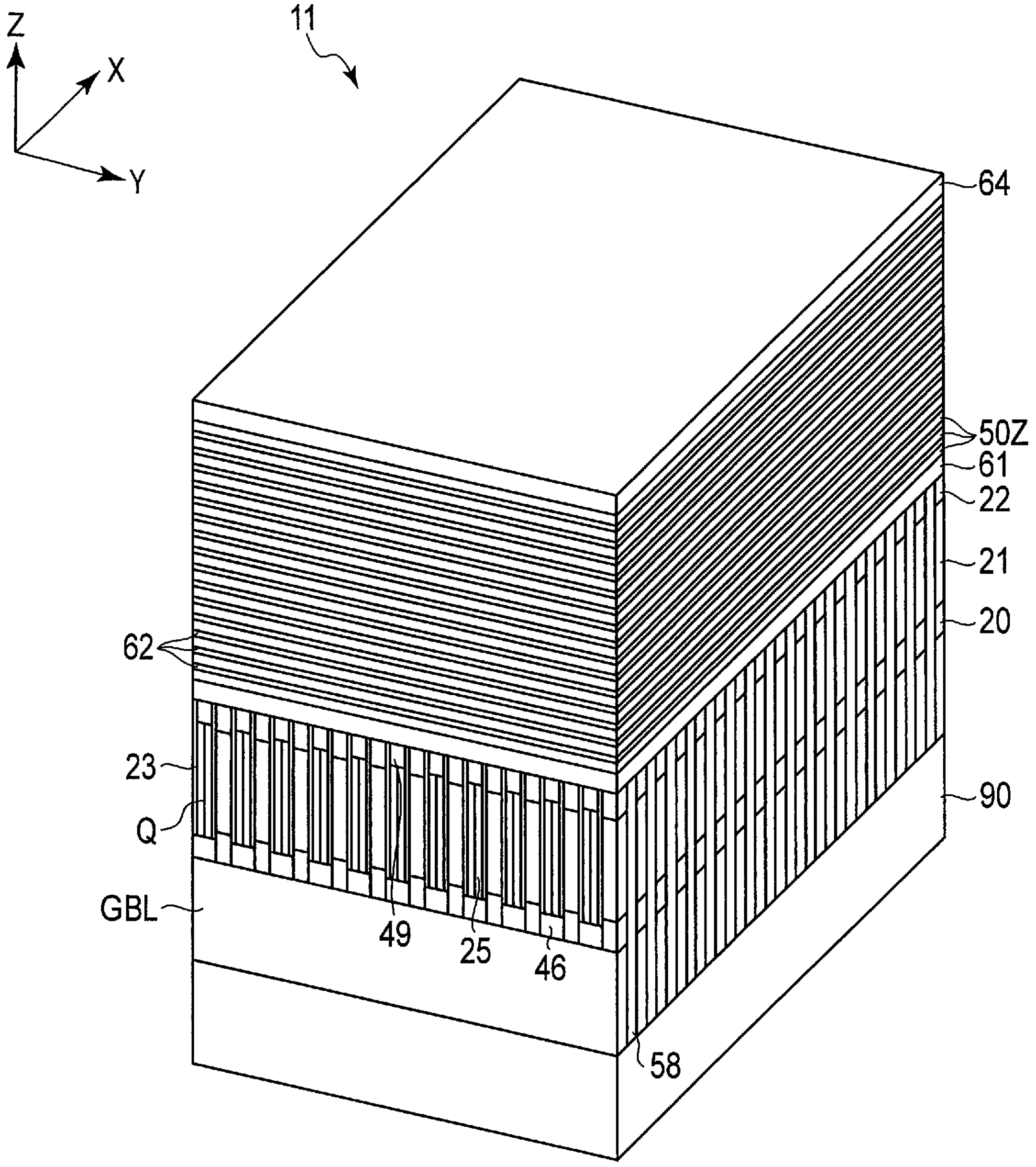
F I G. 27

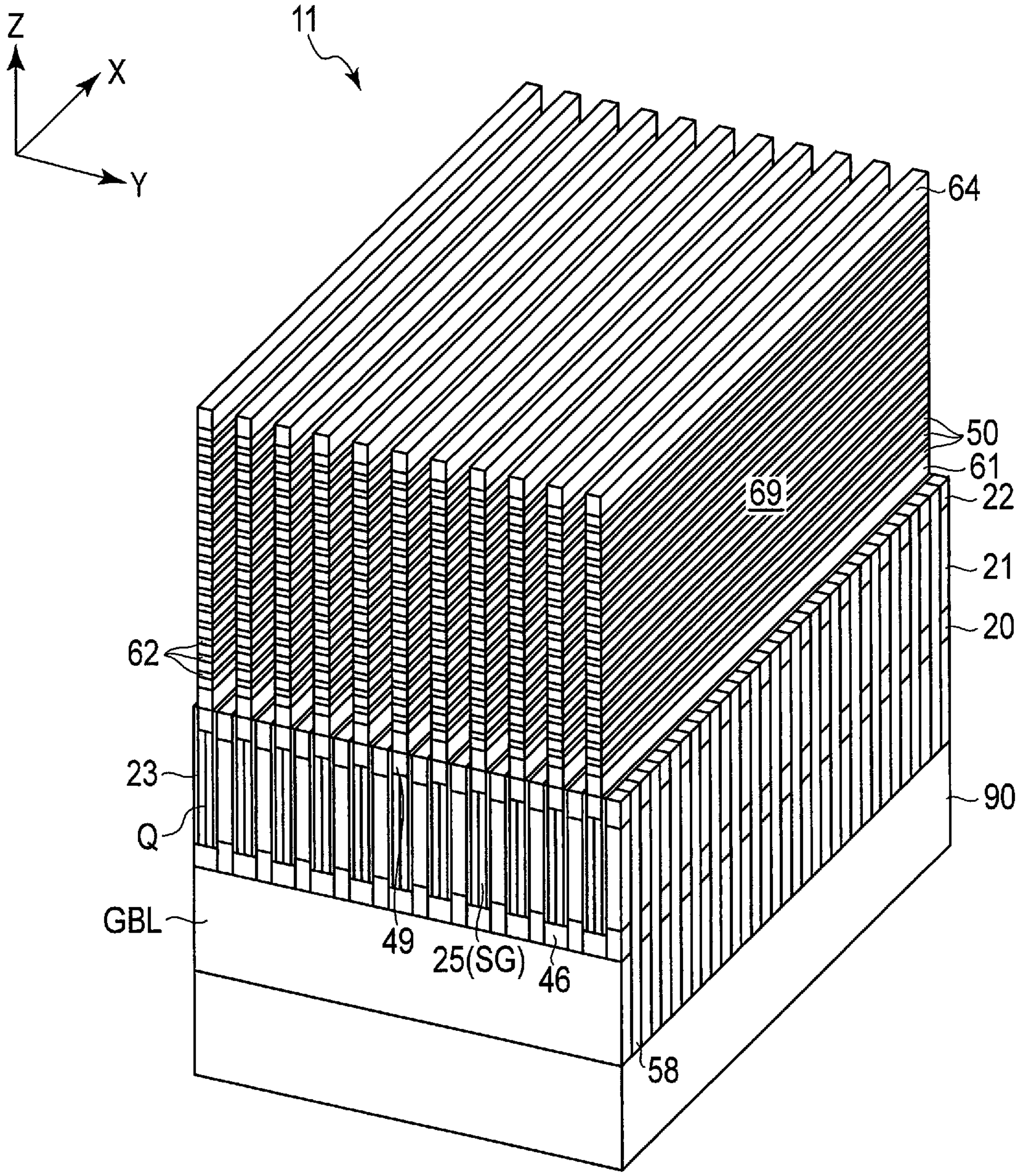
F I G. 28

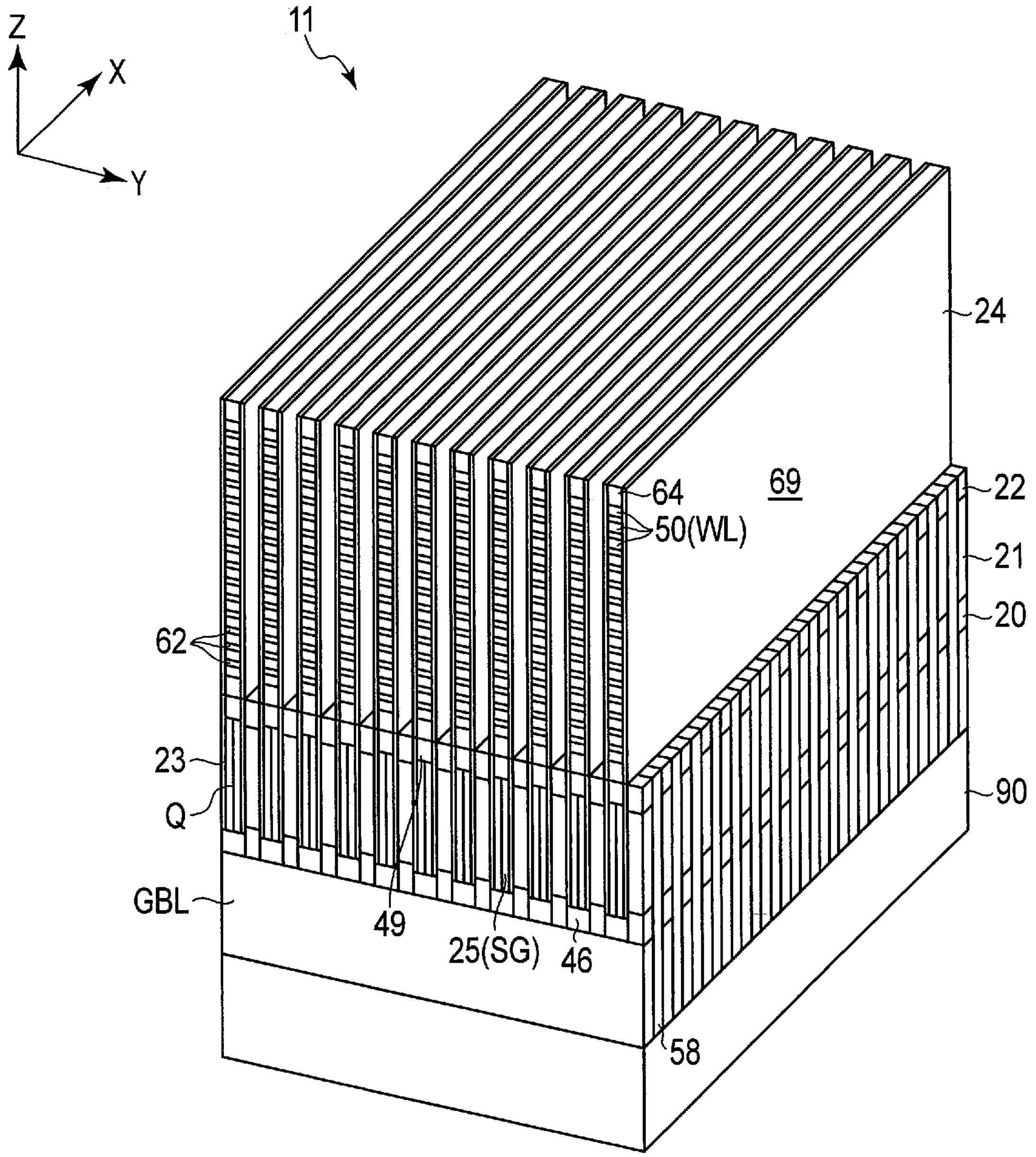
F I G. 29

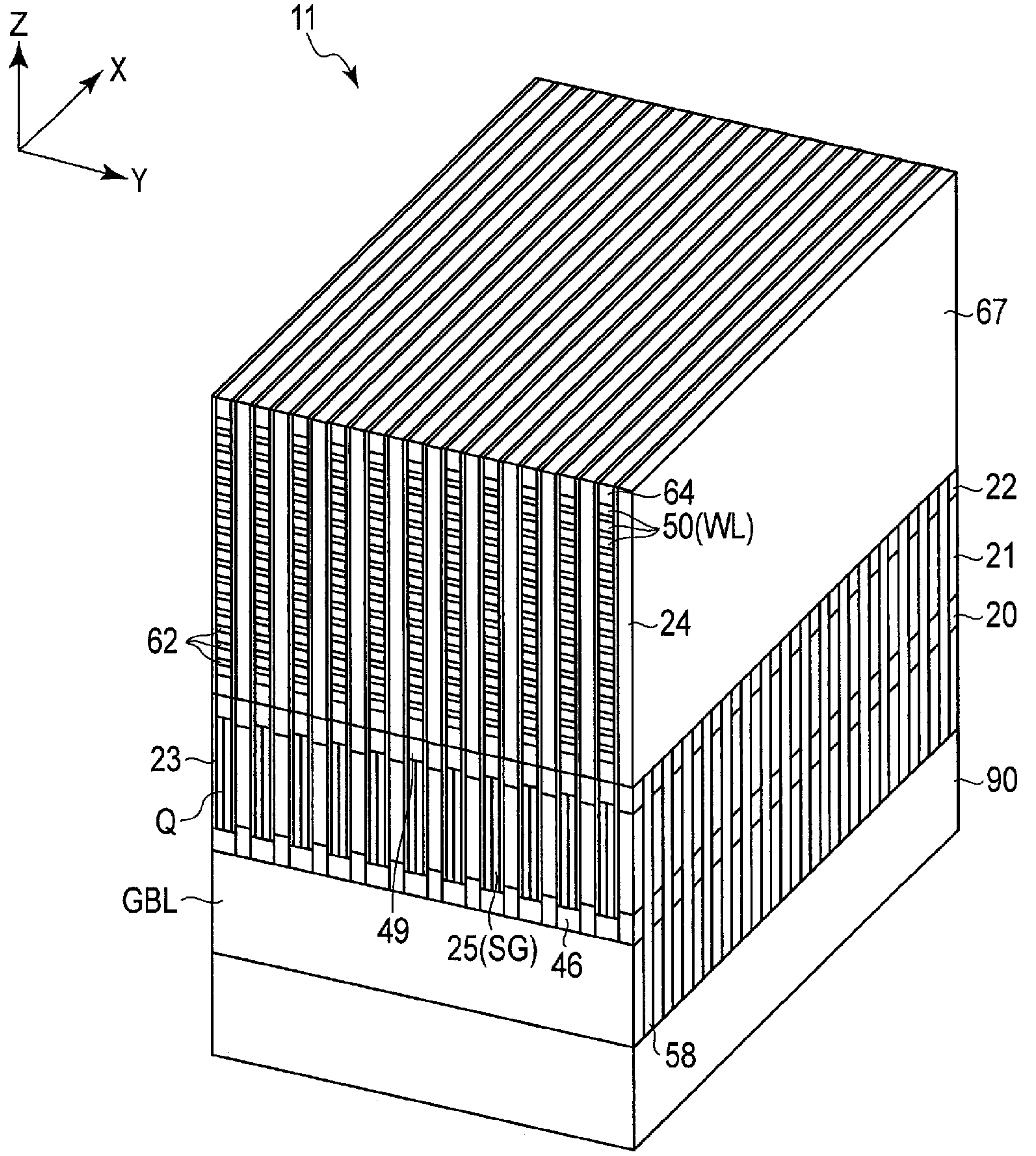
F I G. 30

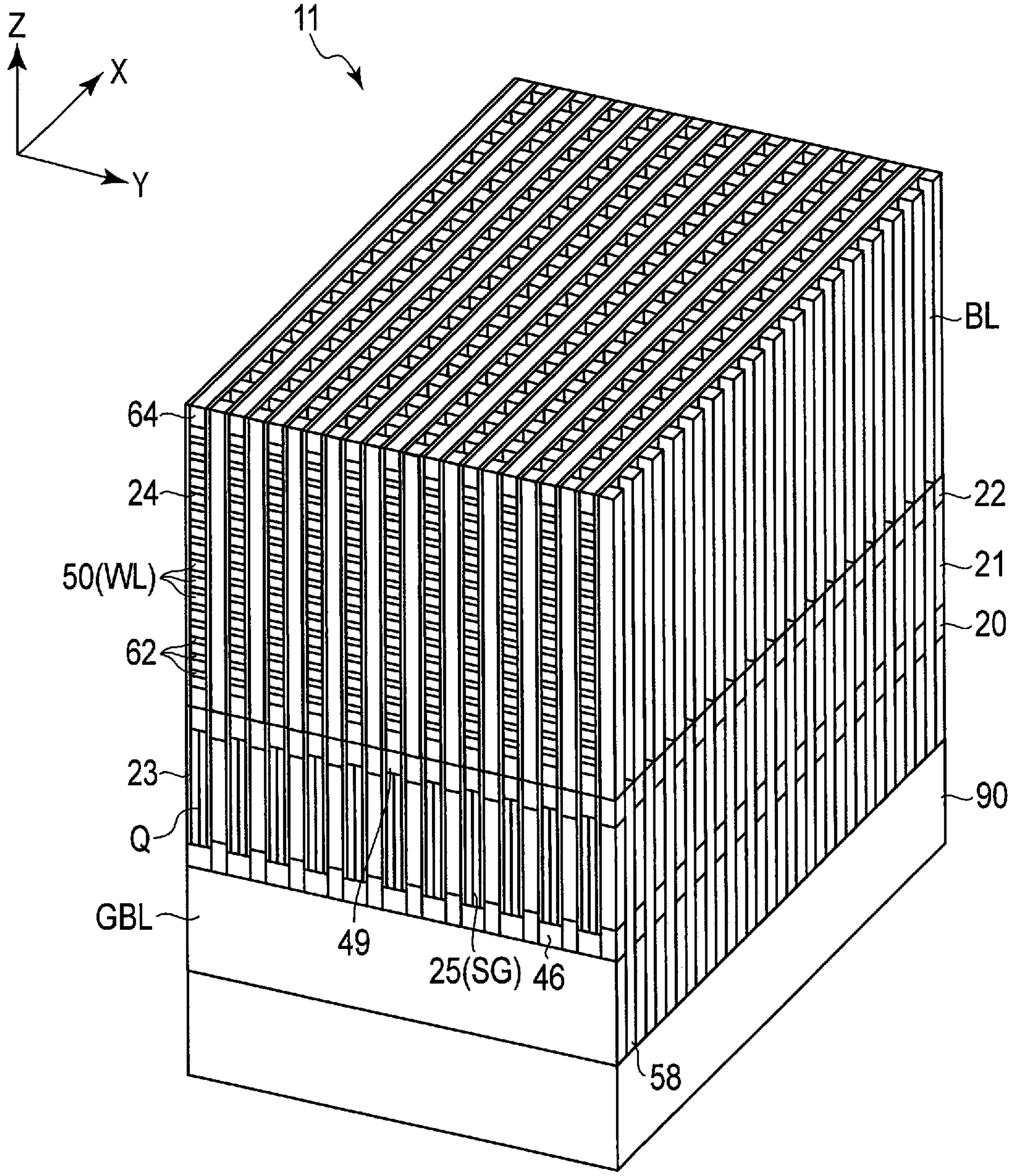
F I G. 31

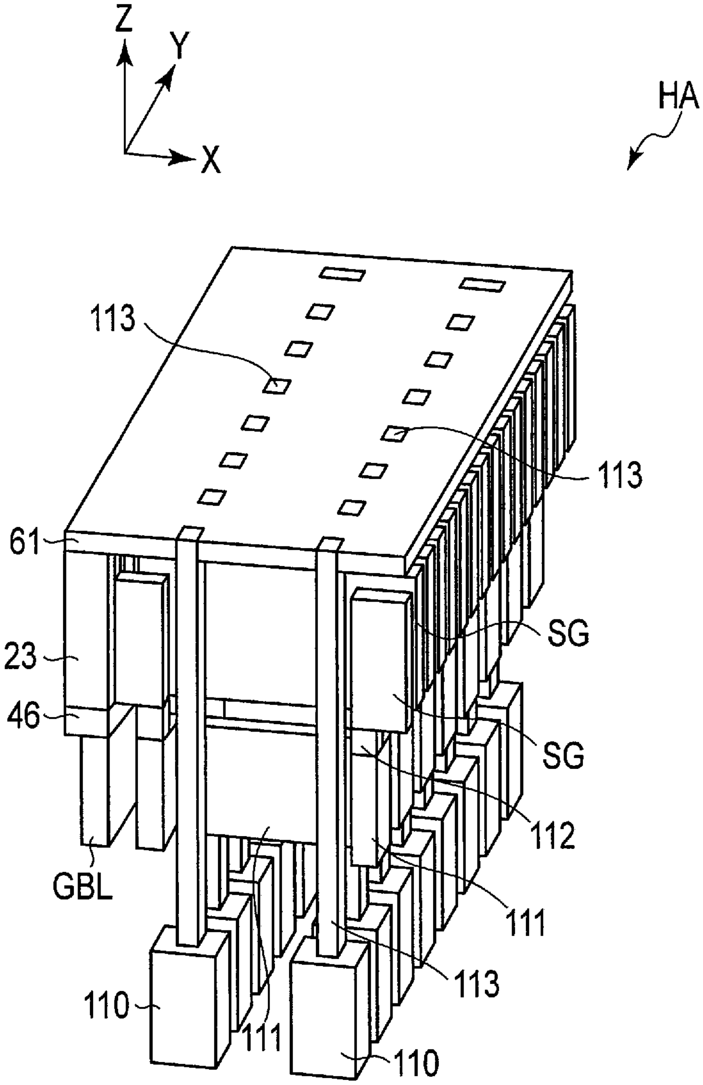
F I G. 32

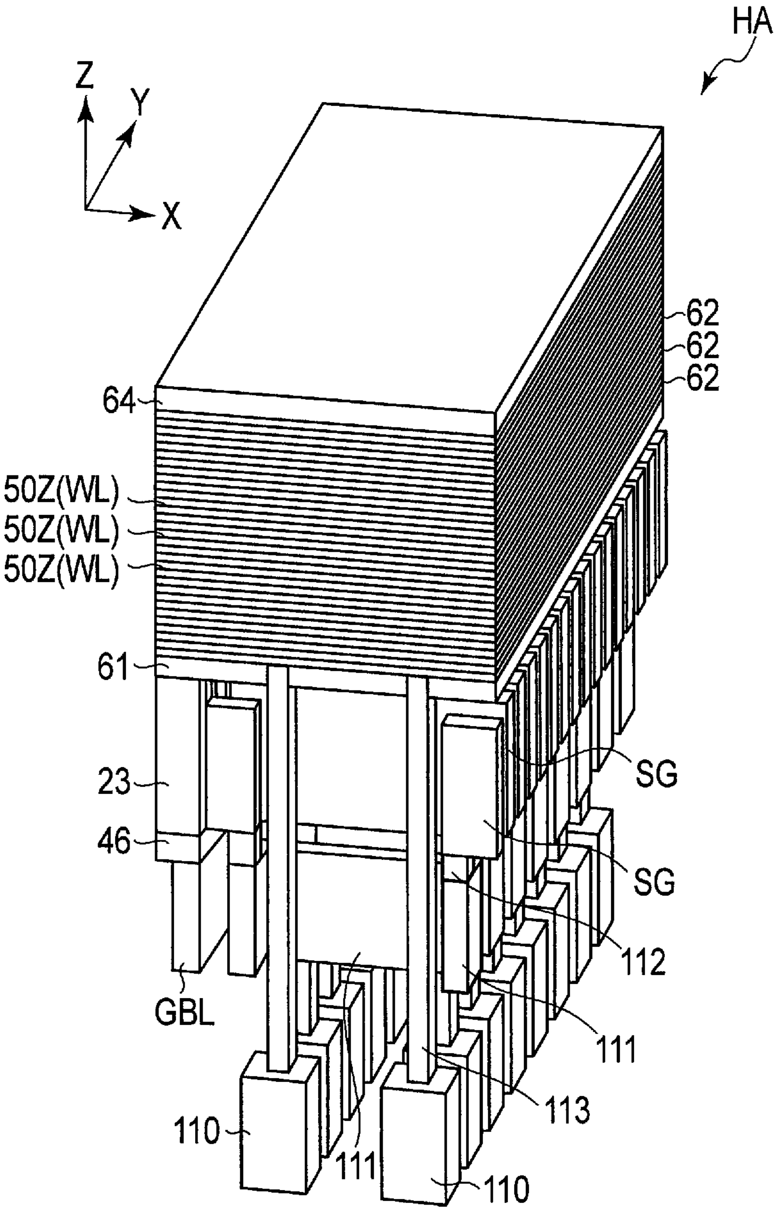
F I G. 33

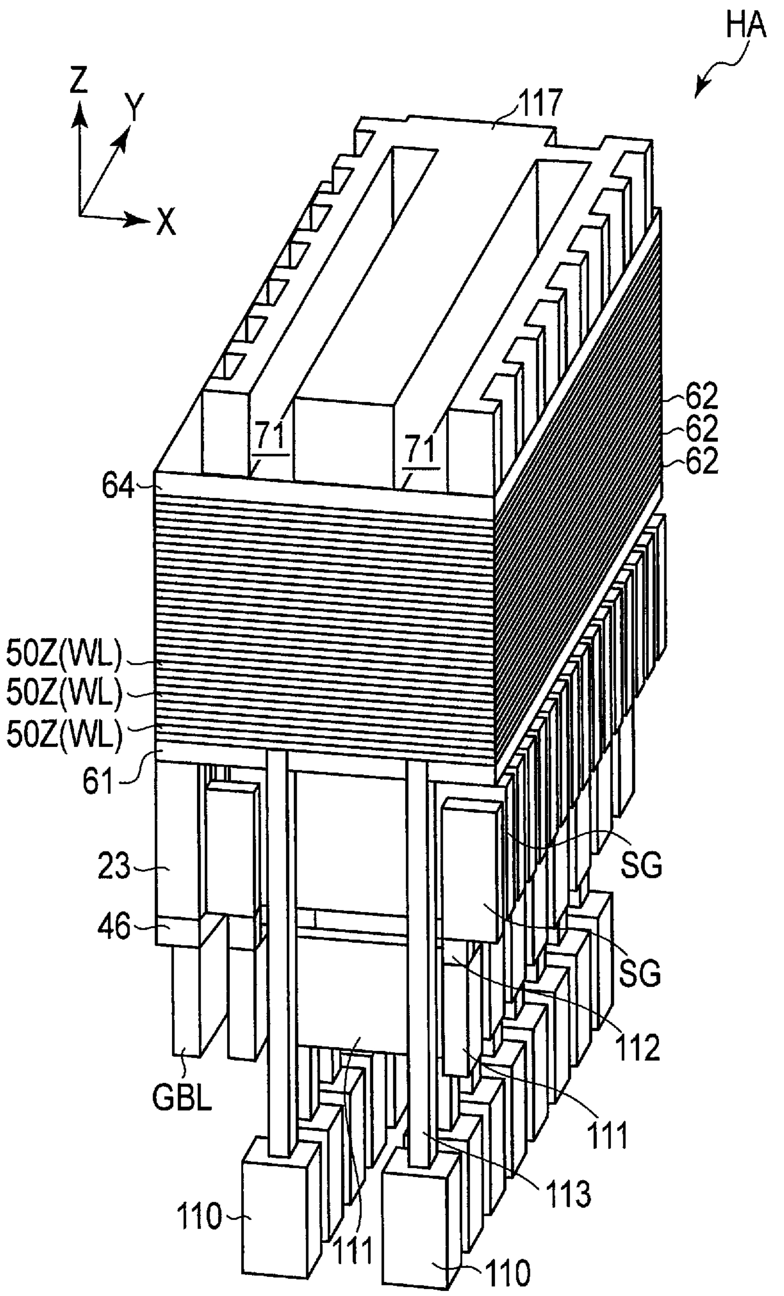
F I G. 34

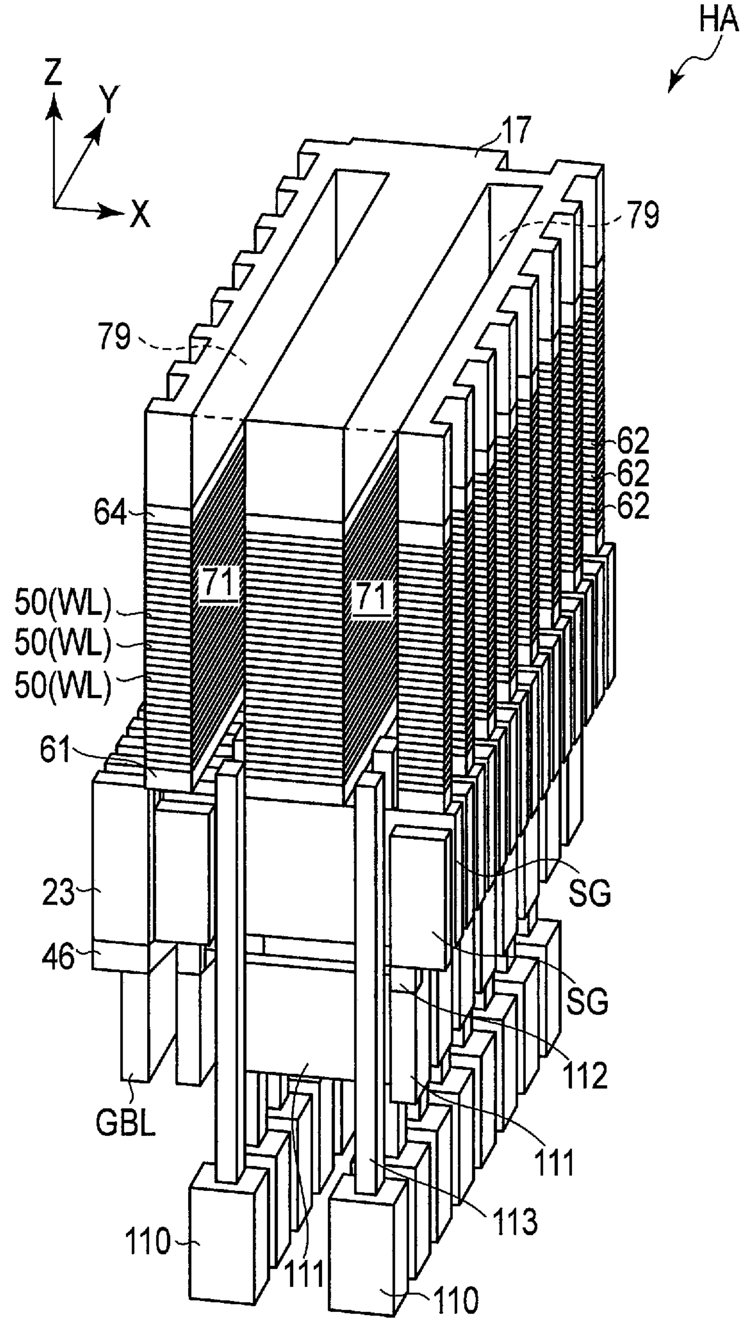
F I G. 35

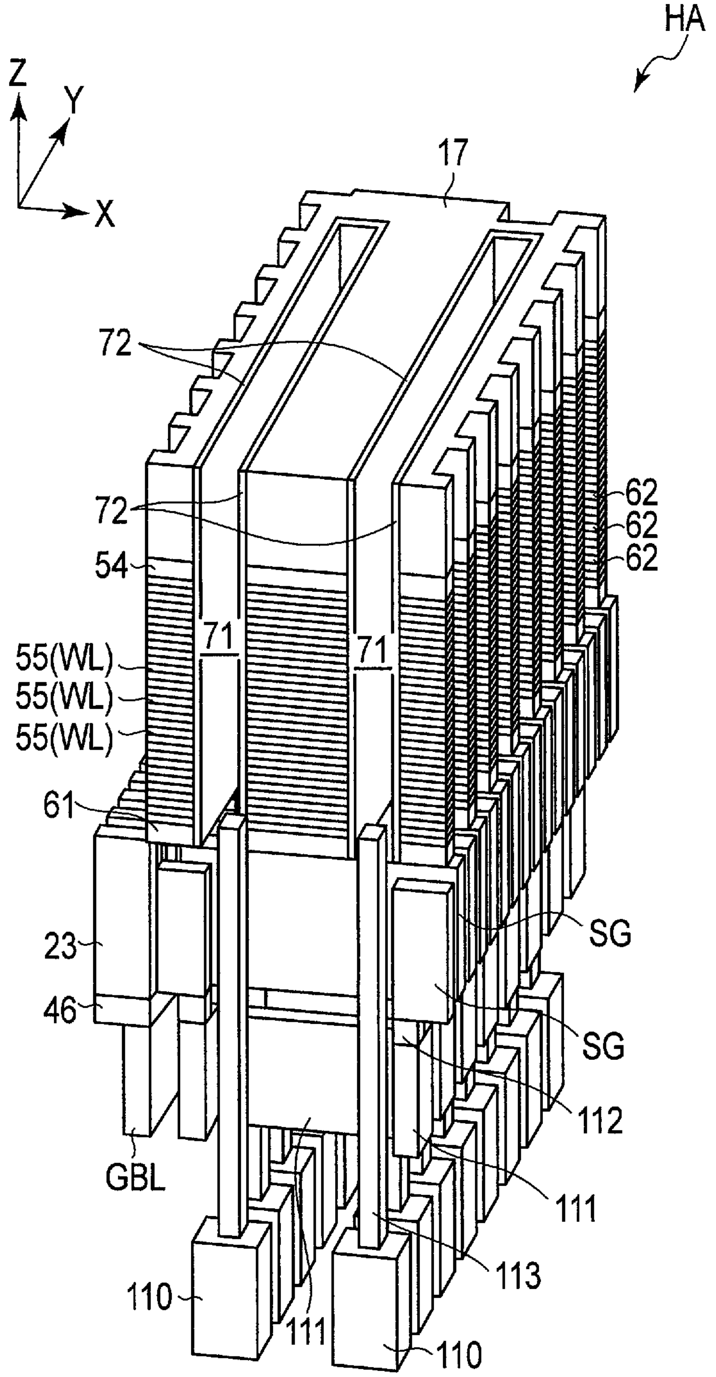
F I G. 36

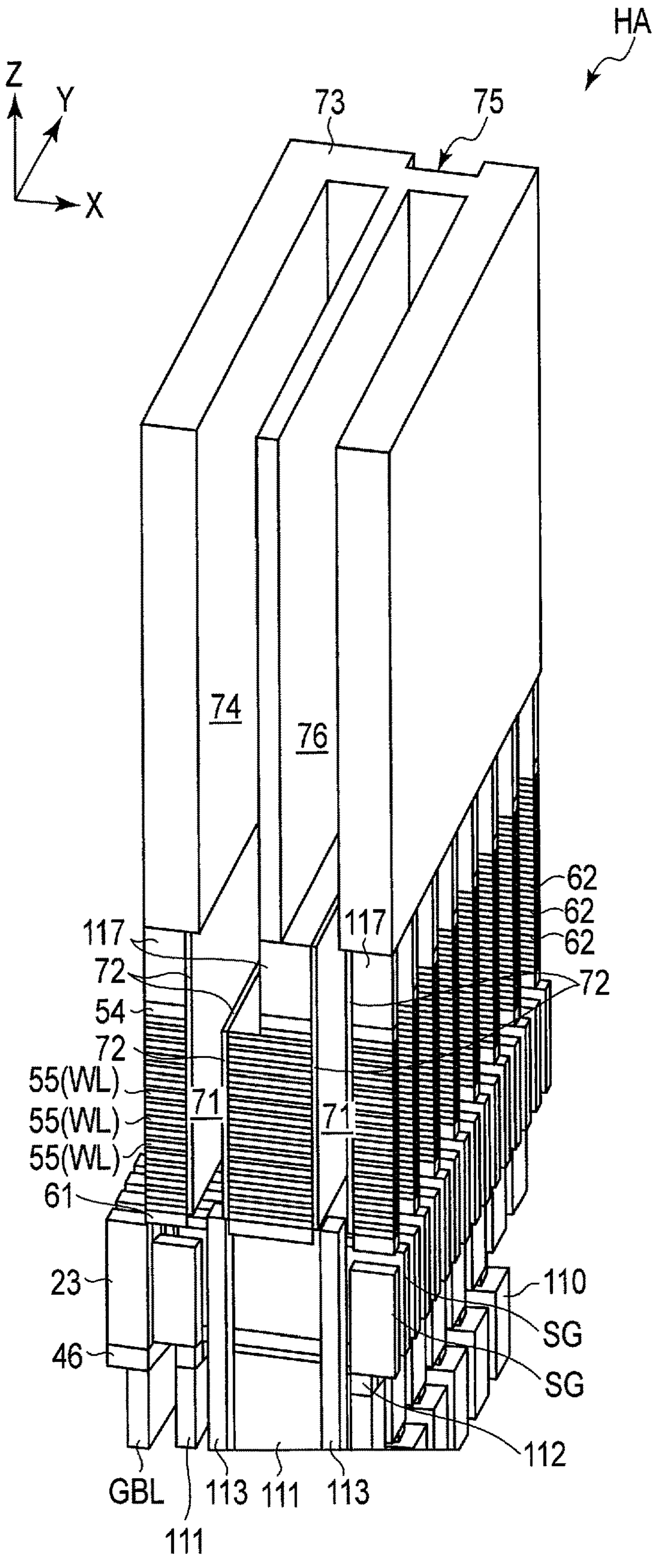
F I G. 38

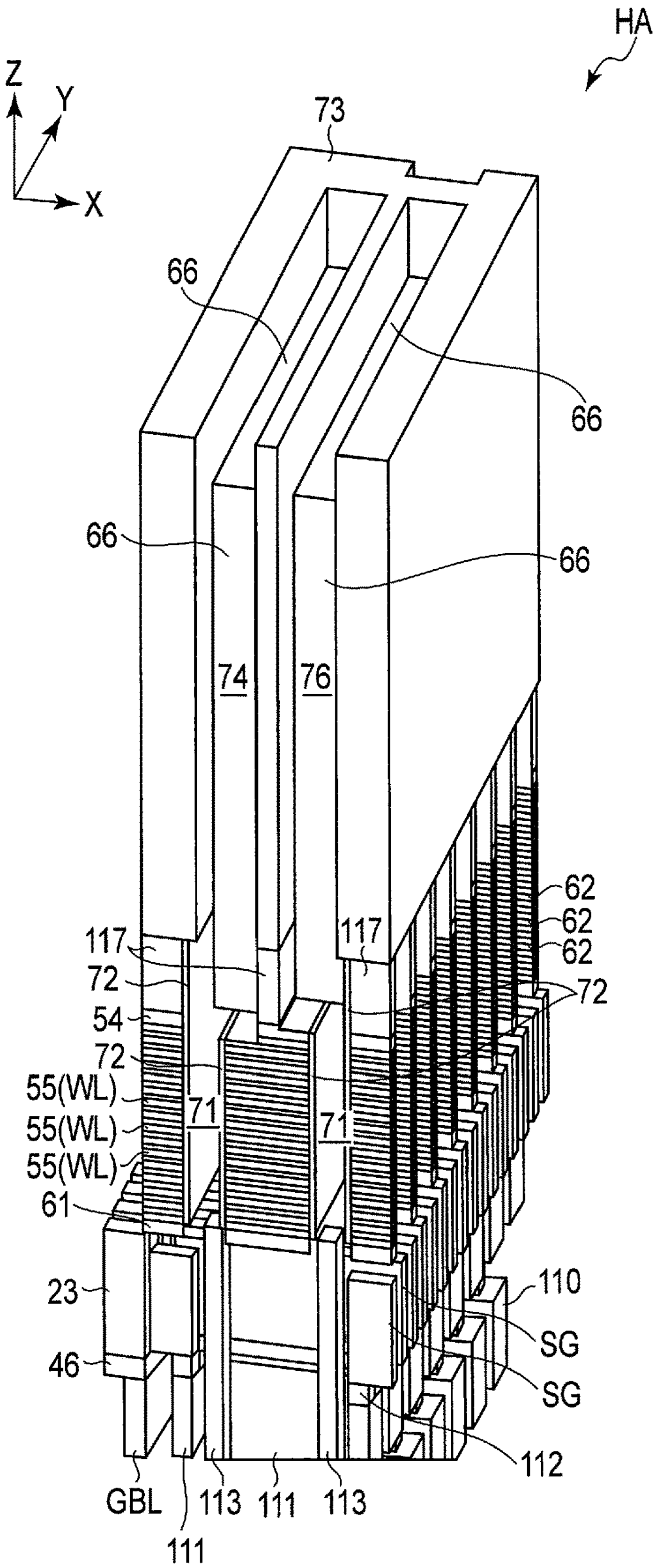
F I G. 39

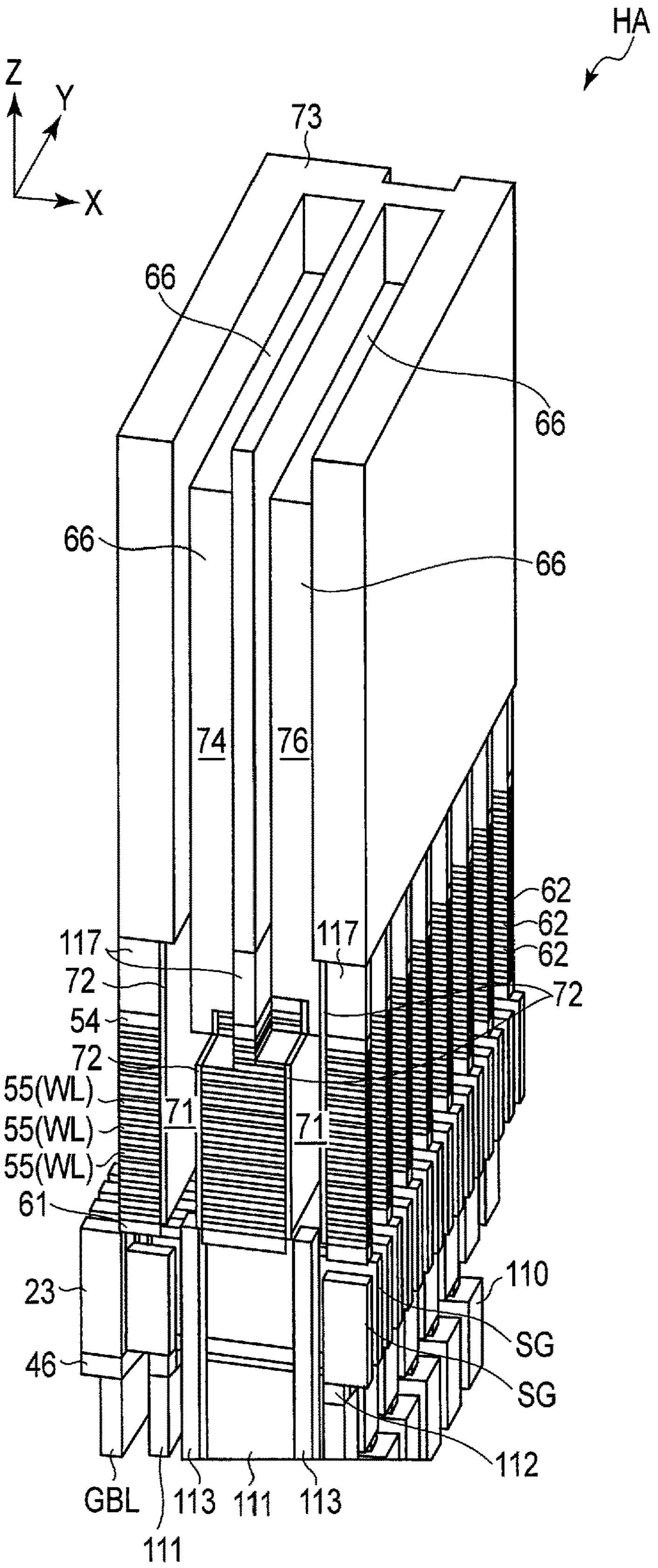
F I G. 40

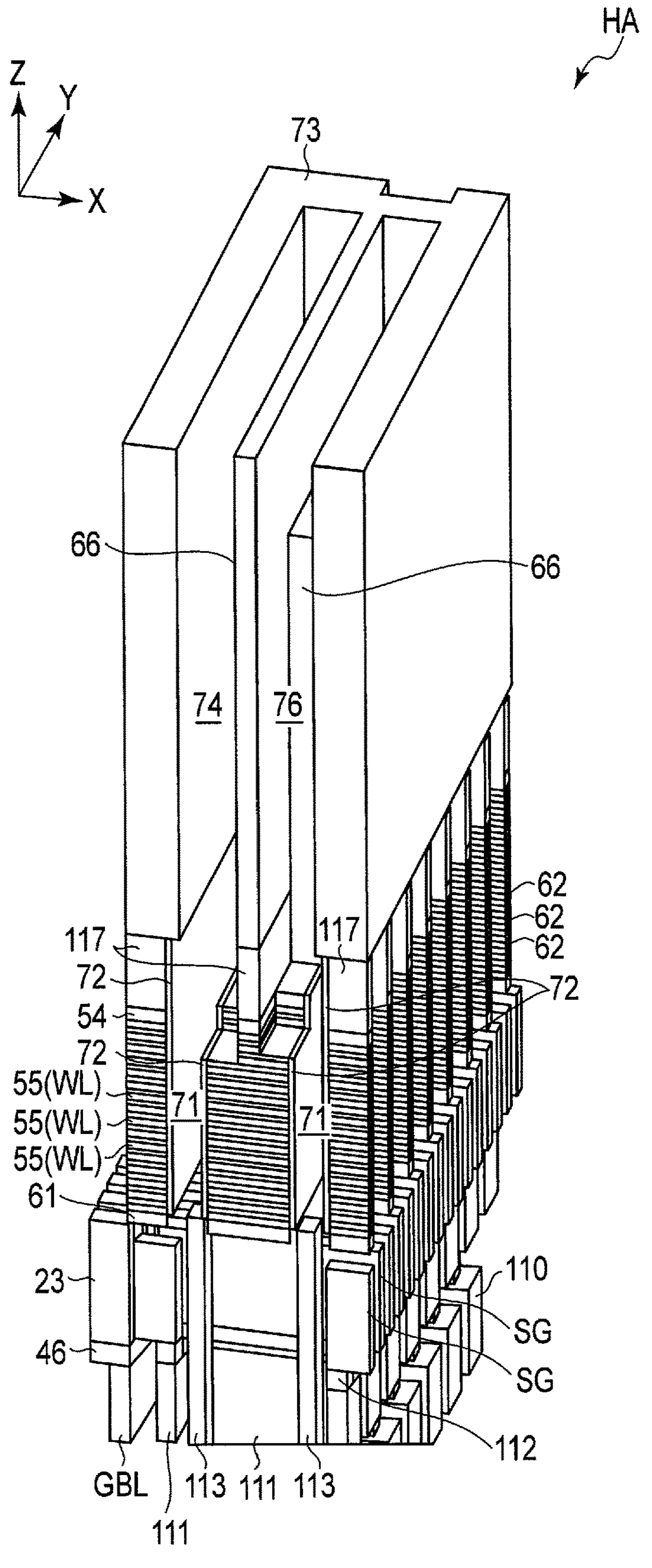
F I G. 41

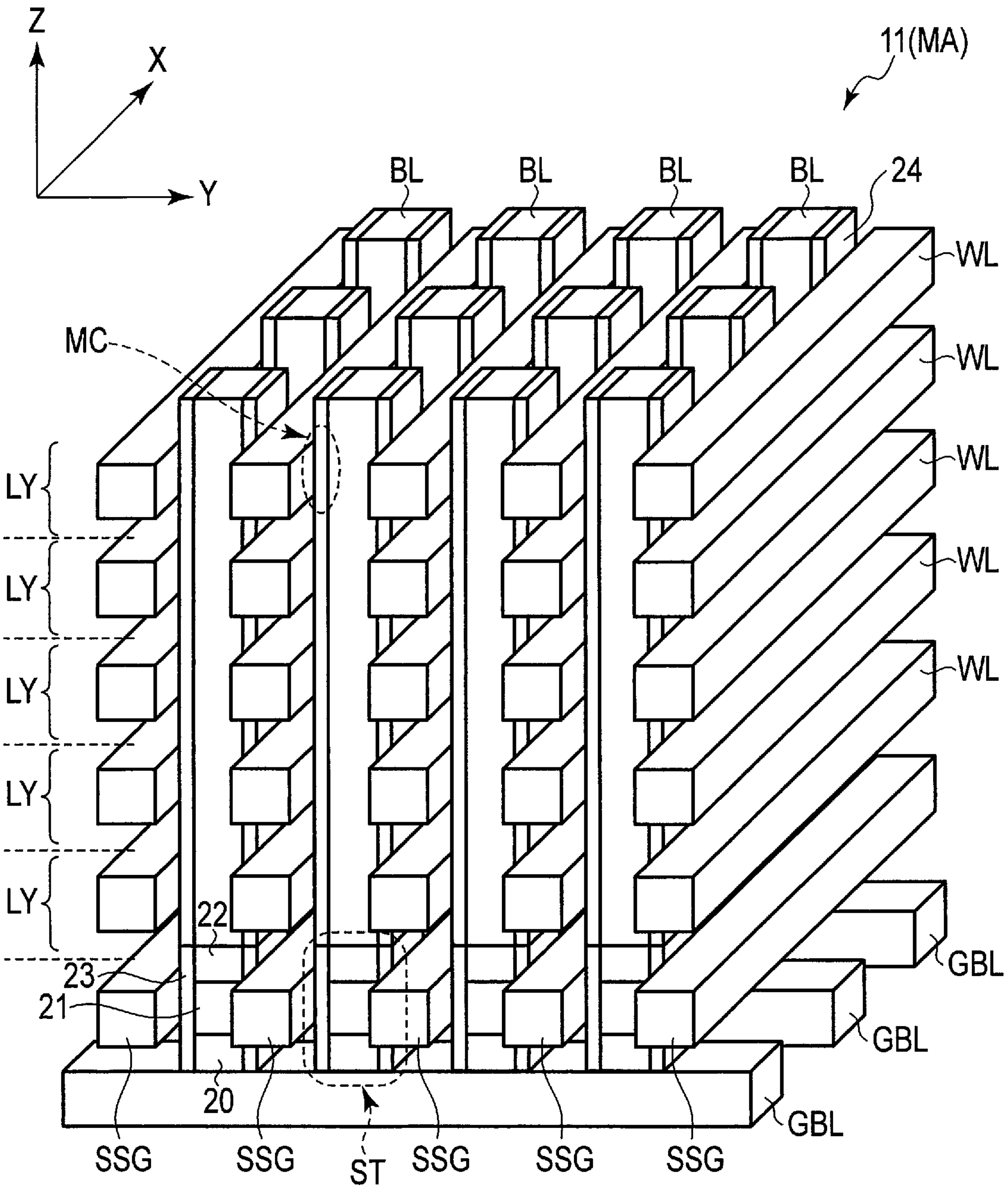
F I G. 42

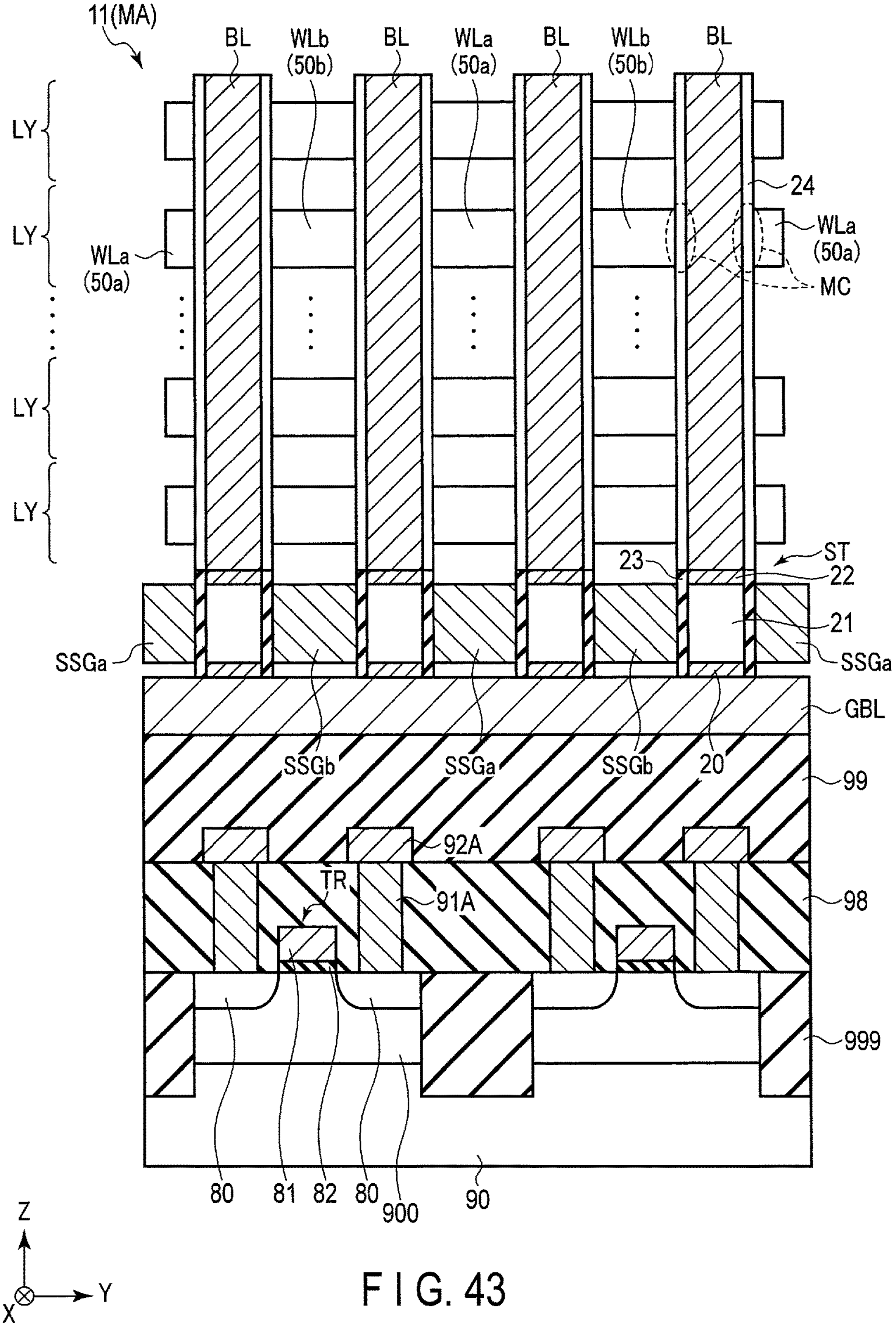
F I G. 43

RESISTANCE CHANGE TYPE MEMORY

CROSS-REFERENCE TO RELATED APPLICATIONS

This application is based upon and claims the benefit of priority from Japanese Patent Application No. 2018-175879, filed Sep. 20, 2018, the entire contents of which are incorporated herein by reference.

FIELD

Embodiments described herein relate generally to a resistance change type memory.

BACKGROUND

As a new memory device, research and development of a resistance change type memory, such as a ReRAM or a PCRAM, are being advanced.

BRIEF DESCRIPTION OF THE DRAWINGS

FIG. 1 is a block diagram showing a configuration example of the resistance change type memory of the first embodiment.

FIG. 4 is a top view showing a structure example of the resistance change type memory according to the first embodiment.

FIGS. 5 and 6 are cross-sectional views showing a structure example of the resistance change type memory according to the first embodiment.

FIGS. 8 and 9 are schematic diagrams each showing a structure example of the resistance change type memory according to the first embodiment.

FIGS. 10, 11, 12, and 13 are diagrams for explaining the operating principles of the resistance change type memory of the first embodiment.

FIGS. 20, 21, 22, 23, 24, 25, 26, 27, 28, 29, 30, 31, 32, 33, 34, 35, 36, 37, 38, 39, 40, and 41 are bird's-eye process charts showing the method for manufacturing the resistance change type memory of the first embodiment.

FIG. 42 is a bird's-eye view showing a structure example of the resistance change type memory of the second embodiment.

FIG. 43 is a cross-sectional view showing a configuration example of the resistance change type memory of the second embodiment.

DETAILED DESCRIPTION

Figure 2:
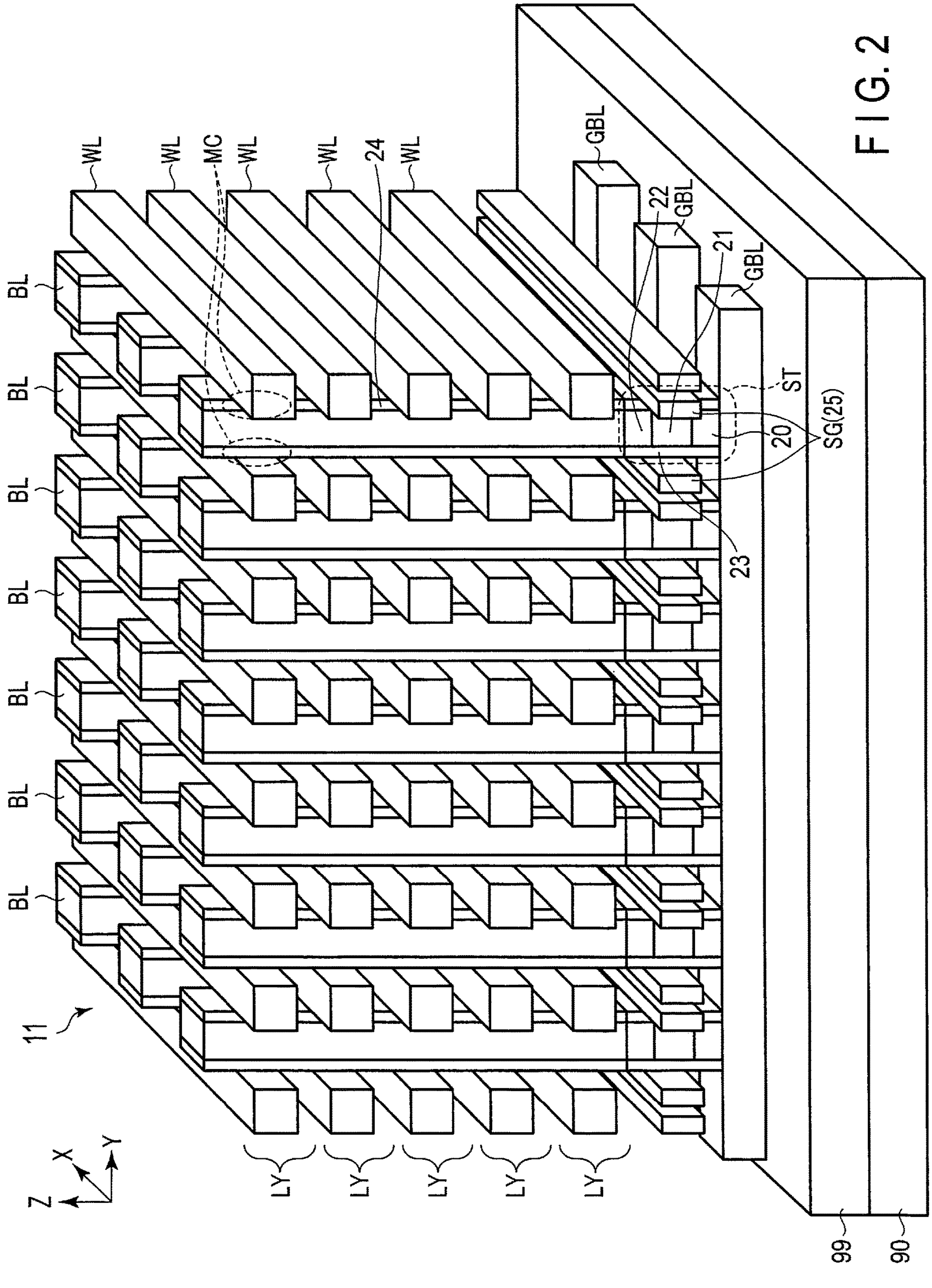
FIG. 2 is a bird's-eye view showing a structure example of the resistance change type memory of the first embodiment.

Resistance change type memories of embodiments will be described with reference to FIGS. 1 to 46.

Hereinafter, embodiments will be described in detail with reference to the drawings. In the following description, structural elements having the same function and configuration will be assigned with the same reference numeral or symbol.

Furthermore, in the following embodiments, when structural elements (such as word lines WL, bit lines BL, and various voltages and signals) assigned with reference numerals or symbols accompanied by a numeral/symbol for distinction need not be distinguished from one another, reference numerals or symbols without the accompanying numeral/symbol are used.

In general, according to one embodiment, a resistance change type memory includes: a semiconductor substrate having a first impurity concentration; a first interconnect extending in a first direction perpendicular to a surface of the semiconductor substrate; a second interconnect including a first semiconductor layer, the first semiconductor layer extending in a second direction parallel to the surface of the semiconductor substrate and having a second impurity concentration lower than the first impurity concentration; a memory layer provided between the first interconnect and the first semiconductor layer; a first transistor including a second semiconductor layer provided between the first interconnect and the semiconductor substrate, and a first gate facing the second semiconductor layer via a first gate insulating film in a third direction parallel to the surface of the semiconductor substrate; and a third interconnect provided between the semiconductor substrate and the second semiconductor layer, and extending in the third direction.

(1) First Embodiment

A configuration, operation (control method), and manufacturing method of the resistance change type memory of the first embodiment will be described with reference to FIGS. 1 to 41.

(a) Configuration Example

A configuration example of the resistance change type memory of the present embodiment will be described with reference to FIGS. 1 to 8.

FIG. 1 is a block diagram showing a configuration example of the resistance change type memory of the present embodiment.

As shown in FIG. 1, the resistance change type memory of the present embodiment includes a memory cell array 11, a word line control circuit 12, a select gate line control circuit 13, a global bit line control circuit 14, a sense amplifier circuit 15, a voltage generation circuit 16, and a control circuit 17.

The memory cell array 11 includes a plurality of memory cells. The memory cell array 11 includes a plurality of word lines (also referred to as row lines or row control lines) WL, a plurality of bit lines (also referred to as local bit lines, column lines, or column control lines), a plurality of select gate lines SG, and a plurality of global bit lines (also referred to as global column lines or global column control lines) GBL.

Each memory cell is coupled to a word line WL and a bit line. Each bit line is coupled to a global bit line GBL via the current path of a select transistor. The gate of the select transistor is coupled to a select gate line SG. Hereinafter, select transistors coupled to a common select gate line (or that select gate line) are also called sheet selectors.

The internal configuration of the memory cell array 11 will be described later.

The word line control circuit 12 controls a plurality of word lines WL. The word line control circuit 12 activates and deactivates a plurality of word lines WL. The word line control circuit 12 controls the potential of each word line WL. The word line control circuit 12 thereby sets a predetermined memory cell in the selected state regarding a row of the memory cell array 11.

For example, the word line control circuit 12 includes a word line driver 121, and a word line decoding circuit.

The select gate line (SG) control circuit 13 controls a plurality of select gate lines SG. The select gate line control circuit 13 controls the potential of each select gate line SG. The select gate line control circuit 13 controls activation and deactivation of a plurality of select gate lines SG, and can thereby electrically couple a predetermined bit line BL to a predetermined global bit line GBL.

The global bit line (GBL) control circuit 14 controls a plurality of global bit lines GBL. The global bit line control circuit 14 controls the potential of each global bit line GBL. The global bit line control circuit 14 controls activation and deactivation of a plurality of global bit lines GBL. The global bit line control circuit 14 can thereby set a predetermined memory cell in the selected state regarding a column of the memory cell array 11.

For example, the global bit line control circuit 14 includes a global bit line decoding circuit and a global bit line driver.

The sense amplifier circuit 15 reads data from the memory cell 11.

For example, in the read operation, an output signal of a memory cell in the selected state is output to a global bit line GBL. The sense amplifier circuit 15 senses the signal on the global bit line GBL, and amplifies the sensed signal. The sense amplifier circuit 15 determines data held by the memory cell based on the obtained signal.

For example, the sense amplifier circuit 15 may include a buffer circuit (buffer function).

The sense amplifier circuit 15 may be driven to control the potentials of global bit lines GBL and bit lines in the write operation.

The voltage generation circuit 16 generates various voltages for the write operation, the read operation and the erase operation on the memory cell array 11. The voltage generation circuit 16 supplies generated various voltages to, for example, the word line control circuit 12, the select gate line control circuit 13, and the global bit line control circuit 14.

The control circuit 17 controls the operations of the other circuits 12 to 16 in accordance with the operation of the resistance change type memory 1. The control circuit 17 includes, for example, a logical control circuit, an I/O circuit (input-output circuit), a decoding circuit, and a register circuit.

The control circuit 17 receives a control signal CNT and an address ADR from a memory controller (not shown). Data DT is transferred between the control circuit 17 and the memory controller.

The control circuit 17 performs an operation on the memory cell array 11 based on the control signal (and command) CNT. The control circuit 17 supplies the address ADR (or a decoding result of the address) to the word line control circuit 12, the select gate line control circuit 13, and the global bit line control circuit 14. Based on the decoding result of the address ADR, the word line control circuit 12, the select gate line control circuit 13, and the global bit line control circuit 14 control activation and deactivation of the word lines WL, select gate lines SG, and global bit lines GBL of the memory cell array 11.

In the write operation, data DT is written in a selected memory cell. In the erase operation, data in a memory cell is erased. In the read operation, data read from a memory cell is transferred to the memory controller.

<Internal Configuration of Memory Cell Array>

FIG. 2 is a bird's-eye view showing an example of the structure of the memory cell array of the resistance change type memory of the present embodiment.

As shown in FIG. 2, in the resistance change type memory of the present embodiment, the memory cell array 11 has a three-dimensional structure.

Each bit line BL extends in a Z direction. The Z direction is perpendicular to the surface of a semiconductor substrate (chip) 90. The bit lines BL which are vertical structures are arranged in a matrix in an X-Y plane of the substrate 90.

Word lines are arranged in Z direction. Each word line WL has a portion extending in an X direction. The X direction is parallel to the surface of the semiconductor substrate 90. An insulating layer (not shown) is provided between word lines WL adjacent to each other in the Z direction.

Each global bit line GBL extends in a Y direction. The Y direction is parallel to the surface of the semiconductor substrate 90. The Y direction crosses the X direction.

A plurality of layers LY are stacked in the Z direction. In each layer LY, a plurality of memory cells MC are aligned in the X direction and the Y direction. The memory cells MC are stacked in the Z direction.

Each bit line BL extends over a plurality of layers LY. In each layer LY, a side surface of the bit line BL faces a side surface of a word line WL.

A memory layer 24 is provided between the bit line BL and the word line WL. For example, the memory layer 24 continuously extends in the Z direction along a side surface of each bit line BL facing word lines WL. A portion of the memory layer 24 interposed between a bit line BL and a word line WL functions as a memory cell MC. For example, the memory cell. MC includes a variable resistance element or a phase change element.

The memory layer 24 includes a resistance change film. For the memory layer 24, for example, a chalcogenide-based material (such as GeSbTe), a transition metal oxide, or a film stack of a semiconductor (such as a-Si), a transition metal oxide, or the like is used. For example, the transition metal compound used for the memory layer 24 is selected from HfO, $TiO_2$, $ZnMn_2O_4$, NiO, $SrZnO_3$, $Pr_{0.7}Ca_{0.3}MnO_3$, and the like. The memory layer 24 may be a single layer film or a multi-layer film.

The resistance value of the resistance change film as the memory layer 24 is reversibly changed by a voltage applied to the film, a current, or heat generated by the voltage/current. The changed resistance value of the resistance change film 24 is substantially maintained until a predetermined voltage/current is applied. The resistance change film 24 may take two or more resistance values. Therefore, the variable resistance value of the memory cell MC is associated with one or more-bit data. Such a property of the resistance change film 24 enables the memory cell MC to substantially nonvolatilely store data DT.

For example, the resistance value of the resistance change film 24 which is made of a resistance change material such as hafnium oxide (HfO) transitions between a resistance value of a low resistance state (LRS) and a resistance value of a high resistance state (HRS). For example, when a voltage of not less than a certain value is applied to the resistance change film in the high resistance state, the state of the resistance change film transitions from the high resistance state to the low resistance state. When a current of not less than a certain value flows in the resistance change film in the low resistance state, the state of the resistance change film transitions from the low resistance state to the high resistance state.

A resistance change film made of a certain resistance change material can perform the transition from the high resistance state to the low resistance state and that from the low resistance state to the high resistance state by application of voltages with different polarities. An element (variable resistance element) made of a resistance change material having such a property is called a bipolar operation element.

Hereinafter, the transition of the resistance change film from the high resistance state to the low resistance state is referred to as SET, and the transition from the low resistance state to the high resistance state is referred to as RESET. Accordingly, the operation to cause the state of the resistance change film to transition from the high resistance state to the low resistance state is called a SET operation, and the operation to cause the state of the resistance change film to transition from the low resistance state to the high resistance state is called a RESET operation. In addition, the low resistance state of the memory cell MC (resistance change film 24) is called a SET state, and the high resistance state of the memory cell MC is called a RESET state.

In a memory area MA, a plurality of select transistors ST are provided below the memory cells MC (closer to the semiconductor substrate than the memory cells MC). A plurality of select transistors ST are two-dimensionally arranged above the semiconductor substrate 90. Each select transistor ST is provided between a bit line BL and a global bit line GBL.

The select transistor ST is a vertical thin film transistor (TFT). The current path of the select transistor ST extends perpendicularly to the surface of the semiconductor substrate 90 (in the Z direction).

The select transistor ST includes a columnar semiconductor layer (body portion; channel region) 21. Two source/drain layers (first and second terminals) 20 and 22 of the select transistor ST are aligned in the Z direction with the semiconductor layer 21 interposed therebetween. One source/drain layer 20 is provided between the global bit line GBL and the semiconductor layer 21. The other source/drain layer 22 is provided between the semiconductor layer 21 and the bit line BL. Source/drain layer 20 of the select transistor ST is coupled to the global bit line GBL. Source/drain layer 22 of the select transistor ST is coupled to the bit line BL.

For example, the semiconductor layer 21 includes an n-type or p-type dopant (impurity). The source/drain layers 20 and 22 are each a semiconductor layer (diffusion layer; doped semiconductor layer) having a higher dopant concentration (a concentration of an impurity serving as an acceptor or a donor for a semiconductor) than semiconductor layer 21.

The current paths 20, 21, and 22 of the select transistor ST are independent between bit lines BL. The select transistors ST are in one-to-one correspondence with the bit lines BL.

For example, the gate structure of the select transistor ST has a double-gate structure. A conductive layer SG faces a side surface of the semiconductor layer 21 in the Y direction via a gate insulating film 23. The conductive layer SG is a gate electrode of the select transistor ST. The gate electrode SG of the select transistor ST extends in the X direction. A plurality of select transistors ST aligned in the X direction share the gate electrode SG extending in the X direction. Therefore, the gate electrode SG is used as the select gate line SG. For example, two conductive layers SG interposing one semiconductor layer 21 therebetween function as a single select gate line SG.

Two select transistors ST adjacent to each other in the Y direction are coupled to different select gate lines SG.

An insulating film (not shown) is provided between two conductive layers (select gate lines) SG adjacent to each other in the Y direction of two select transistors ST adjacent to each other in the Y direction.

In the present embodiment, when an operation on a memory cell is performed based on the operating principles of the resistance change type memory of the present embodiment to be described later, various interconnects and elements may be provided in an end region of the memory cell array/memory area with respect to the X direction or Y direction. In addition, for example, a dummy element may be provided in a certain region (hereinafter referred to as a dummy area) in the memory cell array. The structure of the dummy area is substantially the same as that of the memory area MA. However, the memory cells (dummy cells) in the dummy area are not used as data storage elements.

For example, one memory area MA includes, for example, k global bit lines GBL, and p layers LY. One layer LY in one memory area MA includes two word lines WL.

Hereinafter, the memory area MA is also referred to as a block.

<Configuration Example of Memory Cell Array>

The internal configuration of the memory cell array in the resistance change type memory of the present embodiment will be described with reference to FIGS. 3 to 7.

A plurality of word lines WL of the memory cell array 11 are selected and driven by the word line driver 121.

Figure 3:
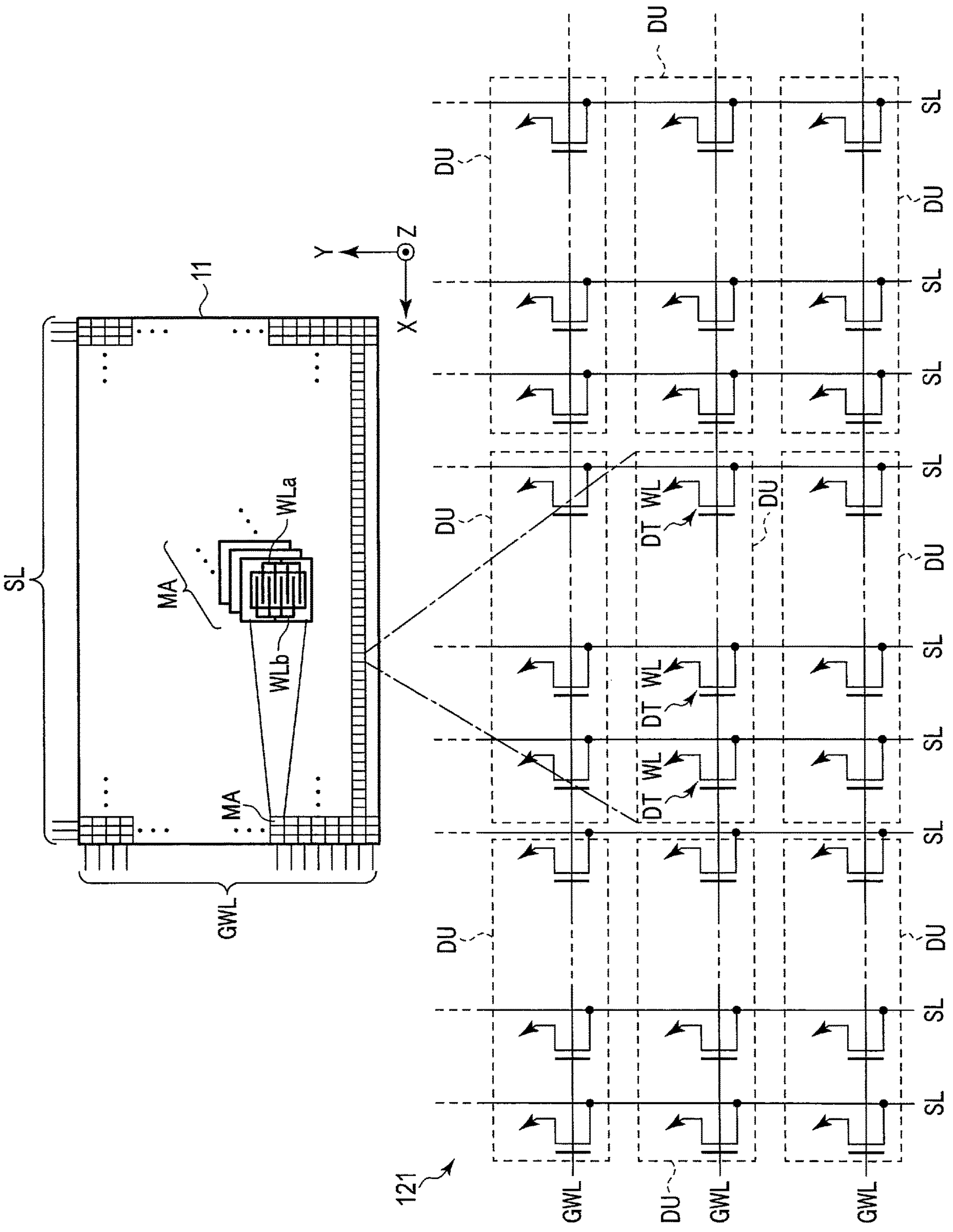
FIG. 3 is a diagram showing a configuration example of the resistance change type memory of the first embodiment.

FIG. 3 is a diagram showing an example of the configuration of the word line driver.

As shown in FIG. 3, the word line driver 121 includes a plurality of transistors DT, a plurality of global word lines GWL, and a plurality of source lines SL.

A plurality of transistors (hereinafter also referred to as driver transistors) DT are arranged in an array in the circuit region of the word line driver 121. The transistors DT are in one-to-one correspondence with the word lines WL in the memory cell array 11. Each transistor DT transfers, to the corresponding word line WL, a voltage corresponding to an operation to be executed.

The gate of the transistor DT is coupled to a global word line GWL. One end of the current path of the transistor is coupled to the corresponding word line WL. The other end of the current path of the transistor is coupled to a source line SL.

Hereinafter, a group DU of a plurality of driver transistors DT allocated to one block MA is called a driver unit DU.

The global word line GWL is a control line for a plurality of transistors DT associated with the block MA.

The gates of a plurality of transistors DT are coupled in common to one global word line GWL. For example, a global word line GWL is coupled to the gates of a plurality of transistors aligned in the X direction over a plurality of blocks MA (a plurality of driver units DU).

The source line SL is a power line of the word line driver 121.

A plurality of transistors DT aligned in the Y direction are coupled in common to the source line SL. For example, the line length of the source line SL is shorter than that of the global word line GWL. The parasitic capacitance of the source line SL is smaller than that of the global word line GWL.

In the memory cell array 11, N blocks MA are aligned in the X direction, and M blocks MA are aligned in the Y direction. For example, a plurality of global bit lines GBL are aligned in the X direction. Each global bit line GBL extends in the Y direction.

Each of a plurality of global word lines GWL is associated with a plurality of blocks aligned in the X direction of a plurality of blocks MA two-dimensionally arranged. Each of a plurality of source lines SL is associated with a plurality of blocks MA aligned in the Y direction of the plurality of blocks MA two-dimensionally arranged.

A plurality of blocks MA aligned in the X direction can be selected in common by one global word line GWL, and a plurality of blocks MA aligned in the Y direction can be selected in common by one source line SL.

One block (and one word line WL) is selected by selecting one global word line GWL and one source line SL.

Accordingly, a block MA can be selected by two-dimensional decoding based on a global word line GWL and a source line SL.

As a result, the resistance change type memory of the present application can speed up access to a block MA by decoding based on a global word line GWL and a source line SL.

An example of the structure of the resistance change type memory of the present embodiment will be described with reference to FIGS. 4 to 6.

FIG. 4 is a top view for explaining a structure example of the memory cell array in the resistance change type memory of the present embodiment. In FIG. 4, a part of one layer of the memory cell array is extracted and illustrated. FIGS. 5 and 6 are cross-sectional views for explaining a structure example of the memory cell array in the resistance change type memory of the present embodiment. FIG. 5 is a cross-sectional view taken along the Y direction of the memory cell array (block). FIG. 6 is a cross-sectional view taken along the X direction of the memory cell array (block).

As shown in FIGS. 4 to 6, global bit lines GBL extend in the Y direction. A plurality of global bit lines GBL are aligned in the X direction.

Bit lines BL extending in the Z direction are provided above each global bit line GBL via select transistors ST. A plurality of bit lines are aligned in the Y direction above one global bit line. A plurality of bit lines BL are also aligned in the X direction. A plurality of bit lines BL aligned in the X direction are coupled respectively to different global bit lines GBL.

Each bit line BL is formed by a metal layer or a conductive compound layer.

In one layer LY of the block MA, two word lines WLa and WLb are provided. In the layer LY, word line WLa is separate from word line WLb.

Each word line WL (WLa, WLb) is a layer having a comb-like planar shape.

The comb teeth portions (hereinafter referred to as fingers) 50 (50*a*, 50*b*) of the comb-shaped word line WL extend in the X direction.

A plurality of fingers 50 are coupled to the shaft portion (hereinafter referred to as a shaft portion or a base portion) 55 (55*a*, 55*b*) of the comb-shaped layer. The shaft portion 55 extends in the Y direction.

The finger 50*a* of word line WLa is provided between two fingers 50*b* of word line WLb. The shaft portion 55*a* of word line WLa is provided on one end of the block MA with respect to the X direction. The shaft portion 55*b* of word line WLb is provided on the other end of the block MA with respect to the X direction.

Each finger 50 is provided between two bit lines BL aligned in the Y direction. The finger 50 faces side surfaces of the bit lines BL in the Y direction. A resistance change film (memory layer) 24 is provided between the finger 50 and each of the bit lines BL.

In each word line WL, the finger 50 includes a lightly-doped (low-doped) semiconductor layer (or intrinsic semiconductor layer) 50. In each word line WL, the shaft portion 55 includes a conductive compound layer (such as a silicide layer).

As described above, in one example, selection/deselection (activation/deactivation) of word lines WL is controlled by global word lines GWL and source lines.

A select gate line SG and a finger 50 are arranged one above the other in the Z direction. Two conductive layers 59 as the select gate line SG are provided below one finger 50. The two conductive layers 59 below one finger 50 are select gate lines SG corresponding respectively to different addresses.

For example, the memory cell array 11 is provided above the semiconductor substrate 90 via interlayer insulating films 98 and 99.

A plurality of transistors TR of a CMOS circuit are provided on the semiconductor substrate 90. The CMOS circuit is a group of circuits that control the operation of the resistance change type memory, like the above-described word line driver 121.

Each transistor TR is provided on a well region 900 of the semiconductor substrate 90. The transistor TR includes two source/drain layers (diffusion layers) 80. The source/drain layers 80 are provided in the well region 900. The region between the two source/drain layers 80 is a channel region of the transistor TR. The gate electrode 81 of the transistor TR is provided above the channel region via a gate insulating film.

Interconnect 92A is coupled to each source/drain layer 80 via contact plug 91A. Interconnect 92B is coupled to each gate electrode 81 via contact plug 91B.

The type of dopant (impurity) added to the well region 900 and the source/drain layers 80 is determined in accordance with whether the conductivity type of the transistor TR is the p-type or the n-type.

Figure 7:
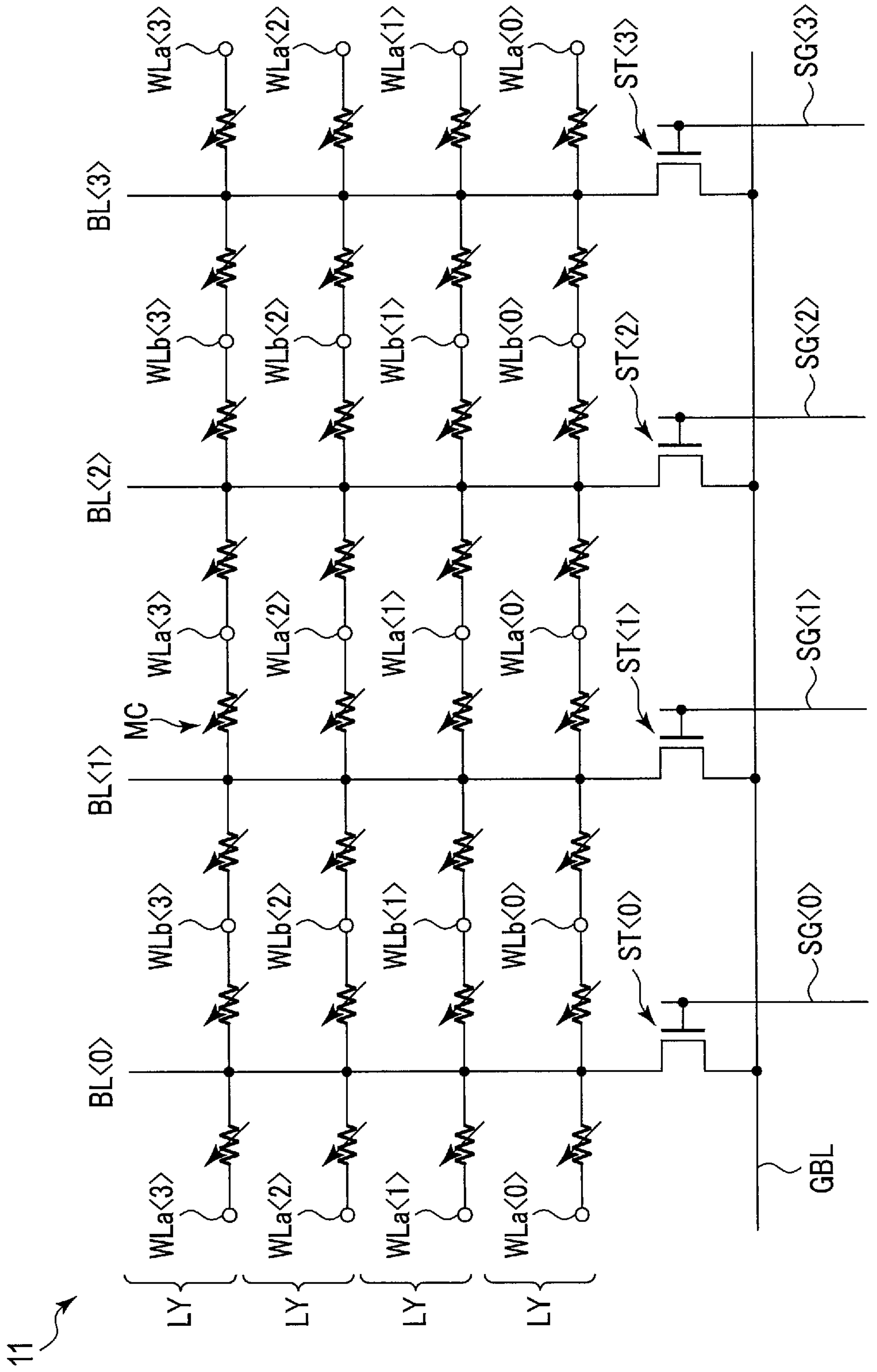
FIG. 7 is a diagram showing an example of the circuit configuration of the resistance change type memory of the first embodiment.

FIG. 7 is an equivalent circuit diagram of the memory cell array in the resistance change type memory of the present embodiment. In FIG. 7, regarding a plurality of bit lines coupled to one global bit line GBL, four layers LY in the memory cell array 11 are extracted and illustrated.

A plurality of word lines WLa (WLa<0>, WLa<1>, WLa<2>, WLa<3>) and a plurality of word lines WLb (WLb<0>, WLb<1>, WLb<2>, WLb<3>) are provided in each layer LY of the memory cell array 11 (such as a control unit CMB).

A plurality of word lines WLa in respective layers LY are electrically separate between layers. A plurality of word lines WLb in respective layers LY are electrically separate between layers. In each layer LY, word line WLa (for example, word line WLa<3>) is electrically separate from word line WLb (for example, word line WLb<3>).

The bit lines BL (BL<0>, BL<1>, BL<2>, and BL<3>) extend over a plurality of layers LY.

One end of the memory cell MC is coupled to one word line WL (WLa, WLb), and the other end of the memory cell MC is coupled to one bit line BL.

Of a plurality of memory cells (such as variable resistance elements) MC in the same layer LY, two memory cells MC coupled to the same bit line BL are coupled to different word lines WLa and WLb, respectively.

In each layer LY, a plurality of memory cells MC coupled to the same word line WLa (or the same word line WLb) are coupled to different bit lines BL, respectively.

A plurality of bit lines BL are each coupled to one end of the current path of the corresponding select transistor ST (ST<0>, ST<1>, ST<2>, ST<3>). The other end of the current path of the select transistor ST is coupled to the global bit line GBL.

The gates of select transistors ST are coupled to different select gate lines SG (SG<0>, SG<1>, SG<2>, and SG<3>), respectively.

Bit line BL<0> is coupled to the global bit line GBL via the current path of select transistor ST<0>. The gate of select transistor ST<0> is coupled to select gate line SG<0>.

Bit line BL<1> is coupled to the global bit line GBL via the current path of select transistor ST<1>.

A plurality of circuits of FIG. 7 are aligned in the X direction (and the Y direction) while sharing word lines, a global bit line, and select gate lines, thereby forming the block MA and the memory cell array 11.

FIG. 8 is a top view showing an example of the specific structure of the memory cell array.

In the same layer LY in the memory cell array 11, a plurality of corresponding word lines WL of different blocks MA are coupled to one another.

For example, interconnect (hookup interconnect) 59 is coupled to the shaft portions of word lines WL. Corresponding word lines WL are coupled to each other by this interconnect 59. Interconnect 59 includes a conductive compound layer (for example, silicide).

A plurality of word lines WL coupled to one another constitute one group.

Interconnect GBL-i is provided at an end of the block MA. Interconnect GBL-i is provided in the same layer (at the same height from the surface of the semiconductor substrate) as the global bit line GBL.

The dimension (interconnect width) W2 of interconnect GBL-i in the X direction is larger than the dimension W1 of the global bit line GBL in the X direction.

This interconnect GBL-i may be supplementarily used to supply a desired current/voltage to an operation target memory cell (hereinafter referred to as a selected cell) in the operation of the resistance change type memory (such as ReRAM) of the present embodiment to be described later.

Hereinafter, interconnect GBL-i is also called an array-end global bit line (or assist line) GBL-i.

For example, the array-end global bit line GBL-i is provided on the both ends of the block MA with respect to the X direction. This may streamline the operations on the memory cell based on the operating principles to be described later. The array-end global bit line GBL-i may be provided on only one end (or the other end) of one block MA with respect to the X direction.

For example, a contact (plug) 70 is provided in an area between word lines (between shaft portions) adjacent to each other in the X direction. One or more contacts 70 are each coupled to the corresponding shaft portion 55. Hereinafter, the area where the contact 70 is provided is called a hookup area (or connection area). The hookup area HA is surrounded by the shaft portion 55 and interconnect 59 on the X-Y plane. The hookup area HA is adjacent to the block (memory area) MA in a direction parallel to the surface of the semiconductor substrate 90.

FIG. 9 is a top view showing a modification of the structure of the memory cell array of FIG. 8.

As shown in FIG. 9, the contact 70 may be provided in the area between the tip of the finger 50 and the shaft portion 55.

In FIG. 9, instead of providing interconnect 59, the comb-shaped word line WL may have a structure in which two shaft portions 55 adjacent to each other in the X direction are integrated. In FIG. 9, interconnect GBL-i may be provided at only one end of one block with respect to the X direction.

As shown in FIGS. 4 to 6, at least a portion (the entire finger 50 or a part of the finger 50) of a word line WL which faces a bit line BL in the Y direction includes a lightly-doped semiconductor layer (or intrinsic semiconductor layer). The resistance change film 24 is provided between the lightly-doped semiconductor layer 50 and the bit line (conductor) BL. The lightly-doped semiconductor layer 50 is, for example, in direct contact with the resistance change film 24.

In the present embodiment, the lightly-doped semiconductor layer used for the finger 50 is a semiconductor layer with a dopant concentration close to that of the intrinsic semiconductor. The dopant concentration of the lightly-doped semiconductor layer 50 is, for example, in the range from $1\times10^{16}$ $cm^{-3}$ to $9\times10^{17}$ $cm^{-3}$. The lightly-doped semiconductor layer 50 is, for example, an $n^-$-type semiconductor layer.

The semiconductor used for the finger 50 is selected from among silicon (Si), silicon-germanium (SiGe), and germanium (Ge). When the finger 50 is a silicon layer, the finger 50 includes phosphorus (P) or arsenic (As) as a dopant (n-type dopant).

Like the shaft portion 55 of the word line WL, a portion of the word line WL which does not face the bit line BL in the Y direction (portion not in contact with the resistance change film) may be made of a material other than the intrinsic semiconductor. The shaft portion 55 is selected from among a highly-doped semiconductor layer, a conductive silicon compound layer (silicide layer), or a conductive layer (conductor) made of a metal or the like. For example, an $n^+$-type silicon layer in which phosphorus (P) or arsenic (As) is doped in a high concentration is used for the shaft portion 55 as a highly-doped semiconductor layer. For example, the dopant concentration of the highly-doped semiconductor layer is $1\times10^{19}$ $cm^{-3}$ or higher. The semiconductor used for the shaft portion 55 is selected from among silicon, silicon-germanium, and germanium.

The portion of the finger 50 not in contact with the resistance change film 24 may be a highly-doped semiconductor layer. Namely, the entire finger 50 need not be an intrinsic semiconductor or a lightly-doped semiconductor.

The dopant concentration of the finger (lightly-doped semiconductor layer or intrinsic semiconductor layer) 50 of the word line WL is lower than the dopant concentration of the semiconductor layer (channel region) 21 of the select transistor ST. The dopant concentration of the lightly-doped semiconductor layer 50 of the word line WL is lower than the dopant concentration of the semiconductor substrate 90. For example, the dopant concentration of semiconductor layer 21 is of the order of $1\times10^{18}$ $cm^{-3}$ to $5\times10^{18}$ $cm^{-3}$. The dopant concentration of the semiconductor substrate 90 is of the order of $1\times10^{18}$ $cm^{-3}$ to $5\times10^{18}$ $cm^{-3}$.

In the resistance change type memory of the present embodiment, a schottky junction is formed between the conductive layer as a bit line and the lightly-doped semiconductor layer (or intrinsic semiconductor layer) as a word line (finger). In the present embodiment, a current that flows between the word line and the bit line is controlled in accordance with the bias state of the schottky junction.

Accordingly, the resistance change type memory of the present embodiment can reduce current consumption.

(b) Operating Principles

The operating principles of the resistance change type memory of the present embodiment will be described with reference to FIGS. 10 to 13.

Figure 10:
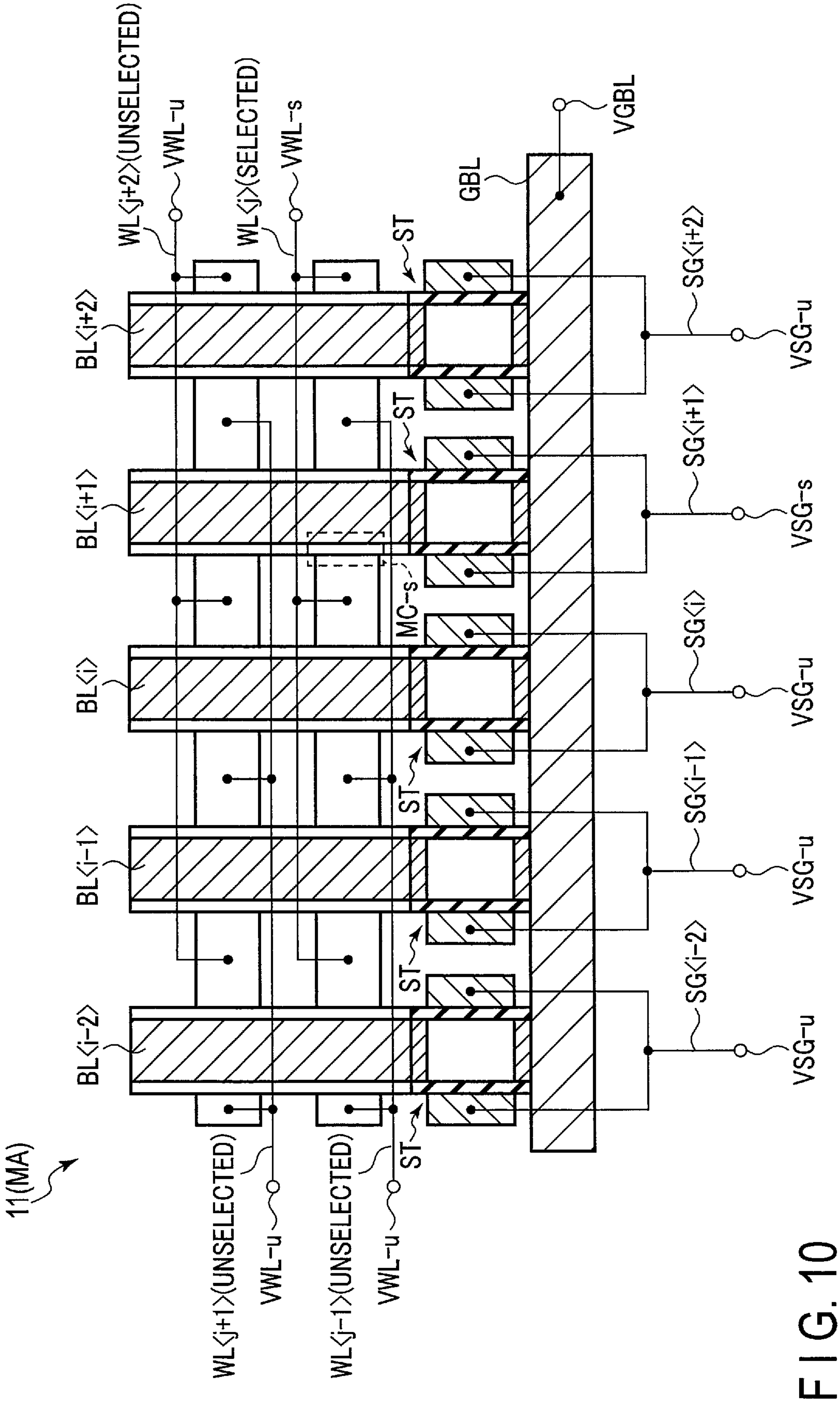

FIG. 10 is a diagram for explaining the state of each interconnect in the operation of the resistance change type memory of the present embodiment. In FIG. 10, word lines in two layers of the memory cell array are extracted and illustrated.

As shown in FIG. 10, of a plurality of word lines WL of a plurality of layers in the block MA (memory cell array 11), one word line WL<j> corresponding to a selected address is selected (activated) as a selected word line. The one or more word lines WL<j−1>, WL<j+1>, and WL<j+2> other than the selected word line are set (deactivated) as unselected word lines.

Hereinafter, the selected word line will be accompanied by symbol "WL-s". The unselected word line will be accompanied by symbol "WL-u".

Select voltage VWL-s is applied to the selected word line WL-s, and unselect voltage VWL-u is applied to the unselected word line WL-u.

Of a plurality of global bit lines GBL in the block MA, one or more global bit lines corresponding to the selected address are selected as selected global bit lines. The one or more global bit lines other than the selected global bit lines are set as unselected global bit lines.

Hereinafter, the selected global bit line will be accompanied by symbol "GBL-s". The unselected global bit line will be accompanied by symbol "GBL-u". Select voltage VGBL-s is applied to the selected global bit line GBL-s, and unselect voltage VGBL-u is applied to the unselected global bit line GBL-u.

Of a plurality of select gate lines SG in the block MA, one select gate line SG<i+1> corresponding to the selected address is selected as a selected select gate line. The select gate lines SG<i−2>, SG<i−1>, SG<i>, and SG<i+2> other than the selected select gate line are set as unselected select gate lines.

Hereinafter, the selected select gate line will be accompanied by symbol "SG-s". The unselected select gate line will be accompanied by symbol "SG-u".

Select voltage VSG-s is applied to the selected select gate line SG-s, and unselect voltage VSG-u is applied to the unselected select gate line SG-u.

The bit line (local bit line) coupled to the selected global bit line GBL-s via a select transistor in the ON state is the selected bit line.

Accordingly, a voltage corresponding to the operation to be performed is applied to the selected cell MC-s.

The aforementioned array-end global bit line at an end of the memory cell array (block) will be accompanied by symbol "GBL-i". The selected global word line will be accompanied by symbol "GWL-s". The unselected global word line will be accompanied by symbol "GWL-u".

In the present embodiment, when the resistance change type memory operates, various voltages (select voltage and unselect voltage) corresponding to operations are applied to the above-described lines in the selected state and the unselected state.

In accordance with the operation on the selected cell MC-s, an offset voltage may be added to various voltages for desired operations. Voltages including the offset voltage are applied to interconnects (such as unselected global bit lines and/or unselected word lines) in the block MA as a select voltage or an unselect voltage.

Hereinafter, the bias condition (state) for setting the resistance change film in the SET state is called a SET bias condition. The bias condition for setting the resistance change film in the RESET state is called a RESET bias condition.

The bias condition for reading data from the memory cell is called a read bias condition.

In the present embodiment, the operation (RESET operation) to change the resistance state of the resistance change film from the low resistance state to the high resistance state is called a write operation. The operation (SET operation) to change the resistance state of the resistance change film from the high resistance state to the low resistance state is called an erase operation.

In the resistance change type memory of the present embodiment, the resistance change film (memory layer) 24 is interposed between the metal (bit line BL) and the lightly-doped semiconductor layer (finger 50 of the word line WL). The metal BL and the lightly-doped semiconductor layer 50 form a schottky junction via the resistance change film.

In the resistance change type memory of the present embodiment, the lightly-doped semiconductor layer (finger) in a word line with no carrier supply maintains the high resistance state. Therefore, in the present embodiment, the current (hereinafter also referred to as an unselect cell current) that flows in the memory cell between the bit line BL and the finger 50 in the high resistance state can be greatly reduced in comparison to the current that flows in the memory cell having the structure in which the resistance change film is interposed between two conductors.

Based on the following operating principles, various operations of the resistance change type memory are performed on the selected memory cell.

In the resistance change type memory of the present embodiment, when a desired operation is performed on the selected cell, carriers sufficient to perform the desired operation are supplied to the lightly-doped semiconductor layer, and the effective electrical resistance of the word line (finger) is reduced.

In FIGS. 11 to 13, only one array-end global bit line GBL-i is extracted and illustrated for clarification of explanation.

<RESET Bias Condition>

FIG. 11 is a schematic diagram for explaining the operating state of a memory cell in a layer under the RESET bias condition of the resistance change type memory of the present embodiment.

In the present embodiment, the potential of the word line and the potential of the bit line are controlled so that the schottky junction is placed in a forward-biased state under the RESET bias condition.

As shown in FIG. 11, select voltage VWLw-s is applied to the selected word line WL-s. Unselect voltage VWLw-u is applied to the unselected word line WL-u.

The voltage value of the voltage VWLw-s of the selected word line under the RESET bias condition is smaller than the voltage value of the voltage VWLw-u of the unselected word line.

Select voltage VGBLw-s is applied to the selected global bit line GBL-s. Unselect voltage VGBLw-u is applied to the unselected global bit line GBL-u.

The voltage value of the voltage VGBLw-s of the selected global bit line GBL is larger than the voltage value of the voltage VGBLw-u of the unselected global bit line GBL. For example, the voltage value of the voltage VGBLw-s of the selected global bit line GBL is larger than the voltage value of the voltage VWLw-s of the selected word line. The voltage value of the voltage VGBLw-u of the unselected global bit line GBL is larger than the voltage value of the voltage VWLw-s of the selected word line. The voltage value of the voltage VGBLw-u of the unselected global bit line GBL is substantially the same as the voltage value of the voltage VWLw-u of the unselected word line.

Select voltage VSGw-s is applied to the selected select gate line SG-s. Unselect voltage VSGw-u is applied to the unselected select gate line SG-u.

Select voltage VSGw-s has a voltage value equal to or larger than the ON voltage (threshold voltage) of the select transistor ST. Unselect voltage VSGw-u has a voltage value (for example, 0V) smaller than the ON voltage (threshold voltage) of the select transistor ST.

Consequently, a plurality of select transistors (sheet selector) ST coupled to the selected select gate line SG-s are set in the ON state. The select transistors ST coupled to the unselected select gate line SG-u are set in the OFF state.

A plurality of fingers of the selected word line WL are set in the selected state or in the unselected state in accordance with ON/OFF of the select transistor ST. Hereinafter, of a plurality of fingers of the selected word line, a finger coupled to the global bit line GBL by the select transistor in the ON state is called a selected finger, and a finger electrically separate from the global bit line GBL by a select transistor in the OFF state is called an unselected finger.

The select transistor ST in the OFF state electrically isolates the bit line BL from the global bit line GBL. Consequently, the bit line (and memory cell) corresponding to the select transistor ST in the OFF state is set in an electrically-floating state FLT.

The select transistor ST in the ON state electrically couples the bit line BL to the corresponding global bit line GBL.

The voltages VGBLw-s and VGBLw-u of the global bit line GBL are applied to the corresponding bit line (local bit line) BL via the select transistor ST in the ON state. Select voltage VGBLw-s and unselect voltage VGBLw-u are applied to the corresponding bit line BL via the select transistor ST in the ON state.

The potential VWLw-s of the selected word line WL-s is lower than the potential VGBLw-s of the selected global bit line GBL-s and the potential VGBLw-u of the unselected global bit line GBL-u.

Therefore, the schottky junction between the selected finger 50 of the selected word line WL-s and each of a plurality of bit lines BL is placed in the forward-biased state.

Carriers (holes) CF are supplied from all the bit lines BL coupled to the select transistors ST in the ON state to the selected finger (lightly-doped semiconductor layer) 50 of the selected word line WL-s.

Consequently, carriers CF from the selected global bit line GBL-s are diffused in the selected finger 50 of the selected word line WL-s. As a result, the resistance of the selected finger 50 filled with carriers in the selected word line WL-s is effectively lowered.

The current supplied from the bit line BL in the floating state FLT to the unselected finger (unselected cell coupled between the bit line in the floating state FLT and the selected word line) 50 is very small. Therefore, without supply of carriers, the unselected finger 50 maintains the high resistance state.

In the word line in the unselected state, even if a bit line BL is set in the selected state by the select transistor in the ON state, the potential difference between the unselected word line WL-u and the selected bit line BL-s is smaller than the RESET voltage. Therefore, in the unselected cell (hereinafter also referred to as a half-selected cell) coupled between the unselected word line WL-u and the selected bit line BL-s, the state of the resistance change film does not change.

The potential difference applied to the unselected cell (half-selected cell) coupled between the selected word line WL-s and the unselected bit line BL (unselected global bit line GBL-u) is smaller than the RESET voltage. Therefore, the state of the resistance change film in the half-selected cell does not substantially change.

Accordingly, the resistance change type memory of the present embodiment can lower the effective electrical resistance of the lightly-doped semiconductor layer (or intrinsic semiconductor) 50 in the word line WL by supplying carriers from the schottky junction in the forward-biased state to the selected finger.

Under the RESET bias condition, a desired current (or voltage) is thereby supplied to the selected cell MC-s.

Therefore, in the resistance change type memory of the present embodiment, the resistance change film 24 of the selected cell MC-s can be set in the reset state under the RESET bias condition.

Regarding the unselected cell, the current (the amount of supplied carriers) between the word line and the bit line (global bit line) is small. Therefore, the unselected finger of the selected word line and the unselected word line maintain a high resistance value.

Therefore, the present embodiment reduces the current that flows in the unselected cell under the RESET bias condition.

<SET Bias Condition>

FIG. 12 is a schematic diagram for explaining the operating state of the memory cell in a layer under the SET bias condition of the resistance change type memory of the present embodiment.

As shown in FIG. 12, select voltage VWLe-s is applied to the selected word line WL-s under the SET bias condition. Unselect voltage VWLe-u is applied to the unselected word line WL-u.

The voltage value of the voltage VWLe-s of the selected word line is larger than the voltage value of voltage VWLe-u of the unselected word line.

Select voltage VGBLe-s is applied to the selected global bit line GBL-s. Unselect voltage VGBLe-u is applied to the unselected global bit line GBL-u.

The voltage value of the voltage VGBLe-s of the selected global bit line GBL-s is smaller than the voltage value of the voltage VGBLe-u of the unselected global bit line GBL-u. The voltage value of the voltage VGBLe-s of the selected global bit line is smaller than the voltage value of the voltage VWLe-s of the selected word line WL-s. The voltage value of the voltage VGBLe-u of the unselected global bit line GBL-u is smaller than the voltage value of the voltage VWLe-s of the selected word line. For example, the voltage value of the voltage VGBLe-u of the unselected global bit line GBL-u is substantially the same as the voltage value of the voltage VWLe-u of the unselected word line WL-u.

Select voltage VSGe-s is applied to the selected select gate line SG-s. Consequently, a plurality of select transistors ST coupled to the selected select gate line SG-s are set in the ON state. Unselect voltage VSGe-u is applied to the unselected select gate line SG-u. A plurality of select transistors ST coupled to the unselected select gate line SG-u are set in the OFF state.

The bit lines (and memory cells) corresponding to the select transistors ST in the OFF state are set in an electrically-floating state FLT.

The schottky junction between the selected finger 50 of the selected word line WL-s and the metal layer of the selected bit line BL-s is placed in the reverse-biased state.

In the present embodiment, when the selected cell MC-s is under the SET bias condition, voltage VGBLe-i which is higher than voltage VGBLe-s is applied to the array-end global bit line GBL-i. Voltage VGBLe-i is higher than voltage VWLe-s.

Voltage VGBL-i from the array-end global bit line GBL-i places the schottky junction between the bit line BL-i coupled to the array-end global bit line GBL-i and the selected finger (lightly-doped semiconductor layer) 50 in the forward-biased state.

Consequently, carriers (holes) are injected from the schottky junction coupled to the array-end global bit line GBL-i into the finger 50. The carriers are diffused in the lightly-doped semiconductor layer 50 which is the finger 50.

The carriers CF diffused from the schottky junction in the forward-biased state cause conductivity modulation (bipolar action) in another schottky junction adjacent in the extending direction of the finger 50. In response to the conductivity modulation BA, the selected cell MC-s supplies carriers CF to the selected finger 50.

The conductivity modulation BA caused in the schottky junction is sequentially propagated to other adjacent schottky junctions (memory cells).

Accordingly, in the selected finger of the selected word line WL-s, the lightly-doped semiconductor layer 50 is placed in the low resistance state by diffusion of carriers CF.

The current that flows between the unselected finger and each bit line BL is very small. Therefore, the unselected finger maintains the high resistance state.

The potential difference applied to the half-selected cell between the selected word line WL-s and each unselected bit line is smaller than the SET voltage. Furthermore, the potential difference applied to the half-selected cell between the selected bit line BL-s and the unselected word line WL-u is smaller than the SET voltage. Therefore, a SET operation (or RESET operation) on the unselected cell is not performed.

The memory cell coupled to the array-end global bit line GBL-i is a dummy cell. Therefore, even when the voltage VGBL-i of the array-end global bit line GBL-i is higher than select or unselect voltage VGBLe-s, VGBLe-u, an error in data in the memory cell array 11 or a malfunction of the memory does not occur.

Accordingly, the resistance change type memory of the present embodiment can lower the effective electrical resistance of the lightly-doped semiconductor layer (or intrinsic semiconductor) 50 in the selected finger in the word line WL by conductivity modulation (bipolar action) of the schottky junction in the reverse-biased state caused by supply of carriers from the array-end global bit line.

Under the SET bias condition, a desired current (or voltage) is thereby supplied to the memory cell.

Therefore, in the resistance change type memory of the present embodiment, the resistance change film of the memory cell can be set in the SET state under the SET bias condition.

Regarding the unselected cell, the current that flows between the word line and the bit line is small. Therefore, the unselected finger of the selected word line and the unselected word line maintain a high resistance value. Therefore, the present embodiment reduces the current that flows in the unselected cell under the SET bias condition.

<Read Bias Condition>

FIG. 13 is a schematic diagram for explaining the operating state of a memory cell in a layer under the read bias condition of the resistance change type memory of the present embodiment.

As shown in FIG. 13, a predetermined potential is applied to a word line WL and a bit line BL so that the schottky junction between the lightly-doped semiconductor layer 50 of the word line WL and the conductive layer of the bit line BL is in the forward-biased state.

Select voltage VWLr-s is applied to the selected word line WL-s. Unselect voltage VWLr-u is applied to the unselected word line WL-u. The voltage value of the voltage VWLr-s of the selected word line is smaller than the voltage value of the voltage VWLr-u of the unselected word line.

Select voltage VGBLr-s is applied to each of one or more selected global bit lines GBL-s. For example, unselect voltage VGBLr-u is applied to the unselected global bit line GBL-u and the array-end global bit line GBL-i.

For example, the voltage value of the voltage VGBLr-s of the selected global bit line GBL-s is substantially the same as the voltage value of the voltage VGBLr-u of the unselected global bit line GBL-u. The voltage value of the voltage VGBLr-s of the selected global bit line GBL-s is larger than the voltage value of the voltage VWLr-s of the selected word line WL-s. The voltage value of voltage VGBLr-u of the unselected global bit line GBL-u is substantially the same as the voltage value of the voltage VWLr-u of the unselected word line WL-u. The voltage value of voltage VGBLr-s may be different from the voltage value of voltage VGBLr-u.

Select voltage VSGr-s is applied to the selected select gate line SG-s. Consequently, a plurality of select transistors ST coupled to the selected select gate line SG-s are set in the ON state. Unselect voltage VSGr-u is applied to the unselected select gate line SG-u. A plurality of select transistors ST coupled to the unselected select gate line SG-u are set in the OFF state.

The bit lines (and memory cells) corresponding to the select transistors ST in the OFF state are set in the floating state FLT.

Under the read bias condition, the schottky junction between the selected finger 50 and the bit line BL is placed in the forward-biased state, as under the RESET bias condition.

However, the potential difference between the finger 50 and the bit line BL is smaller than the RESET voltage (and SET voltage). Therefore, even if a forward-biased voltage is applied to the schottky junction, the resistance state of the resistance change film 24 does not change.

Under the read bias condition, carriers CF are supplied to the lightly-doped semiconductor layer 50, which is the selected finger, by the schottky junction being in the forward-biased condition, as under the RESET bias condition.

The supply and diffusion of carriers in the lightly-doped semiconductor layer 50 lowers the effective resistance value of the selected finger 50.

Accordingly, the resistance change type memory of the present embodiment can lower the effective electrical resistance of the lightly-doped semiconductor layer (or intrinsic semiconductor) 50 in the word line WL under the read bias condition. Consequently, a desired current (or voltage) is supplied to the memory cell under the read bias condition.

Therefore, in the resistance change type memory of the present embodiment, a read current can be supplied to the memory cell under the read bias condition.

Under the read bias condition, the unselected word line and the unselected finger maintain the high resistance state, as under the above-described RESET and SET bias conditions.

Accordingly, the power consumption at the unselected cell can be suppressed.

As described above, the schottky junction provided between the word line WL and the bit line BL can control the current supplied to the memory cell (voltage applied to the memory cell).

Based on the operating principles explained with reference to FIGS. 11 to 13, the resistance change type memory of the present embodiment performs the write operation, the erase operation, and the read operation.

(c) Operation Example

An operation example of the resistance change type memory of the present embodiment will be described with reference to FIGS. 14 to 19.

In the present embodiment, the RESET operation of the memory cell (resistance change film) corresponds to the write operation of the resistance change type memory, and the SET operation of the memory cell corresponds to the erase operation of the resistance change type memory. However, there also is a case where the RESET operation corresponds to the erase operation, and the SET operation corresponds to the write operation.

(c1) Write Operation

The write operation of the resistance change type memory of the present embodiment will be described with reference to FIGS. 14 to 16.

Figure 14:
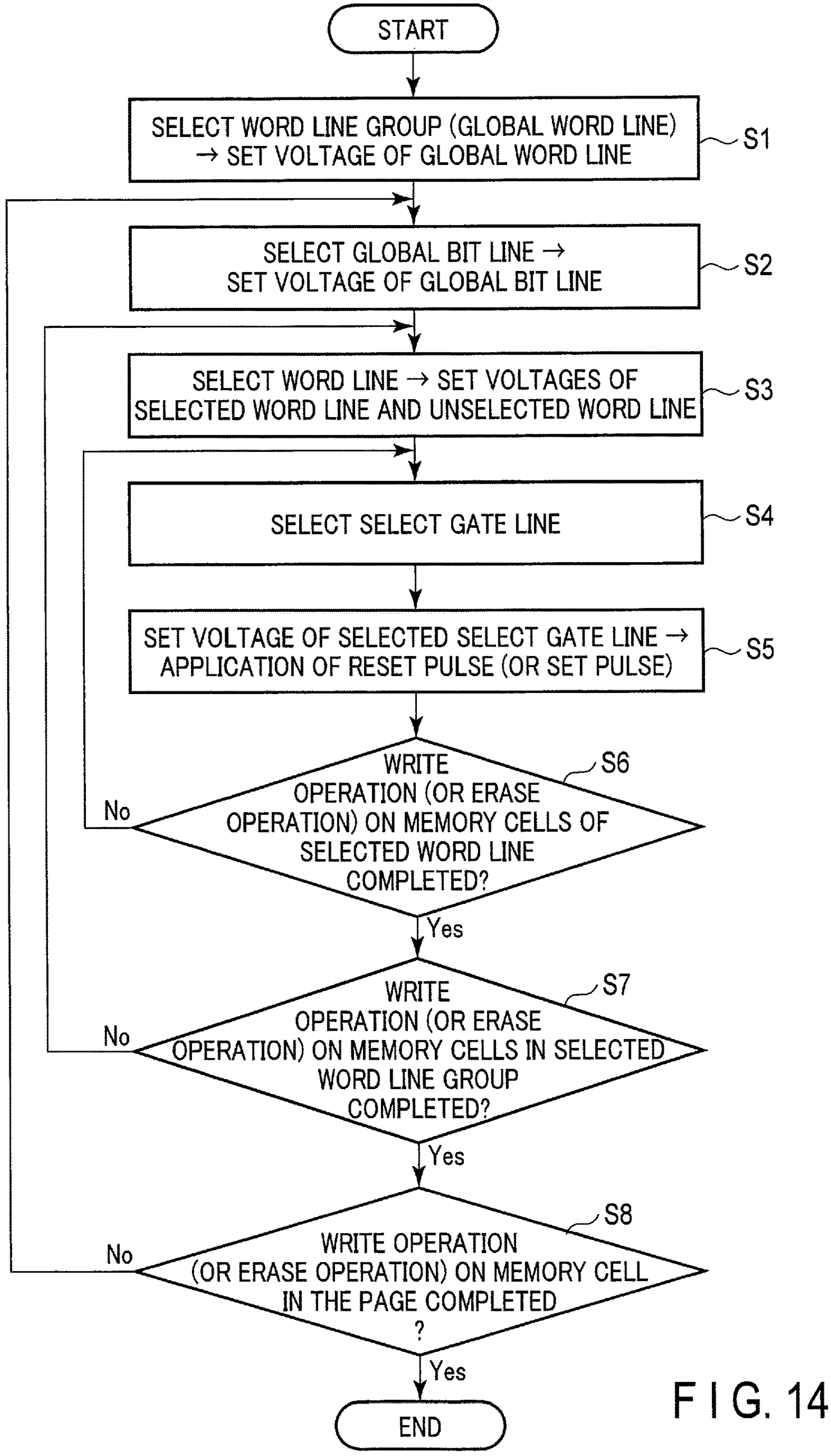
FIG. 14 is a flowchart showing an operation example of the resistance change type memory of the first embodiment.
Figure 15:
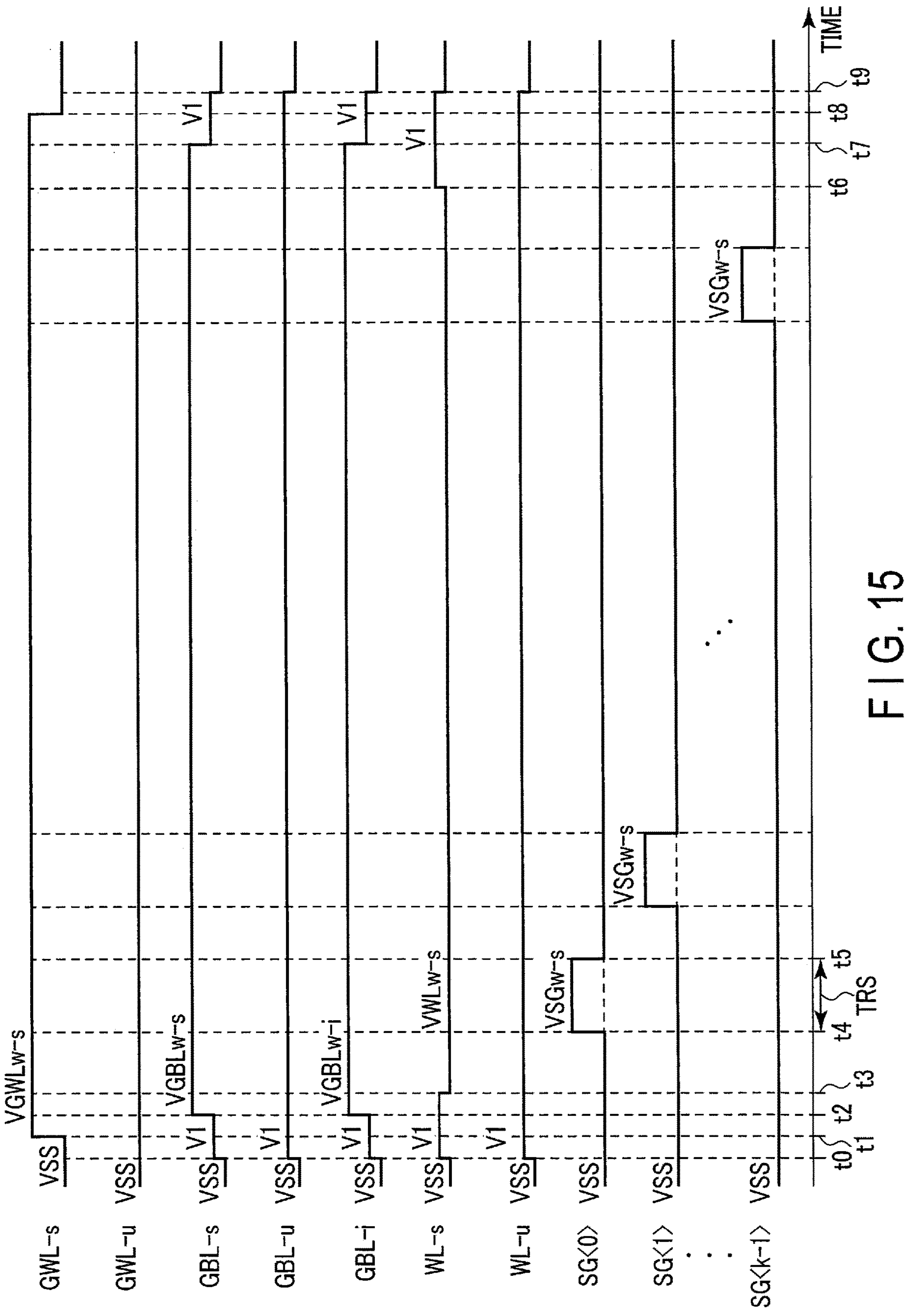
FIGS. 15, 16, 17, 18, and 19 are timing charts each showing an operation example of the resistance change type memory of the first embodiment.

FIG. 14 is a flowchart for explaining the write operation of the resistance change type memory of the present embodiment. FIG. 15 is a timing chart for explaining the write operation of the resistance change type memory of the present embodiment.

When an operation on the resistance change type memory (such as ReRAM) is requested, the resistance change type memory of the present embodiment receives a command, a control signal, and an address from the controller.

When the resistance change type memory is instructed to perform a write operation by a command, the control circuit 17 performs various controls on circuits for the write operation.

The voltage generation circuit 16 generates various voltages for the write operation. The voltage generation circuit 16 transfers the generated voltages to, for example, the word line control circuit 12, the select gate line control circuit 13, and the global bit line control circuit 14.

In the write operation (for example, the RESET operation) of the resistance change type memory of the present embodiment, the potential of each interconnect GBL, GWL, WL, SG in the memory cell array is controlled as will be described below.

[Step S1]

At time t0, the control circuit 17 applies unselect voltage V1 to all the global bit lines GBL and all the word lines WL. Each block MA is thereby placed in the standby state. The voltage value of unselect voltage V1 is, for example, 1.0V.

At time t1, the control circuit 17 sets an address of a global word line GWL to select a word line group. The control circuit 17 sets, for example, the potential of the selected global word line GWL-s at a select voltage (hereinafter referred to as a selected global word line voltage) VGWLw-s. The control circuit 17 sets the potentials of the global word lines (unselected global word lines) GWL-u other than the selected global word line GWL-s at a ground voltage Vss (for example, 0V). For example, the voltage value of the selected global word line voltage VGWLw-s is 2.5V.

[Step S2]

The control circuit 17 sets the address of the global bit line selected as the selected global bit line GBL-s from among a plurality of global bit lines GBL in the global bit line control circuit 14.

At time t2, the control circuit 17 sets, for example, the potential of the selected global bit line GBL-s at a select voltage (hereinafter referred to as a selected global bit line voltage) VGBLw-s. The selected global bit line voltage VGBLw-s is, for example, on the order of 3.4V.

The control circuit 17 raises the potential of the array-end global bit line GBL-i from voltage V1 to voltage VGBLw-i. For example, voltage VGBLw-i is on the order of 1.5V.

The potential of the unselected global bit line GBL-u is maintained at unselect voltage V1.

The control circuit 17 can simultaneously select a plurality of select global bit lines GBL, and perform parallel operations on a plurality of memory cells.

Accordingly, the resistance change type memory of the present embodiment can speed up the write operation.

[Step S3]

The control circuit 17 sets an address of a word line WL to be the selected word line WL-s. At time t3, the control circuit 17 sets, for example, the potential of the selected word line WL-s at a select voltage (hereinafter referred to as a selected word line voltage) VWLw-s.

The control circuit 17 maintains the potentials of the unselected word lines WL-u other than the selected word line at an unselect voltage (hereinafter referred to as an unselected word line voltage) V1.

[Steps S4 and S5]

At time t4, the control circuit 17 sets an address of a select gate line (sheet selector) SG corresponding to the selected cell (selected bit line).

The control circuit 17 controls the potential of the selected select gate line SG (gate voltage of the select transistor ST) in accordance with the address of the bit line BL to be selected.

The control circuit 17 applies, for example, a voltage (hereinafter referred to as an unselected select gate line voltage) VSGw-u having 0V to the select gate lines not to be selected (unselected select gate lines) SG-u.

The control circuit 17 applies, for example, a select voltage (hereinafter referred to as a selected select gate line voltage) VSGw-s to the selected select gate line SG-s. Consequently, the select transistor ST coupled to the selected select gate line SG-s is turned on.

Here, when the write operation on the selected cell is a RESET operation as described with reference to FIG. 11 above, the potential of the selected global bit line and the potential of the selected word line are controlled so that the schottky junction is in the forward-biased state.

The schottky junction between the word line WL (lightly-doped semiconductor layer) and the bit line BL (metal layer) is thereby set in the forward-biased state.

Carriers (holes) are supplied to the lightly-doped semiconductor layer 50 which is the finger. Accordingly, the selected finger 50 of the selected word line is placed in the low resistance state.

Consequently, a write voltage (RESET pulse) of a predetermined magnitude is applied to the selected cell MC-s. A current corresponding to the applied voltage flows in the selected cell.

On the other hand, the fingers 50 of the unselected word lines and the unselected fingers 50 of the selected word line maintain the high resistance state. Therefore, the current that flows in the unselected cell is very small. Accordingly, the power consumption at the unselected cell can be suppressed.

The voltage applied to the half-selected cell is about a half of the voltage of the selected cell due to voltage V1 of the unselected word line and the unselected global bit line. Accordingly, false writing in the half-selected cell can be inhibited.

At time t5, the control circuit 17 deselects the select gate line SG after an elapse of a time corresponding to the pulse width TRS of a desired RESET pulse. The select transistor of the selected select gate line SG-s is turned off.

Application of the voltage from the selected global bit line GBL-s to the selected cell is thereby stopped.

[Step S6]

The control circuit 17 repeats steps S4 and S5 in a loop (increment/decrement of the address) of a plurality of select gate lines SG to which memory cells to write data belong, and completes the write operation on a plurality of memory cells coupled to the selected word line WL. The select gate line SG to which a memory cell not to write data belongs is not set as the selected select gate line.

[Step S7]

The control circuit 17 repeats steps S3 to S6 in a loop of a plurality of word lines in the word line group (global word line), and completes the write operation on the memory cells in the word line group.

At time t6, the control circuit 17 sets the potential of the selected word line WL-s which is selected in steps S3 to S6 at voltage V1.

[Step S8]

The control circuit 17 repeats steps S2 to S7 in a loop of the global bit lines GBL belonging to one page, and completes write operations on the memory cells associated with one or more global bit lines within the range of one page.

At time t7, the control circuit 17 sets the potential of the selected global bit line GBL-s which is selected in steps S2 to S7 and the potential of the array-end global bit line GBL-i at voltage V1.

At time t8, the control circuit 17 sets the potential of the selected global word line GWL at 0V.

At time t9, the control circuit 17 sets the potential of the selected/unselected word line WL, the potential of the selected/unselected global bit line GBL, and the potential of the array-end global bit line GBL-i at 0V.

The control circuit 17 verifies whether data in the page corresponds to the desired data (data to be written). For example, when data read from one or more selected cells do not match the data to be written, the control circuit 17 repeats again the loop of steps S2 to S8 on one or more selected cells holding the mismatch data.

The control circuit 17 completes the write operation after confirming that data in the page matches the desired data.

Figure 16:
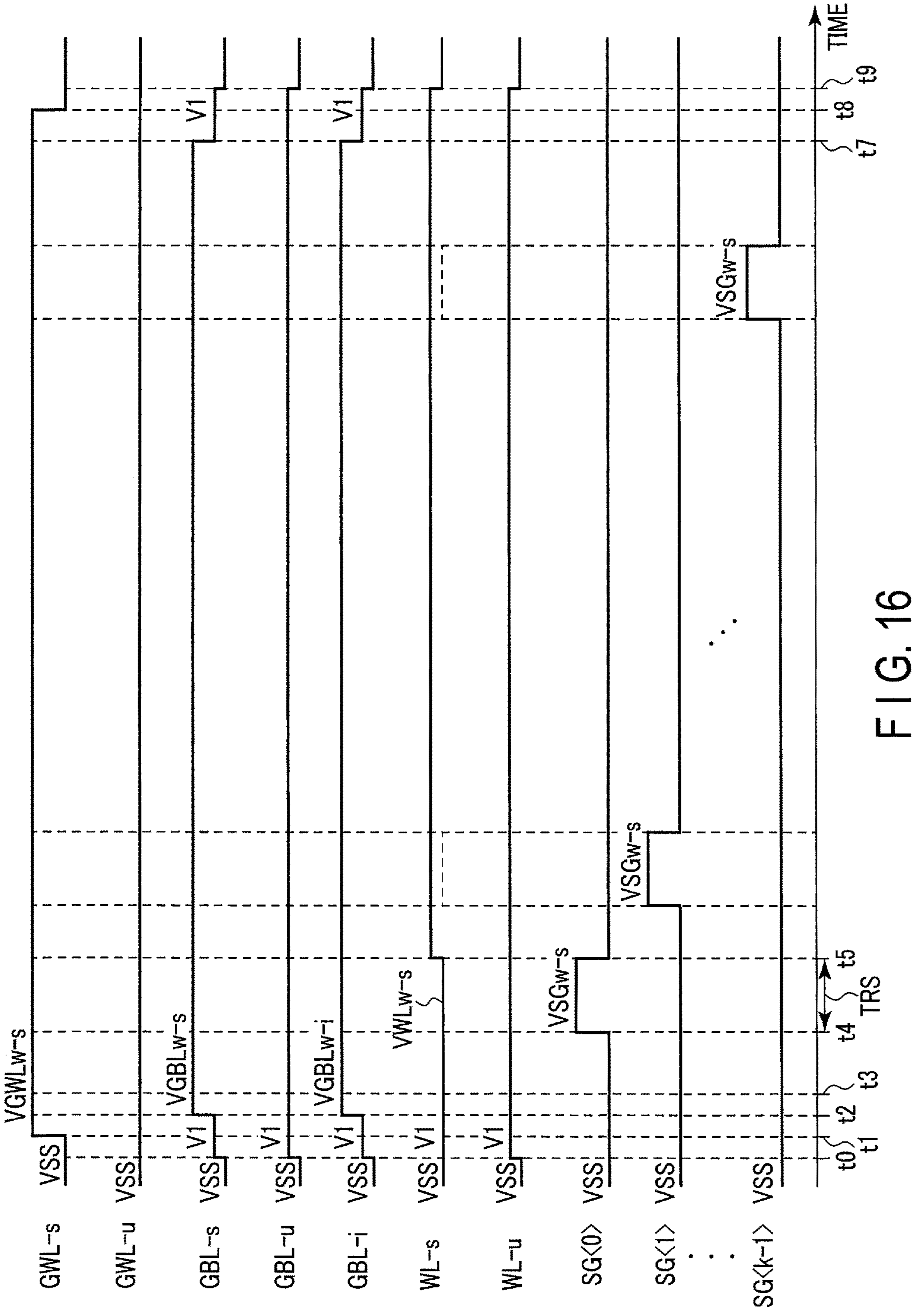

FIG. 16 is a diagram showing a modification of the write operation of the resistance change type memory according to the present embodiment.

As shown in FIG. 16, the write operation (RESET operation) on the selected cell in which data is to be written may be performed by control of the potential and application time (pulse width) of the selected word line WL-s while sequentially scanning the addresses of the selected select gate lines SG.

As described above, the write operation (for example, RESET operation) is performed in the resistance change type memory of the present embodiment.

(c2) Erase Operation

Figure 17:
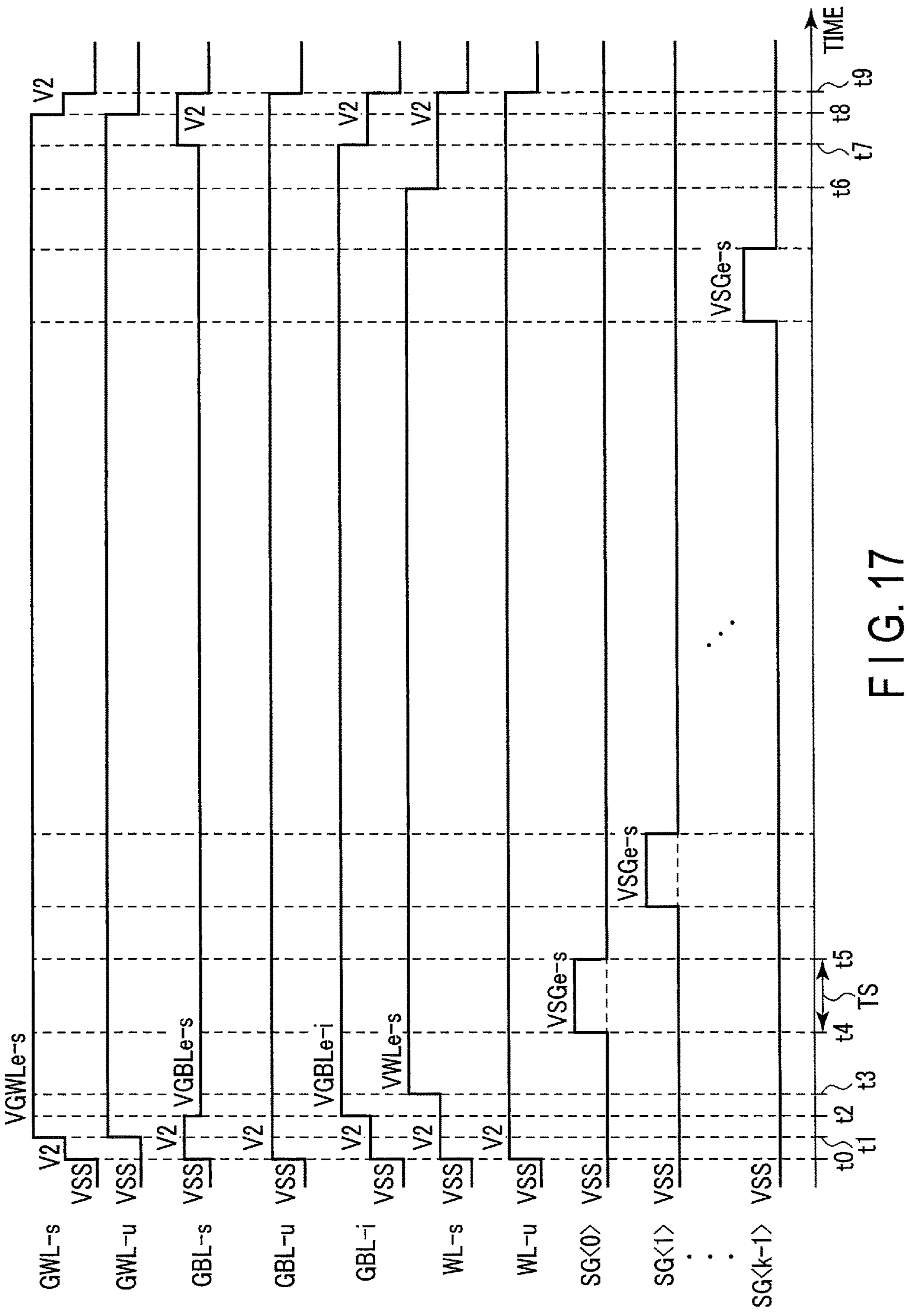

The erase operation of the resistance change type memory of the present embodiment will be described with reference to FIGS. 17 and 18.

In the present embodiment, the processing flow of the erase operation of the resistance change type memory is substantially the same as that of the write operation. Therefore, the processing flow of the erase operation of the resistance change type memory will be described with reference to FIG. 14.

However, the bias condition of each interconnect in the erase operation is different from the bias condition in the write operation in the resistance change type memory of the present embodiment, as will be described below.

[Step S1]

At time t0, the control circuit 17 applies an unselect voltage (for example, 3.0V) V2 to all the global bit lines GBL and all the word lines WL. At this time, the control circuit 17 also applies an unselect voltage (for example, 3.0V which is the same as voltage V2) to all the global word lines GWL. Each block MA is thereby placed in the standby state.

At time t1, the control circuit 17 sets an address of a global word line GWL to select a word line group. The control circuit 17 sets, for example, the potential of the selected global word line GWL-s at a selected global word line voltage VGWLe-s. The control circuit 17 maintains the potential of the unselected global word line GWL-u at voltage V2. For example, the voltage value of selected voltage VGWLe-s is 6.5V.

[Step S2]

The control circuit 17 sets the address of a global bit line to be the selected global bit line GBL-s in the global bit line control circuit 14.

At time t2, the control circuit 17 sets, for example, the potential of the selected global bit line GBL-s at a selected global bit line voltage VGBLe-s.

The control circuit 17 raises the potential of the array-end global bit line GBL-i from voltage V2 to voltage VGBLe-i. For example, voltage VGBLe-i is on the order of 5V.

The potential of the unselected global bit line GBL-u is maintained at unselect voltage V2.

The control circuit 17 can simultaneously select a plurality of select global bit lines GBL, and perform parallel operations on a plurality of memory cells. Accordingly, the resistance change type memory of the present embodiment can speed up the erase operation.

[Step S3]

The control circuit 17 sets an address of a word line WL to be the selected word line WL-s.

At time t3, the control circuit 17 sets, for example, the potential of the selected word line WL-s at a selected word line voltage VWLe-s.

The control circuit 17 maintains the potential of the unselected word line WL-u at an unselected word line voltage V2.

In the present embodiment, the control circuit 17 applies voltage (Ve+Vo) obtained by adding offset voltage Vo to a predetermined erase voltage (SET pulse) Ve to the selected word line WL-s as the selected word line voltage VWLe-s, in consideration of the bipolar action of the cell.

The control circuit 17 applies voltage (Vef+Vo) obtained by adding offset voltage Vo to a predetermined voltage Vef to the unselected global bit line GBL-u and the unselected word line WL-u as unselect voltage V2.

Here, voltage Vef+Vo has a voltage value set so that the voltage applied to the half-selected cell becomes about a half of the voltage applied to the selected cell.

The control circuit 17 applies voltage Vo to the selected global bit line GBL-s as select voltage VGBLe-s.

In the erase operation, the above-mentioned voltage (offset voltage) Vo is added to the voltage of the global bit line and the voltage of the word line for the following reason:

When the potential of the selected global bit line GBL-s is set to a voltage value (for example, on the order of 1V) which is higher than the potential of the unselected select gate line SG-u, in accordance with the property of a selected cell, the leakage current of the unselected cell can be greatly reduced.

In addition, the negative voltage circuit has a relatively large circuit area. Therefore, by raising the voltages of the global bit lines and the word lines overall, a predetermined potential difference can be set between the global bit line and the unselected select gate line while avoiding mounting of the negative voltage circuit which has a large circuit area.

[Steps S4 and S5]

At time t4, the control circuit 17 sets an address of a select gate line SG corresponding to the selected cell (selected bit line).

The control circuit 17 controls the potential of the selected select gate line SG (gate voltage of the select transistor ST) in accordance with the address of the bit line BL to be selected.

The control circuit 17 applies, for example, voltage VSGe-u of 0V to the unselected select gate line SG-u.

The control circuit 17 applies, for example, a selected select gate line voltage VSGe-s to the selected select gate line SG-s. Consequently, the select transistor ST coupled to the selected select gate line SG-s is turned on.

Here, when the erase operation on the selected cell is a SET operation as described with reference to FIG. 12 above, the potential of the selected global bit line and the potential of the selected word line are controlled so that the schottky junction is in the reverse-biased state.

Between the array-end global bit line GBL-i and the selected finger, the schottky junction is set in the forward-biased state. Therefore, carriers (holes) are supplied from the array-end global bit line GBL-i to the lightly-doped semiconductor layer 50.

The supplied carriers induce conductivity modulation (bipolar action) in another schottky junction adjacent to the schottky junction coupled to the global bit line GBL-i. The carriers generated by the conductivity modulation causes chained conductivity modulation in a plurality of schottky junctions (memory cells) provided at the selected finger.

Accordingly, the selected finger 50 of the selected word line is placed in the low resistance state.

Consequently, an erase voltage (SET pulse) of a predetermined value is applied to the selected cell MC-s. A current corresponding to the applied voltage flows in the selected cell.

On the other hand, the fingers 50 of the unselected word lines and the unselected finger 50 of the selected word line maintain the high resistance state. Therefore, the current that flows in the unselected cell is very small. Accordingly, the power consumption at the unselected cell can be suppressed.

The voltage applied to the half-selected cell is about a half of the voltage of the selected cell due to voltage V2 of the unselected word line and the unselected global bit line. Accordingly, false writing in the half-selected cell can be inhibited.

At time t5, the control circuit 17 deselects the select gate line SG after an elapse of a time corresponding to the pulse width TS of a desired SET pulse. The select transistor of the selected select gate line SG-s is turned off.

Application of the voltage from the selected global bit line GBL-s to the selected cell is thereby stopped.

[Step S6]

The control circuit 17 repeats the operations of steps S4 and S5 in a loop of a plurality of select gate lines SG to which the memory cell to be subjected to erasing belongs, and completes the erase operation on a plurality of memory cells coupled to the selected word line WL. The select gate lines SG to which a memory cell from which data is not to be erased belongs is not set as the selected select gate line.

Thereafter, in the erase operation, the control circuit 17 performs the operations of steps S7 and S8 and verification of the erase operation, etc., as in the write operation.

At time t6, the control circuit 17 sets the potential of the selected word line WL-s which is selected in steps S3 to S6 at voltage V2. At time t7, the control circuit 17 sets the potential of the selected global bit line GBL-s which is selected in steps S2 to S7 and the potential of the array-end global bit line GBL-i at voltage V2.

At time t8, the control circuit 17 sets the potential of the selected global word line GWL-s at voltage V2.

At time t9, the control circuit 17 sets the potential of the selected/unselected word line WL, the potential of the selected/unselected global bit line GBL, and the potential of the array-end global bit line GBL-i at the ground voltage.

The control circuit 17 performs verification of the erase operation and re-erasing based on the verification result. The control circuit 17 thereby completes the erase operation.

Figure 18:
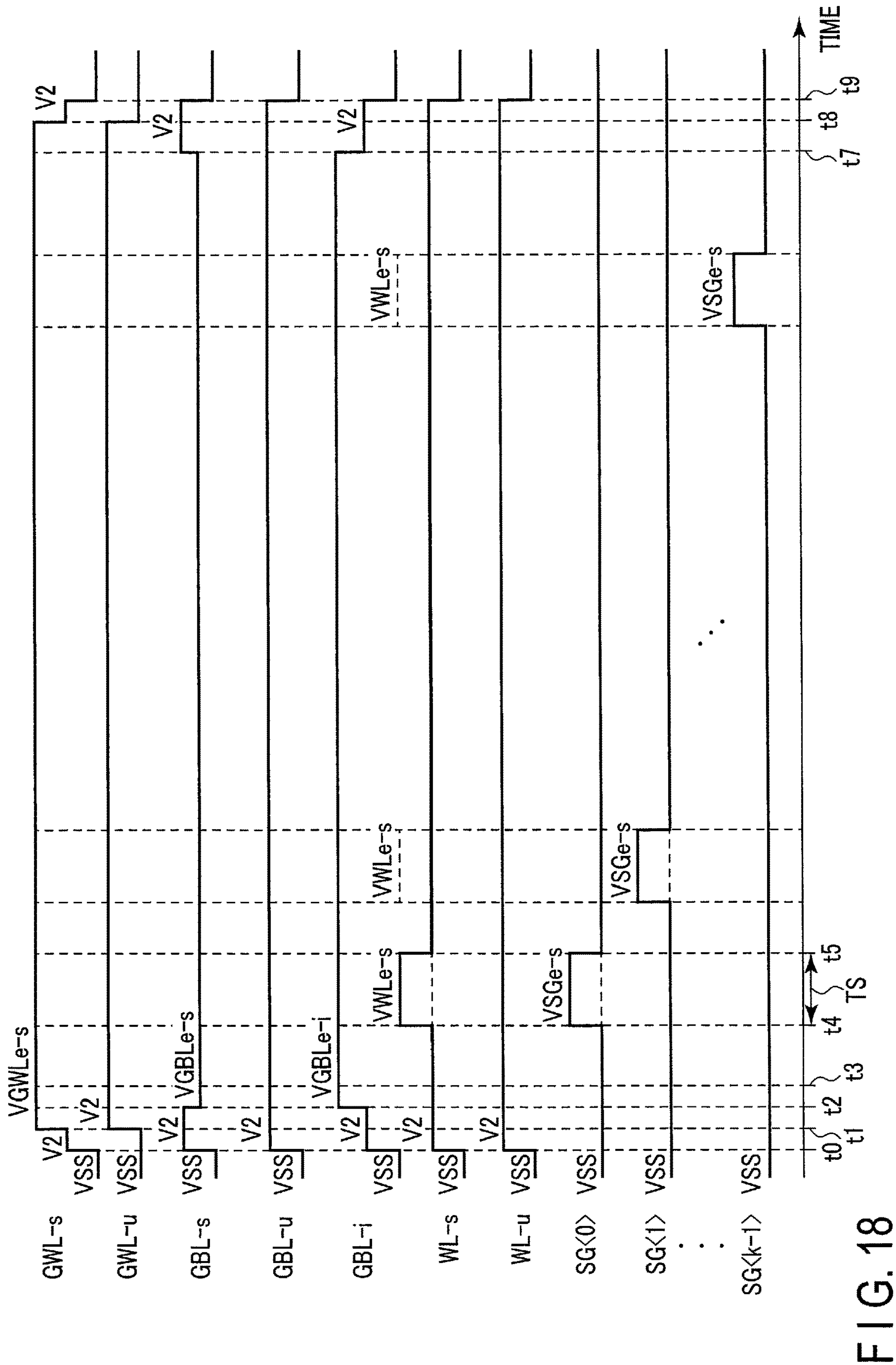

FIG. 18 is a diagram showing a modification of the erase operation of the resistance change type memory according to the present embodiment.

As shown in FIG. 18, the erase operation (SET operation) on the selected cell from which data is to be erased may be performed by control of the potential and application time (pulse width) of the selected word line WL-s while sequentially scanning the addresses of the selected select gate lines SG-s.

As described above, the erase operation (for example, SET operation) is performed in the resistance change type memory of the present embodiment.

(c3) Read Operation

The read operation of the resistance change type memory of the present embodiment will be described with reference to FIG. 19.

Figure 19:
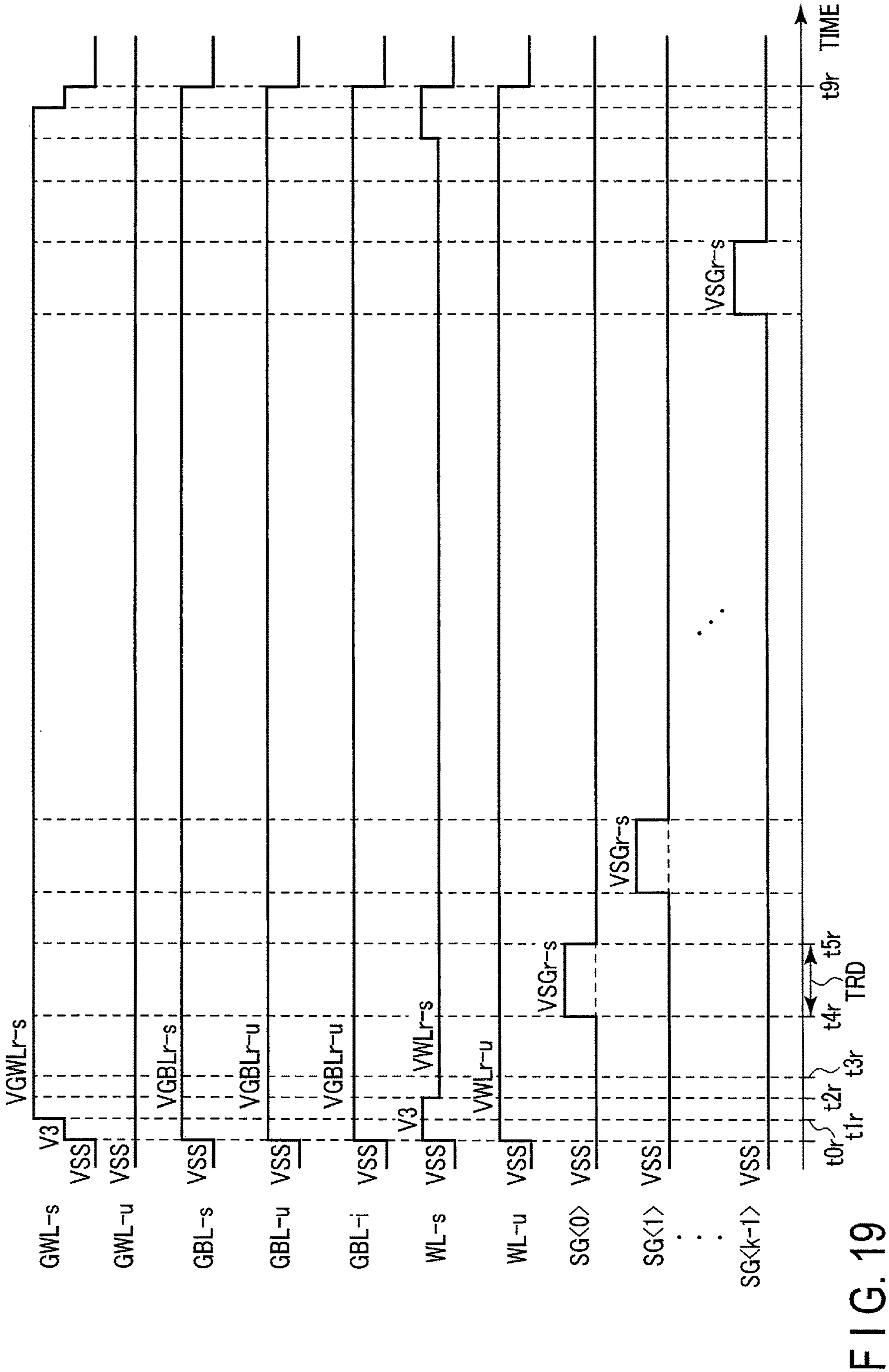

FIG. 19 is a timing chart for explaining the read operation of the resistance change type memory of the present embodiment.

As shown in FIG. 19, as in the above-described cases of the write operation and erase operation, when the resistance change type memory is instructed to perform a read operation by a command from the controller, the control circuit 17 performs various forms of control on circuits at timings based on control signals to perform the read operation.

The voltage generation circuit 16 generates various voltages for the read operation. The voltage generation circuit 16 transfers the generated voltages to, for example, the word line control circuit 12, the select gate line control circuit 13, and the global bit line control circuit 14.

The read operation is performed on the address from the controller.

In the read operation, at time t0*r*, voltage V3 is applied to predetermined interconnects GWL, GBL, and WL to set the memory cell array 11 (block) in the standby state.

At time t1*r*, the control circuit 17 sets a selected global word line GWL corresponding to the selected address. The control circuit 17 applies voltage VGWLr-s to the selected global word line GWL.

At time t2*r*, the control circuit 17 applies select voltage VGBLr-s to the selected global bit line GBL-s, and applies unselect voltage VGBLr-u to the unselected global bit line GBL-u.

Voltage VGBLr-s of the global bit line is voltage Vr+Vo having a voltage value obtained by adding voltage (offset voltage) Vo to a predetermined read voltage Vr.

For example, the voltage value of voltage V3 is substantially the same as the voltage value of voltage Vr+Vo.

At time t3*r*, the control circuit 17 applies select voltage VWLr-s to the selected word line WL-s, and applies unselect voltage VWLr-u to the unselected word line WL-u.

Voltage VWLr-s of the selected word line WL-s has the voltage value of the offset voltage Vo. Voltage VWLr-u of the unselected word line WL-u has the same voltage value as voltage Vr+Vo.

In this state, the select transistor ST is set in the ON state by application of voltage VSGr to the selected select gate line SG-s.

At this time, the schottky junction between the selected finger of the selected word line WL-s and the bit line BL is placed in the forward-biased state. By the schottky junction being in the forward-biased state, carriers (holes) are supplied to the lightly-doped semiconductor layer 50 which is the selected finger.

Therefore, the electrical resistance of the selected finger 50 decreases.

Consequently, read voltage Vr is transferred to the selected cell MC via the selected bit line BL in the period TRD from time t4*r* to time t5*r*.

The magnitude of the current that flows in the selected cell MC varies depending on the resistance state of the selected cell MC. For example, the sense amplifier detects the current value of the current that flows in the selected global bit line GBL-s (or the change amount of the potential of a node). Based on this detection result, data stored in the selected cell MC is distinguished.

After the loop processing based on selected addresses, for example, at time t9*r*, the control circuit 17 sets the potential of each interconnect GWL, GBL, WL at 0V.

The control circuit 17 thereby completes the read operation.

One selected word line. WL-s is selected from one block MA. However, a plurality of global bit lines GBL-s may be simultaneously selected, and parallel read operations may be performed on a plurality of selected global bit lines GBL-s. Accordingly, the band width (data transfer amount) of the resistance change type memory can be improved.

For the following reason, an offset voltage is added to the voltage applied to the global bit line GBL and the voltage applied to the word line WL in the read operation:

Immediately after the write operation or erase operation is performed on a memory cell (variable resistance element), reading is performed on the memory cell, and whether the memory cell has a desired resistance value is verified. If the detection result is not within a desired resistance value range, additional writing or additional erasing is performed on the selected cell.

Therefore, if there is a large voltage difference between the bias condition of the write/erase operation and the bias condition of the read operation, and an operation with a sharp change in the voltage at a large-parasitic capacitance node is performed, an increase in the power consumption and a delay in the operation time may be caused.

In the present embodiment, since the parasitic capacitance of the global bit line is relatively large, the voltage applied to the global bit line is desirably set to have the same value in the write/erase operation and in the read operation as much as possible.

Since the number of unselected global bit lines is larger than the number of selected global bit lines, it is more desirable to set the voltage value of the offset voltage Vo so that voltage V1 is nearly equal to voltage Vr+Vo, and voltage Vef+Vo (voltage. V2) is nearly equal to voltage Vr+Vo to prevent the potential of the unselected global bit line from greatly changing.

As described with reference to FIGS. 15 to 19, the effective electrical resistance of the lightly-doped semiconductor layer (finger) of the word line can be lowered by supply of carriers from the schottky junction between the selected word line WL-s and the bit line BL in the write operation, erase operation, and read operation of the resistance change type memory of the present embodiment.

Therefore, the resistance change type memory of the present embodiment can perform a predetermined operation on the selected cell.

In the present embodiment, in the selected/unselected word line, the lightly-doped semiconductor layer of the finger in the unselected state keeps a high electrical resistance. Accordingly, the resistance change type memory of the present embodiment can reduce the current that flows in the unselected cell.

As a result, the resistance change type memory of the present embodiment can reduce current consumption (power consumption).

Therefore, the resistance change type memory of the present embodiment can improve the characteristics of the memory.

(d) Manufacturing Method

A manufacturing method of the semiconductor memory of the present embodiment will be described with reference to FIGS. 20 to 41.

<Memory Area Forming Process>

A manufacturing method of the memory area (block) of the memory cell array of the resistance change type memory (for example, ReRAM) of the present embodiment will be described with reference to FIGS. 20 to 31. Here, FIGS. 2 to 6 are also referred to as appropriate when describing the manufacturing method of the resistance change type memory of the present embodiment.

FIGS. 20 to 31 are perspective views sequentially showing the process of manufacturing the memory area (block).

Figure 20:
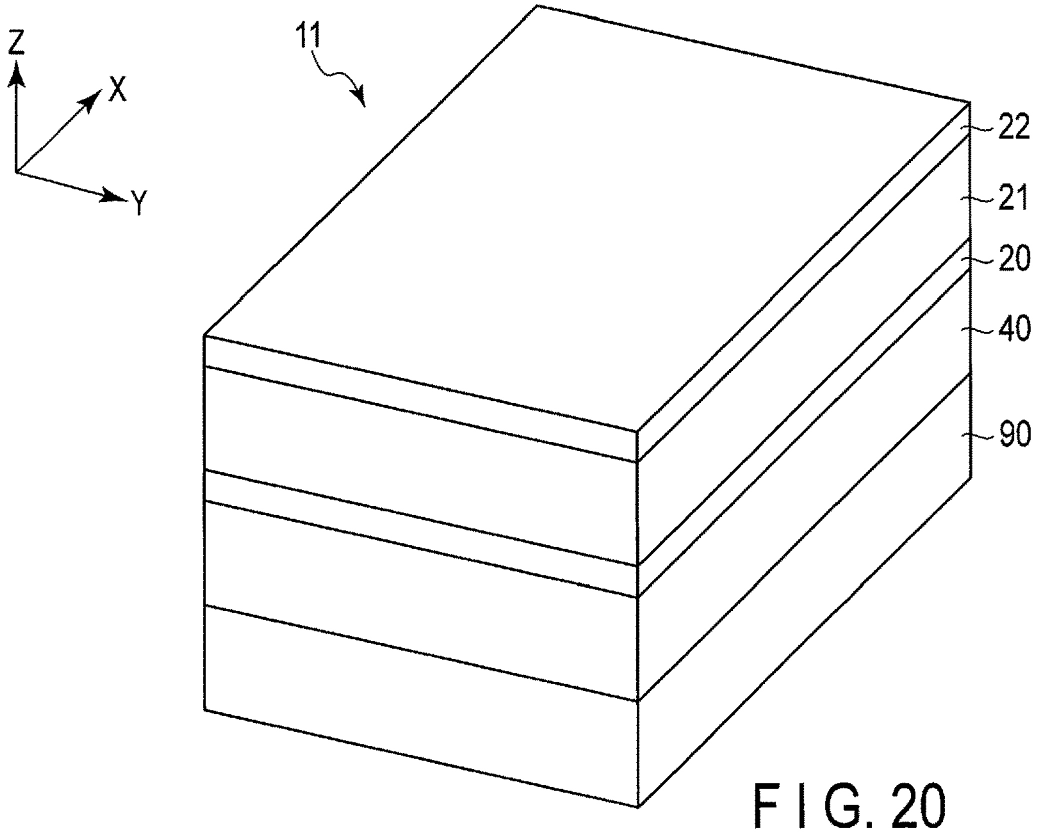

In FIG. 20, a CMOS circuit which controls the operation of the resistance change type memory is formed on a semiconductor substrate (such as silicon substrate) 90 (see FIGS. 5 and 6). For example, the impurity concentration (such as a concentration of p-type dopant) in the silicon substrate 90 is higher than $1\times10^{-16}$ $cm^{-3}$.

An interlayer insulating film (not shown) is formed on the semiconductor substrate 90 to cover the CMOS circuit.

After the circuit is formed on the semiconductor substrate 90, a conductive layer 40 is formed on the interlayer insulating film which covers the semiconductor substrate 90. The conductive layer 40 is a layer for forming global bit lines GBL. The conductive layer 40 is formed with a stack of tungsten (W) and barrier metal (such as TiN).

On the conductive layer 40, an $n^+$-type silicon layer 20, a $p^-$-type silicon layer 21, and an $n^+$-type silicon layer 22 are sequentially formed. Silicon layers 20, 21, and 22 correspond respectively to one source/drain layer 20, the channel region 21, and the other source/drain layer 22 of the select transistor (sheet selector).

Silicon layers 20 and 22 have, for example, a dopant concentration of about $1\times10^{20}$ $cm^{-3}$. The film thickness of each silicon layer 20, 22 (dimension of the silicon layer in the Z direction) is, for example, about 40 nm. Silicon layer 21 has, for example, a dopant concentration of about $1\times10^{18}$ $cm^{-3}$. The film thickness of silicon layer 21 (dimension of the silicon layer in the Z direction) is, for example, about 120 nm.

Annealing processing at a predetermined temperature for a predetermined time is performed on the silicon layers. The silicon layers 20, 21, and 22 are thereby crystallized.

Figure 21:
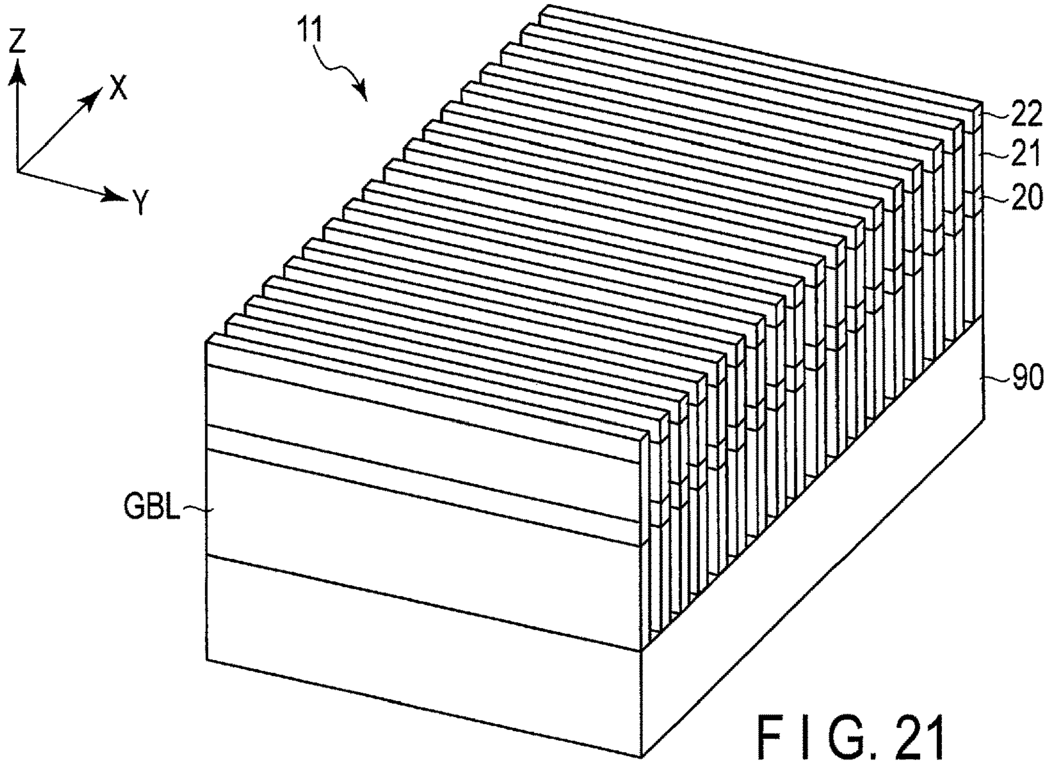

As shown in FIG. 21, the conductive layer GBL and silicon layers 20, 21, and 22 are patterned by photolithography and etching (such as RIE).

A plurality of global bit lines GBL are thereby formed. Each global bit line GBL has a stripe shape extending in the Y direction.

At an end of the memory cell array 11 (or an end of the block), an array-end global bit line GBL-i is formed simultaneously with the global bit lines GBL. The line width (dimension in the X direction) W2 of the array-end global bit line GBL-i is larger than the line width (dimension in the X direction) W1 of each global bit line GBL.

Figure 22:
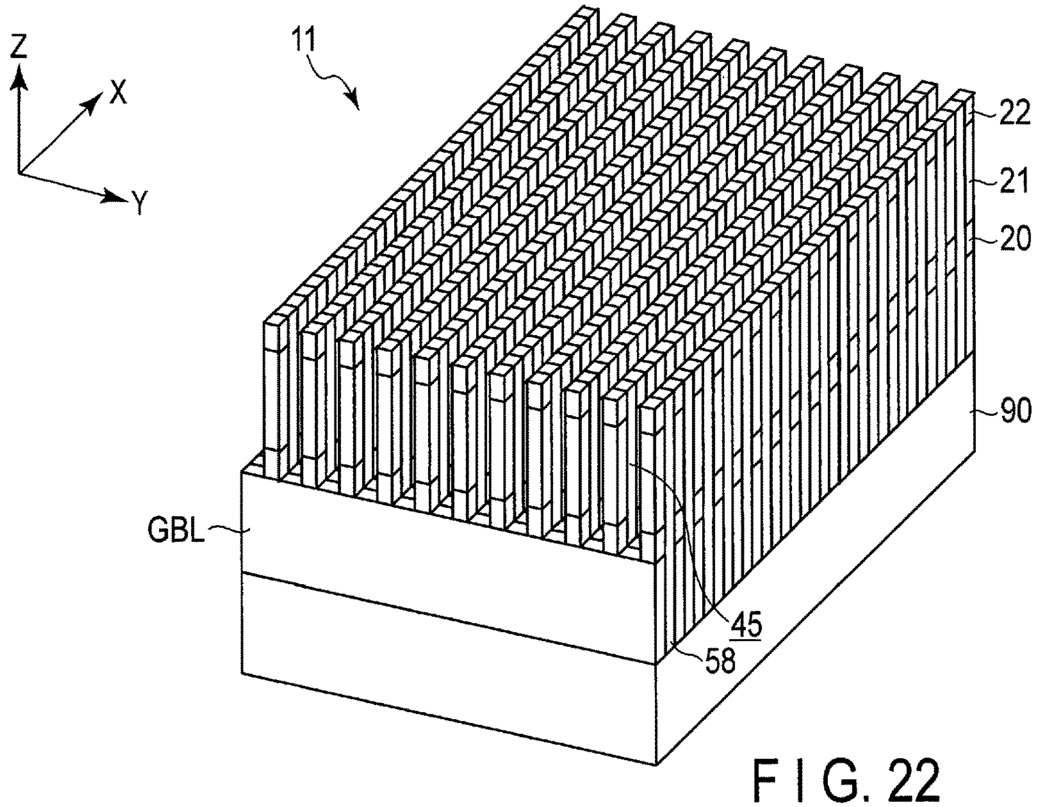

As shown in FIG. 22, an insulating layer 58 is deposited. The insulating layer 58 is ground by CMP or the like. The top surface of silicon layer 22 is thereby exposed.

The insulating layer 58 is filled in the spaces between the silicon layers 20, 21, and 22 adjacent to one another in the X direction, and spaces between conductive layers GBL adjacent to one another in the X direction.

The silicon layers 20, 21, 22 and insulating layer 58 are patterned by photolithography and RIE into stripe shapes extending along the X direction.

The silicon layers 20, 21, and 22 are thereby divided into select elements (select transistors) ST.

Figure 23:
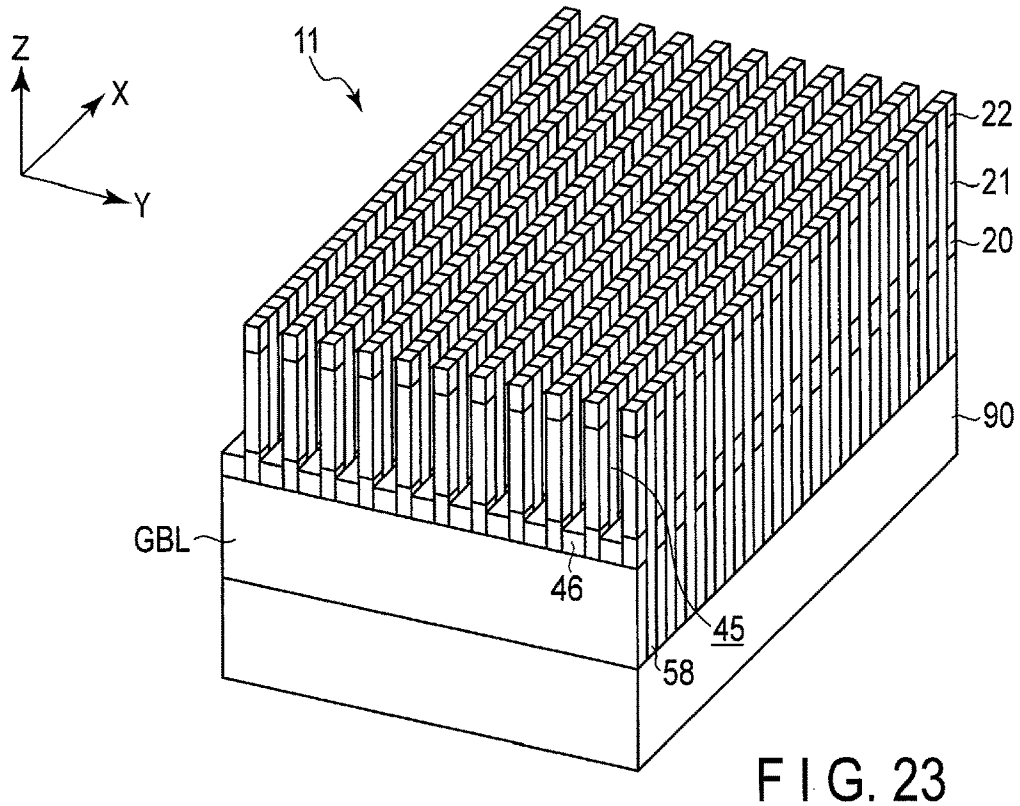

As shown in FIG. 23, insulating layer 46 (such as a silicon oxide layer) is formed on the silicon layers 20, 21, and 22, and insulating layer 58.

Etch back processing is performed on the formed insulating layer 46.

Insulating layer 46 thereby remains only at the bottoms of the grooves 45 between the silicon layers 20, 21, and 22. In each groove 45, insulating layer 46 covers the top surface of the global bit line GBL.

The film thickness of remaining insulating layer 46 is smaller than, for example, the film thickness of silicon layer 20. Inside the groove 45, part of silicon layer 20, and the side surfaces of silicon layers 21 and 22 are exposed.

As shown in FIG. 24, insulating film 23 is formed on the silicon layers 20, 21, and 22. Insulating film 23 corresponds to the gate insulating film of the select transistor. Insulating film 23 is removed from the top surface of silicon layer 22 and the top surface of insulating layer 46. Insulating layer 23 thereby remains only on the side surfaces of the groove 45 (side surfaces of silicon layers 20, 21, and 22).

As shown in FIG. 25, conductive layer 25 is formed on the side surfaces and bottom surface inside the groove 45 and the top surfaces of insulating layer 58 and silicon layer 22. Conductive layer 25 is, for example, an $n^+$-type polycrystalline silicon layer. Conductive layer 25 corresponds to the select gate lines SG.

After this, conductive layer 25 is etched back from above (in the direction perpendicular to the substrate surface). By this step, the bottom surface of conductive layer 25 becomes lower than the interface between silicon layers 20 and 21, and the top surface of conductive layer 25 becomes higher than the interface between silicon layers 21 and 22. At the same time, conductive layer 25 on the middle part of the bottom surface of the groove 45 is removed. As a result, a slit Q extending in the X direction is formed in conductive layer 25.

Consequently, conductive layer 25 is divided in the Y direction in the groove 45.

In the present embodiment, select gate lines SG extending in the X direction are formed in this manner.

As shown in FIG. 26, insulating layer 49 (such as a silicon oxide film) is formed on conductive layer 25. After that, insulating layer 49 is ground by CMP or the like. Insulating layer 49 remains in the groove (in the slit Q between conductive layers 25). The top surface of silicon layer 22 is exposed.

As shown in FIG. 27, insulating layer 61 (such as a silicon oxide film) is formed on silicon layer 22 and insulating layer 49. The film thickness of insulating layer 61 is, for example, on the order of 20 nm.

On insulating layer 61, a plurality of semiconductor layers 50Z and a plurality of insulating layers 62 are formed alternately in the Z direction. Semiconductor layers 50Z correspond to the word lines WL. Semiconductor layers 50Z are formed by using, for example, silicon. The film thickness of each semiconductor layer 50Z is, for example, about 10 nm.

The dopant concentration (impurity concentration) of silicon layer 50Z is lower than the dopant concentration of the silicon substrate 90 and the dopant concentration of semiconductor layer 20. Semiconductor layer 50Z is an intrinsic semiconductor layer or a lightly-doped semiconductor layer (such as an $n^-$-type semiconductor layer). For example, silicon layer 50Z as a semiconductor layer (word line) includes phosphorus in a concentration equal to or lower than $1\times10^{17}$ $cm^{-3}$ on average.

Insulating layer (such as a silicon oxide film) 62 between semiconductor layers 50Z has a film thickness on the order of 7 nm, for example.

Insulating layer 64 (such as a silicon oxide film) is formed on the topmost semiconductor layer 50Z. The film thickness of insulating layer 64 is, for example, on the order of 13 nm.

As shown in FIG. 28, insulating layers 61, 62, and 64 and semiconductor layer 50 are patterned into a comb-like shape by photolithography and etching. Two comb-shaped word lines WL are thereby formed in each layer.

In FIG. 28 and the subsequent figures, only the fingers 50 of the comb-shaped word line WL are shown, and the shaft portion is omitted for clear illustration.

In this step, etching (such as RIE) is performed so that insulating layers 61, 62, and 64 and semiconductor layer 50 remain on the lower insulating layer 49.

The top surfaces of silicon layer 22 and insulating films 23 and 58 are exposed at the bottom of each groove 69 formed by patterning when the word lines WL are formed.

As shown in FIG. 29, a resistance change film 24 is formed on the bottom surface and side surfaces of the groove 69, and the top surface of insulating layer 64. The resistance change film 24 corresponds to the memory layer. The resistance change film 24 is formed in such a manner that the groove 69 is not filled up with the resistance change film 24.

After that, the resistance change film 24 on the bottom of the groove 69 and the top surface of insulating film 54 is removed with etching back.

At the bottom of the groove 69, the top surfaces of silicon layer 22 and insulating film 58 are exposed.

As shown in FIG. 30, conductive layer 67 is formed. The formed conductive layer 67 is ground by CMP. Consequently, conductive layer 67 remains only inside the groove 69. Conductive layer 67 is formed by using, for example, a metal (or a conductive compound).

As shown in FIG. 31, the conductive layer BL is patterned into pillar shapes by photolithography and etching. In this step, the conductive layer BL remains on silicon layer 22. Bit lines BL are thereby formed to extend in a direction perpendicular to the surface of the semiconductor substrate 90.

After this, an insulating layer is filled in the groove between adjacent bit lines BL.

Accordingly, a memory cell array (block) 11 having a comb-shaped word line is formed.

After passivation processing is performed by a well-known technique, interconnects in the hookup area are formed.

<Hookup Area Forming Process>

A method for manufacturing the hookup area of the resistance change type memory of the present embodiment will be described with reference to FIGS. 32 to 41. FIGS. 32 to 41 are bird's-eye views showing steps of manufacturing the hookup area HA of the resistance change type memory of the present embodiment.

For clarification of the figures, FIGS. 32 to 41 show only major members, and illustration of an interlayer insulating film, etc. is omitted.

In the present embodiment, the step of forming the hookup area is performed in parallel with (at substantially the same time as) the step of forming the memory cell array.

As shown in FIG. 32, a plurality of interconnects (metal layer) 110 are formed in correspondence with the number of stacked layers of word lines WL by using the upper interconnects of the CMOS circuit (interconnects in interlayer insulating films 98 and 99). Interconnects 110 are coupled to, for example, the word line driver 121.

After this, an insulating layer (not shown) is formed to cover the interconnects 110. The insulating layer is formed to have such a height that the insulating layer reaches the bottom surface of the global bit line GBL.

In the formed insulating layer, a contact plug is formed to reach the interconnect of the select gate line control circuit.

In the same interconnect level (layer) as the global bit line GBL of the memory cell array 11, a bypass pattern (metal layer) ill of the select gate line SG is formed. The bypass pattern 111 is in contact with the contact plug coupled to the select gate line control circuit.

At this time, global bit lines are formed in the memory cell array 11 as described with reference to FIG. 21.

For example, the bypass pattern 111 is formed to bypass the region above the interconnects 110.

In the hookup area HA, a contact plug 112 is formed to be coupled to the bypass pattern 111.

The contact plug 112 is formed by the conductive layer of the select gate line SG being filled in a contact hole that reaches the bypass pattern ill in the step of forming the select gate line SG in FIG. 25.

The select gate line SG is formed by the above-described steps of FIGS. 25 and 26.

In one select gate line SG, the conductive layer as a select gate line SG is divided between memory cell regions R1. In the hookup area, by the bypass pattern being formed by the contact plug 112 and interconnect 111 in the layer lower than the select gate line SG, two divided conductive layers 25 are coupled.

The select gate lines SG that do not pass through the region above the interconnects 110 may be formed without using the bypass pattern.

As described above, in the region above the interconnects 110, select gate lines SG are not provided, and an insulating layer which is not shown is provided.

After select transistors ST are formed as described with reference to FIGS. 25 and 26, insulating layer 61 is formed in the memory cell array 11 and the hookup area HA. After that, in the hookup area HA, a contact hole that reaches the interconnect 110 is formed in insulating layer 61.

A contact plug (for example, a tungsten film) 113 is filled in the contact hole.

As shown in FIG. 33, when the step of FIG. 27 is performed in the memory cell array 11, a multi-layered stack including semiconductor layer 50Z and insulating layers 62 and 64 is also formed in the hookup area HA.

The bottommost semiconductor layer 50 is in contact with the contact plug 113.

As shown in FIG. 34, a mask layer 117 is formed by photolithography and etching. This mask layer 117 functions as a mask for patterning word lines in the memory cell region R1, and functions as a mask for forming a contact region of word lines in the hookup area HA.

The mask layer 117 in the hookup area HA has a shape including an area (interconnect 59) for coupling in common with a plurality of word lines WL belonging to the same word line group and an area extending along the Y direction for forming leading portions of a stepped structure of word lines. Groove 71 is formed between those areas.

Next, a step of patterning word lines WL is performed in the memory cell array 11 by using the mask layer 117.

In above-described FIG. 28, the mask layer 117 is omitted. At this time, a similar patterning step is also performed in the hookup area HA as shown in FIG. 35.

As a result, groove 71 reaches insulating layer 61, and the top surface of the contact plug 113 is exposed at the bottom of groove 71. The steps shown in FIGS. 29 and 30 are performed in the memory cell array 11. In the memory cell array 11, an interlayer insulating film is formed in the region between adjacent bit lines BL after the structure shown in FIG. 31 is obtained.

During those steps on the memory cell array 11, the hookup area HA is covered with, for example, a mask material.

After that, the hookup area HA is processed.

Resistance reduction processing is performed on semiconductor layer 50 in the hookup area HA.

For example, resistance reduction processing (conductivity-enhancement processing) on the silicon layer 50 in the hookup area HA (shaft portion of the word line) is performed by a salicide step (silicidation of the semiconductor layer).

A metal 79, such as tungsten (W), nickel (Ni), or titanium (Ti), is filled in the grooves 71 (or opening pattern) formed in the stacked bodies 50 and 62 in the hookup area HA.

After this, annealing processing is performed. By this annealing processing, a metal-semiconductor compound (silicide) is formed between the silicon layer 50 and the metal 79. As a result, the shaft portion of the comb-shaped word line (silicon layer) becomes a silicide layer.

The finger of the word lines WL keeps the lightly-doped silicon layer 50. The dimensions of the shaft portion and the conditions for the annealing processing are set as appropriate so that the finger keeps a semiconductor layer.

Unreacted metal 79 is selectively removed by wet etching using an acid solution.

As described above, semiconductor layer 50 in a predetermined range from groove 71 formed in the hookup area HA is converted into a low-resistance material (such as a silicide layer).

The resistance reduction processing of the shaft portion of the comb-shaped word line may be performed by doping a dopant in the semiconductor layer.

For example, resistance reduction of the shaft portion of the word line WL is performed by dopant diffusion from groove (opening) 71. Specifically, in the state where groove 71 is formed in the stacked body including semiconductor layer 50 and insulating layer 62, annealing processing is performed in an atmosphere gas containing phosphorus. An n-type dopant is thereby diffused in the portion of semiconductor layer 50 in a predetermined range from an end of groove 71 of the stacked structure in a concentration, for example, on the order of $10^{20}$ $cm^{-3}$. As a result, the resistance of the shaft portion of the word line WL is lowered.

In the resistance reduction processing, instead of phosphorus, arsenic may be used as a dopant. In the resistance reduction processing, instead of diffusion using a gas including a dopant, solid phase diffusion using a glass including highly-concentrated phosphorus, or liquid phase diffusion using a solution containing highly-concentrated phosphorus may be used.

The resistance reduction processing of the word line (shaft portion) may also be performed by ion implantation. In this case, a resist mask (not shown) having an opening may be formed in the hookup area without forming an opening in semiconductor layer 50 and insulating layer 62. The opening of the resist mask is formed at a position corresponding to the region where the shaft portion of the word line WL is formed. At this time, the finger of the word line WL is below the resist mask.

By ion implantation, arsenic (or phosphorus) is added to silicon layer 50 (word line WL) in the hookup area HA via the opening of the resist mask. After this, annealing processing is performed, and arsenic in silicon layer 50 is activated. Accordingly, the portion of the silicon layer corresponding to the shaft portion of the word line includes a dopant in a relatively high concentration (for example, a concentration on the order of $10^{20}$ $cm^{-3}$).

As described above, in the comb-shaped word line, the resistance of the portion of the semiconductor layer corresponding to the shaft portion is lowered by ion implantation.

In ion implantation, non-uniformity in dopant concentration between the upper layer and lower layer of the stacked body including a plurality of stacked word lines can be inhibited by adjusting the acceleration voltage of ions and/or the ion implantation amount (dose amount) for each layer of the stacked body. Consequently, variations between the resistance values of the word lines in the stacked can be reduced.

After the resistance of the shaft portion of the word line WL is reduced, for example, an insulating layer (such as a silicon nitride film) 72 is formed by LPCVD on the side and bottom surfaces of groove 71 and on the mask layer 117, as shown in FIG. 36. The inside of groove 71 (side surfaces of the stacked body) is relatively uniformly covered with insulating layer 72.

After that, insulating layer 72 is etched back. Consequentially, insulating layer 72 remains only on the side surfaces of groove 71. As a result, contact plug 113 is exposed at the bottom of groove 71.

Figure 37:
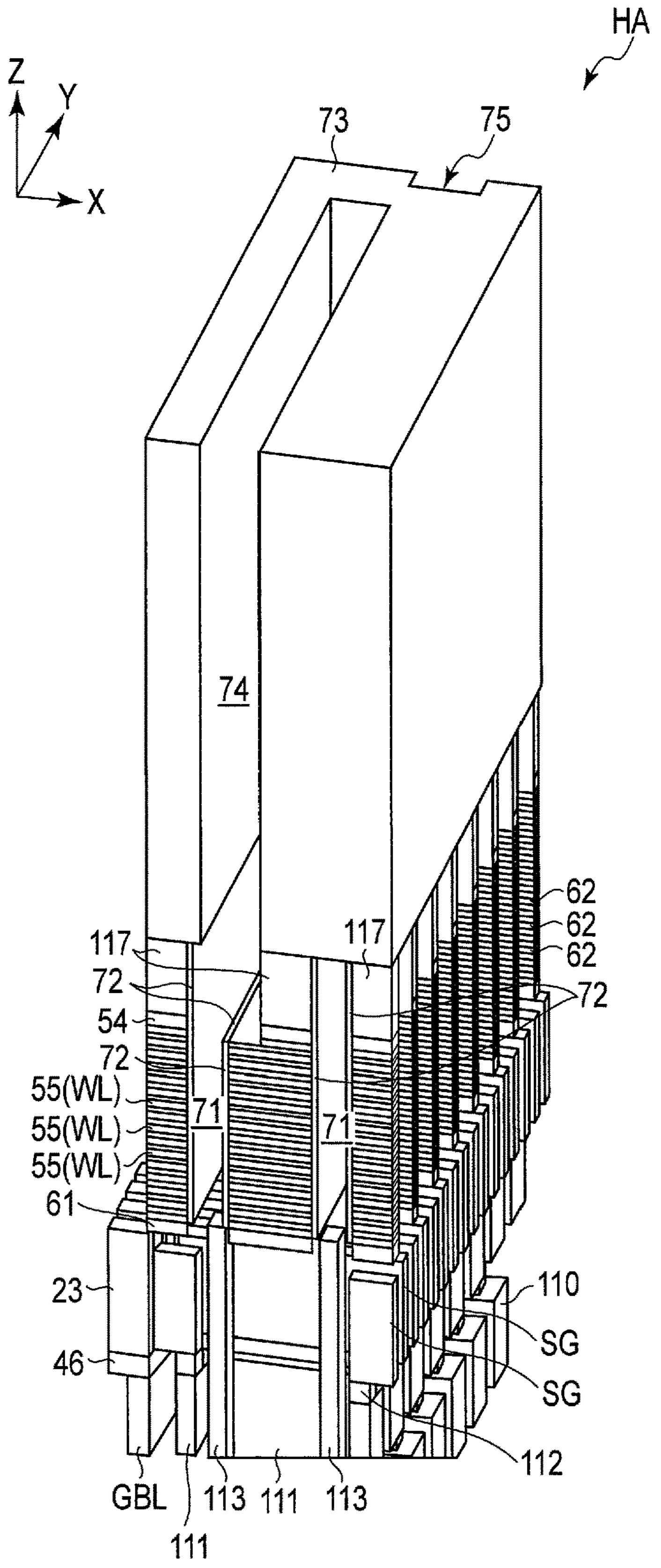

As shown in FIG. 37, a hard mask (for example, a layer including silicon oxide as the main component) 73 is formed on the mask layer 117. The hard mask 73 is patterned by photolithography and etching so as to have a pattern allowing only one line of the stepped portion of the word lines WL in the hookup area. HA to be exposed. Groove 74 is thereby formed in the hard mask 73.

By RIE using the hard mask 73 as a mask, the mask layer 117 and insulating layer 72 are etched. Insulating film 54 exposed at the bottom of groove 74 and the topmost semiconductor layer (word line) 55 are removed by RIB.

As a result, a structure (stepped structure) with a step between the etched portion and unetched portion is obtained in the stacked body including the word lines WL and insulating layers 62.

In FIG. 37, although not shown, groove 71 is filled with a hard mask 73.

For example, in the step of FIG. 37, groove 75 which reaches the top surface of insulating film 54 is formed in the hard mask 73 in the region in which a contact plug coupled to the word line WL is to be formed.

As shown in FIG. 38, hard mask 73 is patterned by photolithography and etching so as to have a pattern allowing the other line of the stepped structure of the word lines WL to be exposed. Groove 76 is thereby formed in hard mask 73.

As shown in FIG. 39, insulating layers 72 and 117 at the bottom of groove 76 are etched. Insulating layer 54 is thereby exposed.

After that, a mask (such as a photoresist mask) 66 is formed in grooves 74 and 76. As described above, groove 71 of the stacked structure is filled with, for example, insulating layer 73.

A shrink step (sliming step) is performed on the mask 66. The side surface of the mask 66 is recessed in parallel with the surface of the silicon substrate by wet etching and/or ashing. At this time, the top surface of the mask 66 is also recessed perpendicularly to the surface of the silicon substrate to a similar degree to the side surface of the mask 66.

As a result, insulating layer 62 on the word line WL is exposed at the bottom of groove 74, and insulating layer 54 on the word line WL is exposed at the bottom of groove 76.

As shown in FIG. 40, RIE processing for forming the stepped structure is performed. Two conductive layers 55 and two insulating layers 62 (four in total) in the stepped portion of the word lines WL, which are exposed by recession of the mask 66 are etched by RIE. At this time, insulating layer 72 is also etched.

As a result, insulating layer 62 on the word line WL is exposed at the bottom of groove 74, and three word lines WL are exposed on the side surface of groove 74. Insulating layer 62 on the word line WL is exposed at the bottom of groove 76, and two word lines WL are exposed on the side surface of groove 76.

A combination of the shrink step and RIE step is repeatedly performed in accordance with the number of the layers of the word lines WL.

For example, as shown in FIG. 41, a shrink step on the mask 66 is performed, and the side surface of the mask 66 is further recessed. Based on the recessed mask 66, the portion exposed by the recession of the mask 66 is etched by RIE for each predetermined number of layers.

In this way, a shrink step on the mask layer and an etching step on the semiconductor layer (contact region of the word line) are repeatedly performed until a predetermined layer is reached.

The stepped portion of word lines WL is formed by a plurality of shrink steps and a plurality of RIE steps as described above. After that, masks 66 and 73 are removed.

In the groove formed by the step of forming the stepped structure of word lines WL, an insulating layer (such as a silicon nitride layer) is formed.

After that, a contact plug is formed to be coupled to the corresponding word line WL.

After formation of the contact plug, an interconnect, an interlayer insulating film, a passivation film, and a pad opening are sequentially formed by a well-known semiconductor process.

Accordingly, a hookup area HA of the resistance change type memory of the present embodiment is completed.

The method (process) for manufacturing the resistance change type memory of the present embodiment as described with reference to FIGS. 32 to 41 is an example, and the method is not limited to the example of FIGS. 32 to 41.

(e) Conclusion

As described above, the resistance change type memory of the present embodiment includes a lightly-doped semiconductor layer (or intrinsic semiconductor layer) in a portion (for example, finger) of a word line which faces a resistance change film (memory layer).

A schottky junction is formed between a bit line and a word line via the resistance change film.

In an operation of the resistance change type memory of the present embodiment, the resistance of the lightly-doped semiconductor layer corresponding to the selected cell is lowered by supply of carriers from a bit line (and global bit line) to the lightly-doped semiconductor layer.

Accordingly, the resistance change type memory of the present embodiment can perform a desired operation on the selected cell.

In an operation of the resistance change type memory of the present embodiment, the lightly-doped semiconductor layer corresponding to the unselected cell maintains the high resistance state. Current consumption in the unselected cell is thereby reduced.

Accordingly, the resistance change type memory of the present embodiment can reduce current consumption.

As described above, the resistance change type memory of the present embodiment can improve the characteristics of the memory.

(2) Second Embodiment

The resistance change type memory of the second embodiment will be described with reference to FIGS. 42 to 46.

(a) Configuration Example

A structure example of the resistance change type memory of the present embodiment will be described with reference to FIGS. 42 and 43.

FIG. 42 is a bird's-eye view for explaining the resistance change type memory of the present embodiment. FIG. 43 is a cross-sectional view for explaining the resistance change type memory of the present embodiment.

As shown in FIGS. 42 and 43, the resistance change type memory (such as ReRAM) of the present embodiment includes a memory cell array having a shared gate structure regarding select gate lines SG.

In the resistance change type memory having the shared gate structure, two select transistors ST adjacent to each other in the Y direction share one select gate line SSG (SSGa, SSGb). One select gate line SSG is provided between two semiconductor layers 21 via a gate insulating film. Two select gate lines SSGa and SSGb having different addresses interpose one semiconductor layer 21 therebetween.

The potential of each select gate line SSG is independently controlled.

Figure 44:
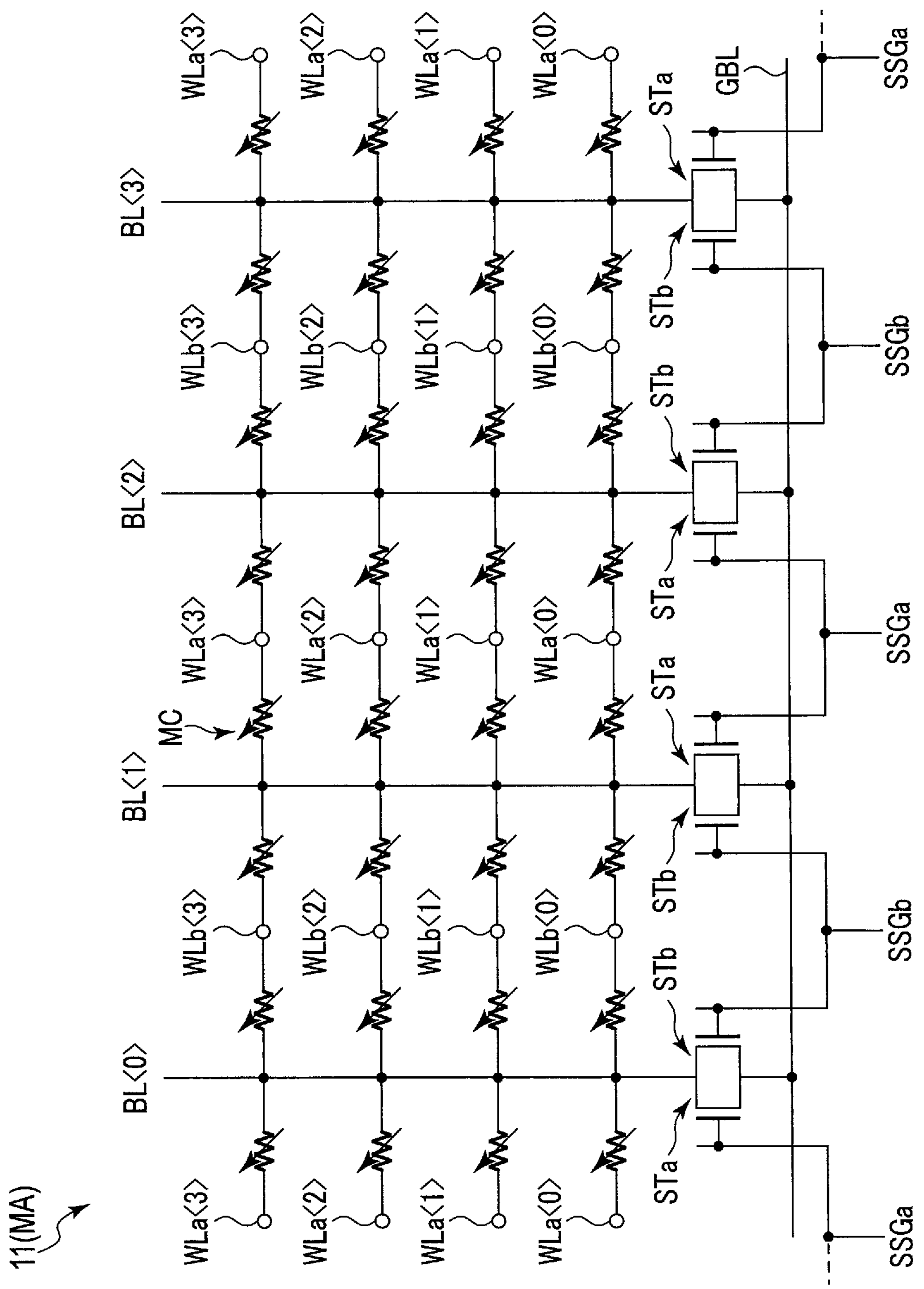
FIG. 44 is a circuit diagram showing a configuration example of the resistance change type memory of the second embodiment.

FIG. 44 is an equivalent circuit diagram showing a circuit configuration of the memory cell array of the resistance change type memory of the present embodiment. In FIG. 44, regarding a plurality of bit lines coupled to one global bit line GBL, four layers LY in one memory cell array 11 are extracted and illustrated.

In the resistance change type memory having the shared gate structure, the circuit configuration between a bit line and a global bit line is equivalent to a configuration in which two select transistors ST are coupled between a bit line BL and a global bit line GBL. Channels (current paths) of two select transistors are coupled in parallel between the bit line and the global bit line.

The gate of one select transistor STa is coupled to select gate line SSGa. The gate of the other select transistor STb is coupled to select gate line SSGb.

Of the two select gate lines SSGa and SSGb corresponding to one bit line BL, one select gate line SSGa is shared by two select transistors STa adjacent to each other at one end of the bit line BL with respect to the Y direction. Of the two select gate lines SSGa and SSGb corresponding to one bit line BL, the other select gate line SSGb is shared by two select transistors STb adjacent to each other at the other end of the bit line BL with respect to the Y direction.

As described above, in the memory cell array having the shared gate structure, one select gate line SSG is shared by two select transistors adjacent to each other in the Y direction.

In each layer of the memory cell array, the word line WL includes a finger 50 including a lightly-doped semiconductor layer (intrinsic semiconductor) as in the first embodiment.

Therefore, a schottky junction is formed between a bit line BL and a word line WL also in the present embodiment.

Therefore, the resistance change type memory of the present embodiment can operate based on the same operating principles as those explained with reference to FIGS. 11 to 13.

(b) Operation Example

An operation example of the resistance change type memory of the present embodiment will be described with reference to FIGS. 45 and 46.

(b1) Write Operation

The write operation of the resistance change type memory of the present embodiment will be described with reference to FIG. 45.

Figure 45:
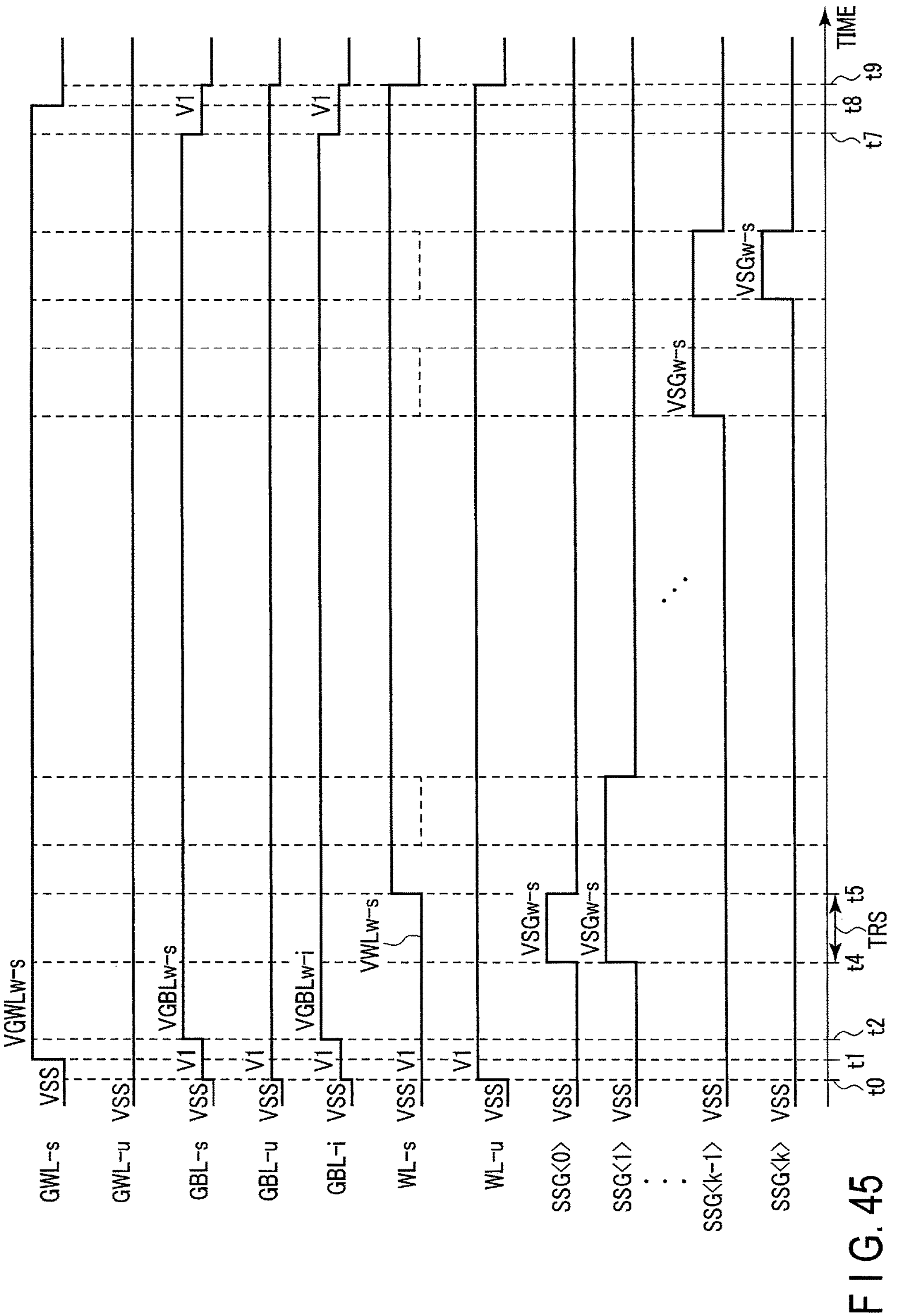
FIG. 45 is a timing chart showing an operation example of the resistance change type memory of the second embodiment.

FIG. 45 is a timing chart for explaining the write operation of the resistance change type memory of the present embodiment.

As in the case of the first embodiment (see FIGS. 14 to 16), in the write operation, select voltage VWLw-s is applied to the selected word line WL-s, and unselect voltage VWLw-u is applied to the unselected word line WL-u, as shown in FIG. 45.

Select voltage VGBLw-s is applied to the selected global bit line GBL-s. Unselect voltage VGBLw-u is applied to the unselected global bit line GBL-u.

In the present embodiment, select voltage VSG-s is applied to two select gate lines SSGa-s and SSGb-s, and unselect voltage VSGw-u is applied to unselected select gate lines SSGa-u and SSGb-u.

As a result, two select transistors ST coupled to the selected bit line BL are set in the ON state by the voltage applied to the selected select gate lines SSGa-s and SSGb-s.

At this time, the schottky junction between the lightly-doped semiconductor layer (finger) of the selected word line WL-s, and the metal layer of the selected bit line BL-s is set in the forward-biased state.

Therefore, as described with reference to FIG. 11, the resistance of the finger including the lightly-doped semiconductor layer is lowered by diffusion of carriers from the bit line BL to the finger. Consequently, a write voltage (RESET voltage) is applied to the resistance change film 24 between the selected global bit line GBL-s and the selected word line WL-s.

As a result, data is written in the memory cell MC.

In addition, as described above, the lightly-doped semiconductor layer 50 of the finger 50 corresponding to the unselected cell maintains the high resistance state.

Accordingly, the power consumption at the unselected cell can be reduced.

(b2) Erase Operation

The erase operation of the resistance change type memory of the present embodiment will be described with reference to FIG. 46.

Figure 46:
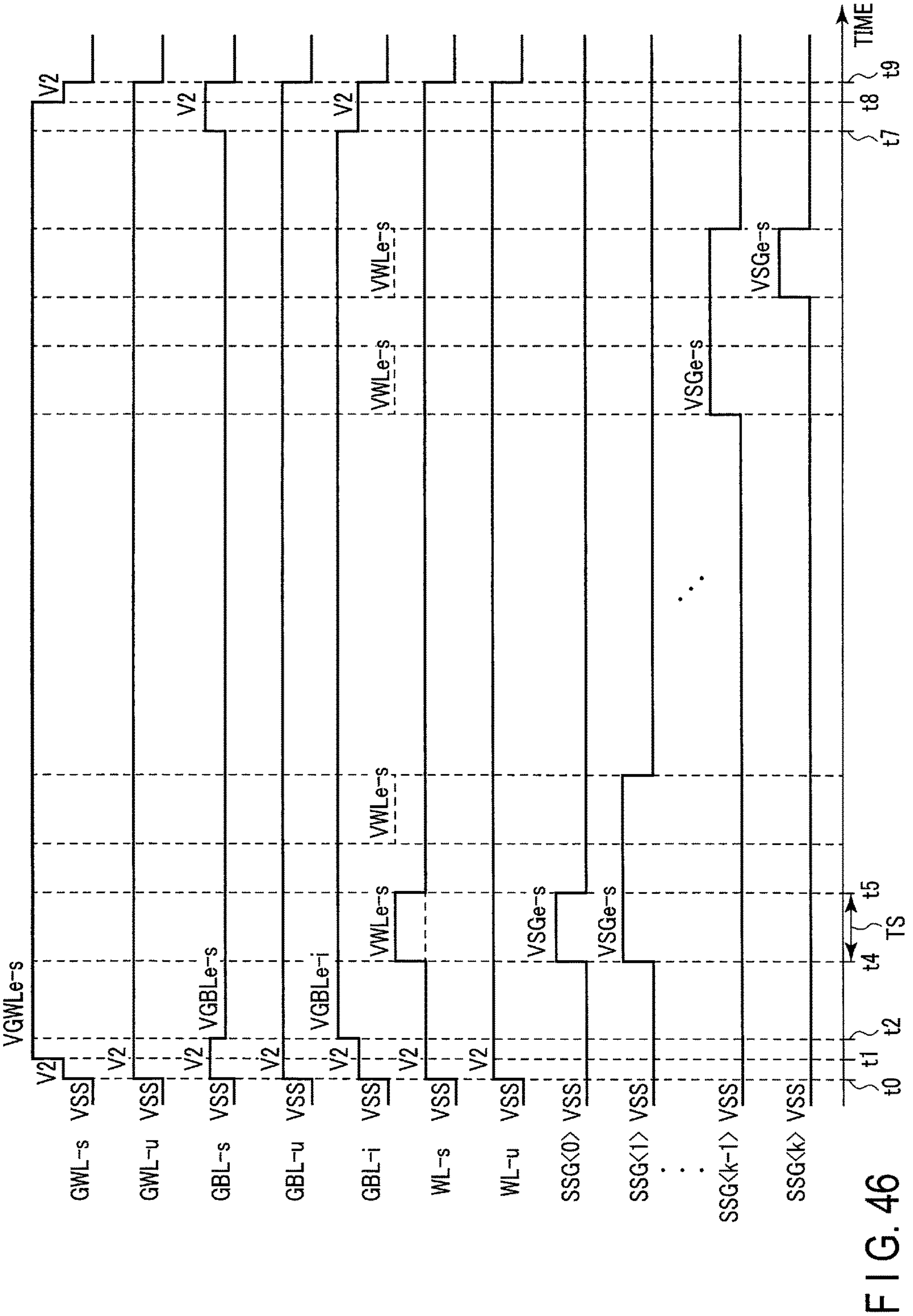
FIG. 46 is a timing chart showing an operation example of the resistance change type memory of the second embodiment.

FIG. 46 is a timing chart for explaining the erase operation of the resistance change type memory of the present embodiment.

As shown in FIG. 46, in the erase operation, select voltage VWLe-s is applied to the selected word line WL-s, and unselect voltage VWLe-u is applied to the unselected word line WL-u.

As described above, in consideration of the memory cell's bipolar action, select voltage VWLe-s has a voltage value obtained by adding the offset voltage Vo to the erase voltage Ve of the resistance change film.

Select voltage VGBLe-s is applied to the selected global bit lines GBL-s, and unselect voltage VGBLe-u is applied to the unselected global bit line GBL-u. For example, the voltage value of select voltage VGBLe-s is equal to the voltage value of the offset voltage Vo.

Select voltage VSGe-s is applied to two select gate lines SSGa-s and SSGb-s corresponding to the selected addresses, and unselect voltage (for example, 0V) VSGe-u is applied to the unselected select gate lines SSGa-u and SSGb-u.

In the present embodiment, as in the above-described case, voltage VGBLe-i (>VGBLe-s>VWLe-s) is applied to the array-end global bit line GBL-i in the erase operation (SET operation).

In the erase operation, the schottky junction between the lightly-doped semiconductor layer (finger) of the selected word line WL-s and the metal layer of the selected bit line BL-s is set in the reverse-biased state.

Carriers are supplied from the schottky junction coupled to the array-end global bit line GBL-i. Supply of carriers from the array-end global bit line GBL-i to the finger 50 causes sequential conductivity modulation (bipolar action) in schottky junctions in a plurality of memory cells coupled to a common selected finger 50.

Accordingly, the finger 50 of the selected cell MC-s is placed in the low resistance state.

As a result, a predetermined potential difference (erase voltage Ve) is applied to the selected cell MC. Data of the selected cell is erased.

As in the write operation, the lightly-doped semiconductor layer 50 of the finger corresponding to the unselected cell maintains the high resistance state.

Accordingly, the power consumption at the unselected cell can be reduced.

(b3) Read Operation

The read operation of the resistance change type memory of the present embodiment will be described.

The read operation of the resistance change type memory of the present embodiment is performed by substantially the same operation as the read operation (see FIG. 19) of the resistance change type memory of the first embodiment.

In the read operation, select voltage VWLr-s is applied to the selected word line WL-s, and unselect voltage VWLr-u is applied to the unselected word line.

The voltage value of select voltage VWLr-s is the same as the voltage value of the offset voltage Vo. The voltage value of unselect voltage VWLr-u has a voltage value obtained by adding the offset voltage Vo to voltage Vr.

Voltage VGBLr-s is applied to the selected global bit line GBL-s, and voltage VGBLr-u (=VGBLr-s) is applied to the unselected global bit line GBL-u.

Voltages VGBLr-s and VGBLr-u have a voltage value obtained by adding the offset voltage Vo to read voltage Vr.

Select voltage VSGr-s is applied to two selected select gate lines SSGa-s and SSGb-s corresponding to the selected addresses, and unselect voltage (for example, 0V) VSGr-u is applied to the unselected select gate lines SSGa-u and SSGb-u.

As in the write operation, the schottky junction between the selected bit line and the selected word line is set in the forward-biased state in the read operation.

Therefore, the finger coupled to the selected cell is placed in the low resistance state by supply and diffusion of carriers from the bit line.

Accordingly, a read voltage is applied to the selected cell. As a result, data is read from the memory cell MC.

As in the write operation and erase operation, the lightly-doped semiconductor layer 50 of the finger corresponding to the unselected cell maintains the high resistance state.

As described above, like the resistance change type memory of the first embodiment, the resistance change type memory having the shared gate structure of the second embodiment can perform the write operation, erase operation, and read operation on the selected cell by control of the bias state of the schottky junction between the semiconductor layer of the word line and the metal layer of the bit line.

(c) Manufacturing Method

Hereinafter, a method for manufacturing the resistance change type memory of the second embodiment will be described.

The method for manufacturing the resistance change type memory of the present embodiment is substantially the same as the case explained with reference to FIGS. 20 to 41.

However, in the present embodiment, the step of forming the select gate line is different from that in the method for manufacturing the resistance change type memory of the first embodiment, as will be described below.

In the present embodiment, a conductive layer (such as an $n^+$-type silicon layer) 48 is filled in the groove in the above-described steps of FIGS. 25 and 26.

In the present embodiment, insulating layer 49 is formed on semiconductor layer 22 and conductive layer 25 in the state where conductive layer between semiconductor layers (select transistors) 20, 21, and 22 is not divided.

After this, comb-shaped lightly-doped semiconductor layers (intrinsic semiconductors) and bit lines BL are formed as described with reference to FIGS. 27 to 31. Resistance reduction processing is performed on the shaft portion of the comb-shaped lightly-doped semiconductor layer.

A word line including a finger of the lightly-doped semiconductor layer and a shaft portion of the conductive layer is thereby formed.

By the above-described process, the resistance change type memory of the present embodiment is formed.

(d) Conclusion

In the resistance change type memory of the second embodiment, two select transistors adjacent to each other in the Y direction share one select gate line.

In the present embodiment, a schottky junction is formed between a word line and a bit line. By controlling the bias state of the schottky junction, a predetermined operation on the selected cell can be performed.

In the present embodiment, when an operation is performed on the selected cell, the semiconductor layer of the finger corresponding to the unselected cell maintains the high resistance state. Therefore, the resistance change type memory of the present embodiment can reduce the current consumption.

As described above, the resistance change type memory of the second embodiment can improve the characteristics of the memory.

(3) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory comprising:

a semiconductor substrate having a first impurity concentration;

a first interconnect extending in a first direction perpendicular to a surface of the semiconductor substrate;

a second interconnect including a first semiconductor layer, the first semiconductor layer extending in a second direction parallel to the surface of the semiconductor substrate and having a second impurity concentration lower than the first impurity concentration;

a memory layer provided between the first interconnect and the first semiconductor layer;

a first transistor including a second semiconductor layer provided between the first interconnect and the semiconductor substrate, and a first gate facing the second semiconductor layer via a first gate insulating film in a third direction parallel to the surface of the semiconductor substrate; and a third interconnect provided between the semiconductor substrate and the second semiconductor layer, and extending in the third direction.

2. The resistance change type memory according to claim 1, wherein the second semiconductor layer has a third impurity concentration, and the third impurity concentration is higher than the second impurity concentration.

3. The resistance change type memory according to claim 1, wherein the second interconnect includes a conductive layer extending in the third direction and coupled to the first semiconductor layer.

4. The resistance change type memory according to claim 3, wherein the first semiconductor layer is a layer including silicon.

5. The resistance change type memory according to claim 4, wherein the conductive layer is a compound layer including silicon.

6. The resistance change type memory according to claim 1, wherein the second impurity concentration is lower than $1\times10^{18}$ $cm^{-3}$.

7. The resistance change type memory according to claim 1, wherein the second semiconductor layer includes an n-type impurity.

8. A resistance change type memory comprising:

a semiconductor substrate having a first impurity concentration;

first and second layers extending in a first direction parallel to a surface of the semiconductor substrate, the first and second layers being aligned in a second direction crossing the first direction;

first, second, third and fourth semiconductor layers extending in the second direction, the first, second, third and fourth semiconductor layers being aligned in the first direction between the first and second layers, the first and third semiconductor layers being coupled to the first layer, the second and fourth semiconductor layers being coupled to the second layer, and the first, second, third, and fourth semiconductor layers having a second impurity concentration lower than the first impurity concentration;

a first interconnect extending in a third direction perpendicular to the surface of the semiconductor substrate, the first interconnect being provided between the first semiconductor layer and the second semiconductor layer;

a second interconnect extending in the third direction, the second interconnect being provided between the second semiconductor layer and the third semiconductor layer;

a third interconnect extending in the third direction, the third interconnect being provided between the third semiconductor layer and the fourth semiconductor layer;

a first memory layer provided between the first semiconductor layer and the first interconnect;

a second memory layer provided between the second semiconductor layer and the first interconnect;

a third memory layer provided between the second semiconductor layer and the second interconnect;

a fourth memory layer provided between the third semiconductor layer and the second interconnect;

a fifth memory layer provided between the third semiconductor layer and the third interconnect;

a sixth memory layer provided between the fourth semiconductor layer and the third interconnect;

a first transistor including a fifth semiconductor layer provided between the first interconnect and the semiconductor substrate, and a first gate facing the fifth semiconductor layer via a first gate insulating film in the first direction;

a second transistor including a sixth semiconductor layer provided between the second interconnect and the semiconductor substrate, and a second gate facing the sixth semiconductor layer via a second gate insulating film in the first direction;

a third transistor including a seventh semiconductor layer provided between the third interconnect and the semiconductor substrate, and a third gate facing the seventh semiconductor layer via a third gate insulating film in the first direction; and a fourth interconnect provided between the semiconductor substrate and the fifth, sixth, and seventh semiconductor layers, and extending in the first direction.

9. The resistance change type memory according to claim 8, further comprising:

a fifth interconnect extending in the third direction, the fifth interconnect being provided between the first semiconductor layer and the second semiconductor layer;

a seventh memory layer provided between the first semiconductor layer and the fifth interconnect;

an eighth memory layer provided between the second semiconductor layer and the fifth interconnect;

a fourth transistor including an eighth semiconductor layer provided between the fifth interconnect and the semiconductor substrate, and a fourth gate facing the eighth semiconductor layer via a fourth gate insulating film in the first direction; and a sixth interconnect provided between the semiconductor substrate and the eighth semiconductor layer, and extending in the first direction, wherein a dimension of the sixth interconnect in the second direction is larger than a dimension of the fourth interconnect in the second direction.

10. The resistance change type memory according to claim 9, wherein the fifth interconnect is provided between the first layer and the first interconnect with respect to the second direction.

11. The resistance change type memory according to claim 9, wherein the first gate and the fourth gate are provided in a first conductive layer extending in the second direction.

12. The resistance change type memory according to claim 8, wherein the first gate is adjacent to the second gate in the first direction, and an insulating layer is provided between the first gate and the second gate.

13. The resistance change type memory according to claim 8, wherein the first gate is adjacent to the second gate in the first direction, and the first gate and the second gate are provided in a second conductive layer extending in the second direction.

14. The resistance change type memory according to claim 8, wherein the first layer is a conductor.

15. The resistance change type memory according to claim 8, wherein the first semiconductor layer is a silicon layer, and the first layer is a conductive silicon compound layer.

16. The resistance change type memory according to claim 8, wherein a third impurity concentration of the fifth semiconductor layer is higher than the second impurity concentration.

17. The resistance change type memory according to claim 8, wherein the second impurity concentration is lower than $1\times10^{18}$ $cm^{-3}$.

18. The resistance change type memory according to claim 8, wherein the first semiconductor layer includes an n-type impurity.

19. The resistance change type memory according to claim 8, wherein the first layer, the first semiconductor layer, and the third semiconductor layer are provided in a word line, and the word line has a comb-like planar shape.

* * * * *